United States Patent
Keino

(10) Patent No.: US 12,324,297 B2
(45) Date of Patent: Jun. 3, 2025

(54) SOLID-STATE IMAGING DEVICE AND IMAGING METHOD

(71) Applicant: SONY SEMICONDUCTOR SOLUTIONS CORPORATION, Kanagawa (JP)

(72) Inventor: Satoshi Keino, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 230 days.

(21) Appl. No.: 17/754,563

(22) PCT Filed: Jul. 20, 2020

(86) PCT No.: PCT/JP2020/027987
§ 371 (c)(1),
(2) Date: Apr. 6, 2022

(87) PCT Pub. No.: WO2021/075115
PCT Pub. Date: Apr. 22, 2021

(65) Prior Publication Data
US 2024/0065010 A1 Feb. 22, 2024

(30) Foreign Application Priority Data
Oct. 15, 2019 (JP) ................. 2019-188548

(51) Int. Cl.
H10K 39/32 (2023.01)
H10F 39/12 (2025.01)

(52) U.S. Cl.
CPC ........... *H10K 39/32* (2023.02); *H10F 39/191* (2025.01)

(58) Field of Classification Search
CPC ...... H10F 39/191; H10F 39/192; H10K 39/32
See application file for complete search history.

(56) References Cited

U.S. PATENT DOCUMENTS

| 2010/0208116 | A1 | 8/2010 | Iijima |
| 2012/0248516 | A1 | 10/2012 | Mayer |
| 2020/0029038 | A1* | 1/2020 | Uesugi ................. H01L 27/146 |

FOREIGN PATENT DOCUMENTS

| JP | 2008-177191 A | 7/2008 |
| JP | 2010-192683 A | 9/2010 |

(Continued)

OTHER PUBLICATIONS

International Search Report and Written Opinion of PCT Application No. PCT/JP2020/027987, issued on Oct. 20, 2020, 09 pages of ISRWO.

*Primary Examiner* — Zandra V Smith
*Assistant Examiner* — Molly K Reida
(74) *Attorney, Agent, or Firm* — CHIP LAW GROUP

(57) ABSTRACT

A solid-state imaging device includes an imaging element array that includes M imaging elements arranged in a first direction and N imaging elements arranged in a second direction, that is, M×N imaging elements in total, each of the imaging elements including a photoelectric conversion unit that includes a photoelectric conversion layer 21, an insulation layer 32, a charge discharge electrode 22, an upper electrode 23, and a charge accumulation electrode 24. The photoelectric conversion layer is provided as a common layer at least for the N imaging elements. The photoelectric conversion unit of each of the imaging elements further includes a first charge transfer control electrode 25, a second charge transfer control electrode 26, and a light shielding layer 12. The photoelectric conversion layer 21 includes a photoelectric conversion layer-first region 21A, a photoelectric conversion layer-second region 21B, and a photoelectric conversion layer-third region 21C. The light shielding layer (Continued)

12 covers at least the photoelectric conversion layer-second region 21B and the photoelectric conversion layer-third region 21C.

19 Claims, 46 Drawing Sheets

(56) References Cited

FOREIGN PATENT DOCUMENTS

| | | | |
|---|---|---|---|
| JP | 2010-258155 | A | 11/2010 |
| JP | 2012-120153 | A | 6/2012 |
| JP | 2013-528925 | A | 7/2013 |
| JP | 2019-009437 | A | 1/2019 |
| WO | 2011/069880 | A1 | 6/2011 |
| WO | 2018/235895 | A1 | 12/2018 |

* cited by examiner

F I G . 8
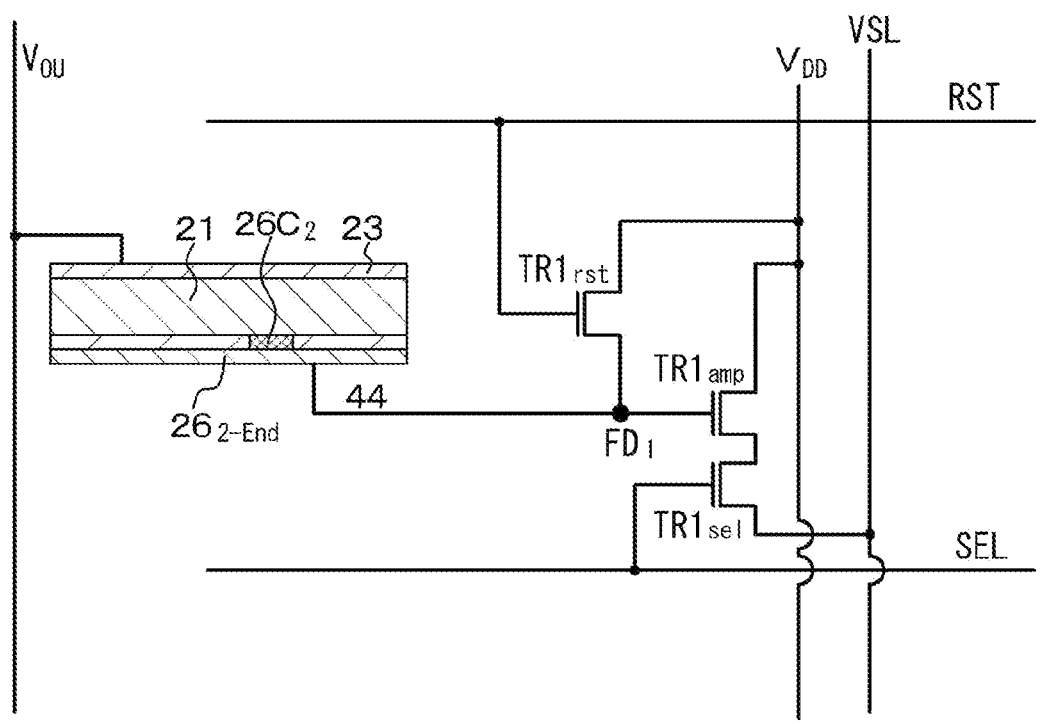

FIG. 9
(1-1) CHARGE ACCUMULATION – GLOBAL TRANSPORTATION
(1-2) PD RESET
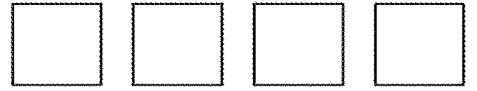
(1-3) TRANSPORTATION OF CHARGE
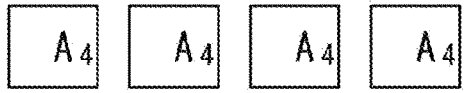
(2-1) CHARGE ACCUMULATION – GLOBAL TRANSPORTATION
(2-2) PD RESET
(2-3) TRANSPORTATION OF CHARGE
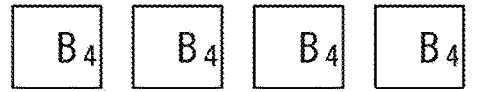

FIG.10

(3-1) CHARGE ACCUMULATION – GLOBAL TRANSPORTATION

| $10_{11}$ $F_1$ | $10_{12}$ $F_1$ | $10_{13}$ $F_1$ | $10_{14}$ $F_1$ |
|---|---|---|---|
| $10_{21}$ $E_2$ | $10_{22}$ $E_2$ | $10_{23}$ $E_2$ | $10_{24}$ $E_2$ |
| $10_{31}$ $D_3$ | $10_{32}$ $D_3$ | $10_{33}$ $D_3$ | $10_{34}$ $D_3$ |
| $10_{41}$ $C_4$ | $10_{42}$ $C_4$ | $10_{43}$ $C_4$ | $10_{44}$ $C_4$ |

FD [ ] [ ] [ ] [ ]

(3-2) PD RESET

| $10_{11}$ | $10_{12}$ | $10_{13}$ | $10_{14}$ |
|---|---|---|---|
| $10_{21}$ | $10_{22}$ | $10_{23}$ | $10_{24}$ |
| $10_{31}$ | $10_{32}$ | $10_{33}$ | $10_{34}$ |
| $10_{41}$ | $10_{42}$ | $10_{43}$ | $10_{44}$ |

[ ] [ ] [ ] [ ] FD (3-3) TRANSPORTATION OF CHARGE

| $10_{11}$ | $10_{12}$ | $10_{13}$ | $10_{14}$ |
|---|---|---|---|
| $10_{21}$ $F_1$ | $10_{22}$ $F_1$ | $10_{23}$ $F_1$ | $10_{24}$ $F_1$ |
| $10_{31}$ $E_2$ | $10_{32}$ $E_2$ | $10_{33}$ $E_2$ | $10_{34}$ $E_2$ |
| $10_{41}$ $D_3$ | $10_{42}$ $D_3$ | $10_{43}$ $D_3$ | $10_{44}$ $D_3$ |

FD [ $C_4$ ] [ $C_4$ ] [ $C_4$ ] [ $C_4$ ]

(4-1) CHARGE ACCUMULATION – GLOBAL TRANSPORTATION

| $10_{11}$ $G_1$ | $10_{12}$ $G_1$ | $10_{13}$ $G_1$ | $10_{14}$ $G_1$ |
|---|---|---|---|
| $10_{21}$ $F_2$ | $10_{22}$ $F_2$ | $10_{23}$ $F_2$ | $10_{24}$ $F_2$ |
| $10_{31}$ $E_3$ | $10_{32}$ $E_3$ | $10_{33}$ $E_3$ | $10_{34}$ $E_3$ |
| $10_{41}$ $D_4$ | $10_{42}$ $D_4$ | $10_{43}$ $D_4$ | $10_{44}$ $D_4$ |

[ ] [ ] [ ] [ ] FD (4-2) PD RESET

| $10_{11}$ | $10_{12}$ | $10_{13}$ | $10_{14}$ |
|---|---|---|---|
| $10_{21}$ | $10_{22}$ | $10_{23}$ | $10_{24}$ |
| $10_{31}$ | $10_{32}$ | $10_{33}$ | $10_{34}$ |
| $10_{41}$ | $10_{42}$ | $10_{43}$ | $10_{44}$ |

FD [ ] [ ] [ ] [ ]

(4-3) TRANSPORTATION OF CHARGE

| $10_{11}$ | $10_{12}$ | $10_{13}$ | $10_{14}$ |
|---|---|---|---|
| $10_{21}$ $G_1$ | $10_{22}$ $G_1$ | $10_{23}$ $G_1$ | $10_{24}$ $G_1$ |
| $10_{31}$ $F_2$ | $10_{32}$ $F_2$ | $10_{33}$ $F_2$ | $10_{34}$ $F_2$ |
| $10_{41}$ $E_3$ | $10_{42}$ $E_3$ | $10_{43}$ $E_3$ | $10_{44}$ $E_3$ |

[ $D_4$ ] [ $D_4$ ] [ $D_4$ ] [ $D_4$ ] FD

FIG. 15A
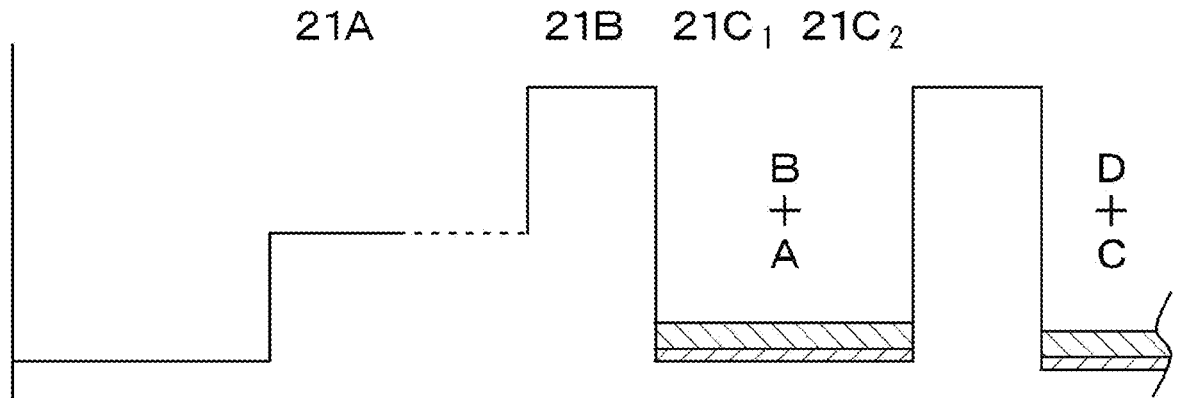
FIG. 15B
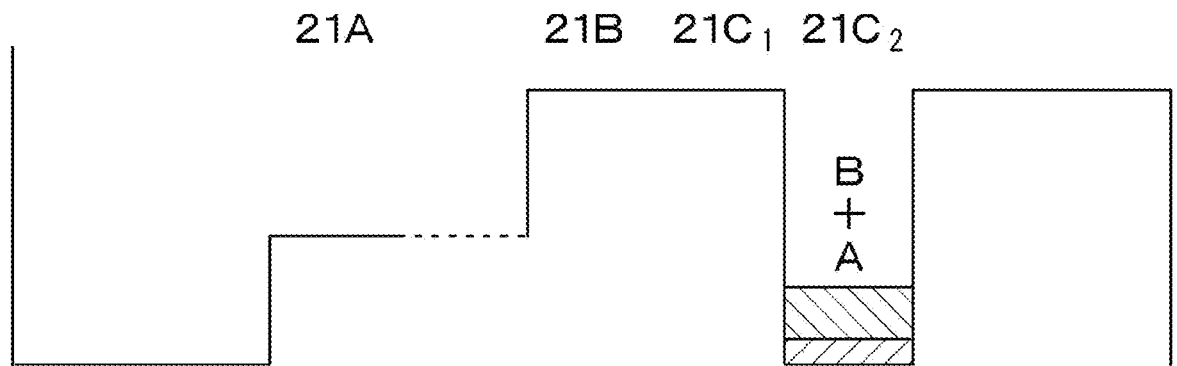
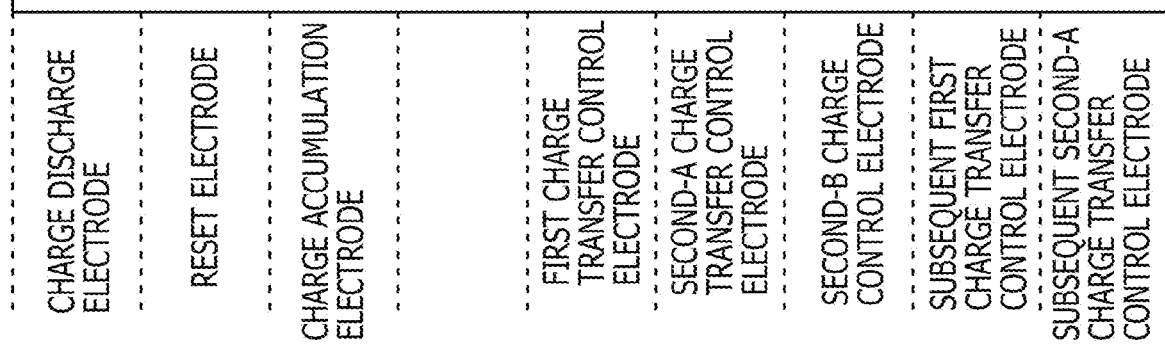

FIG.25A
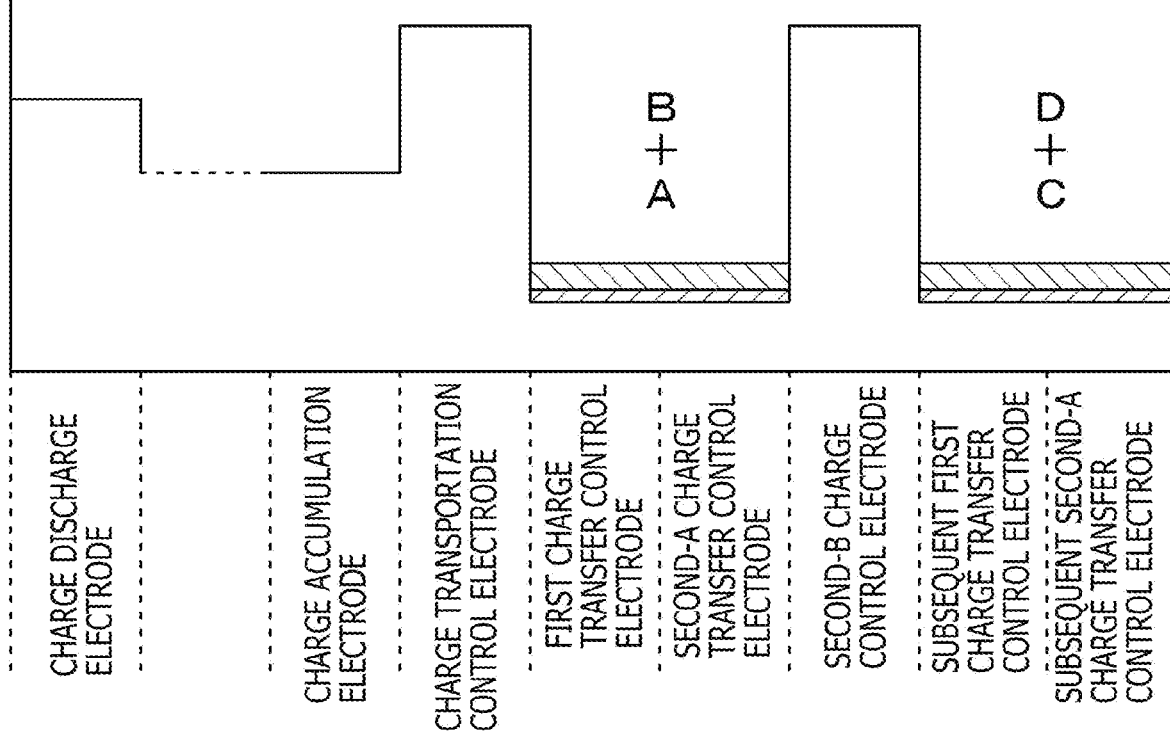
FIG.25B
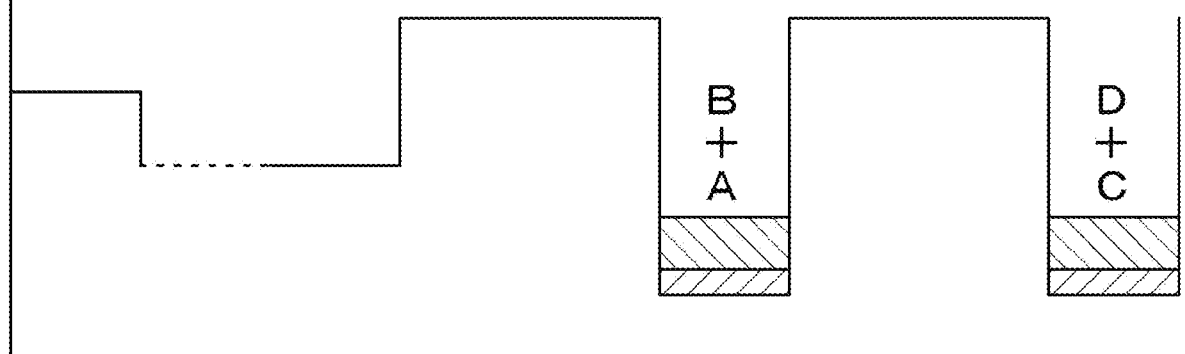
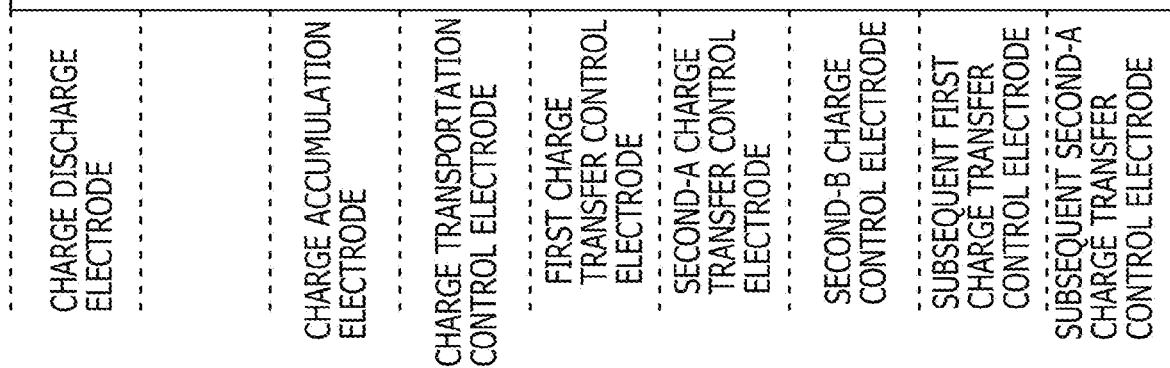

FIG. 26A
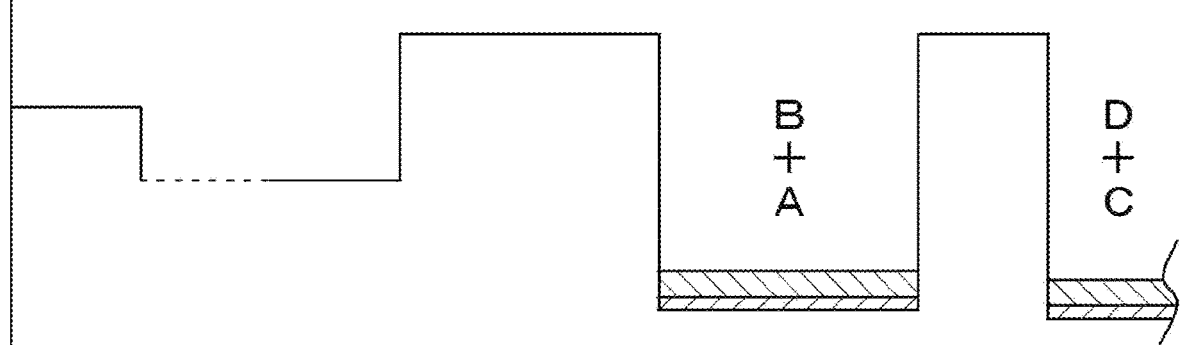
FIG. 26B
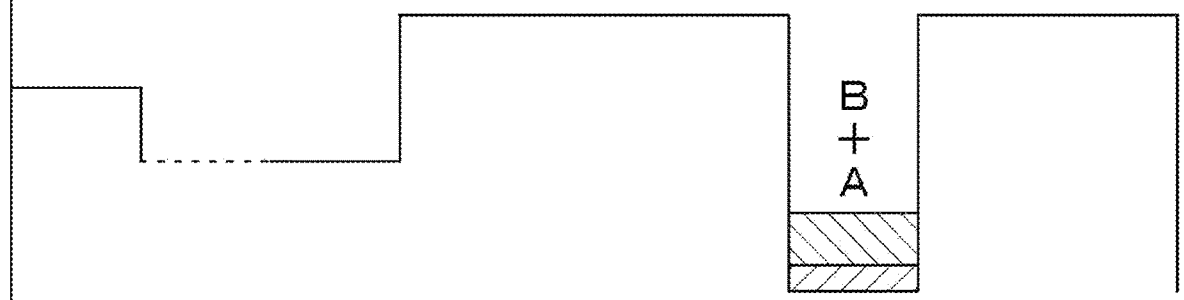
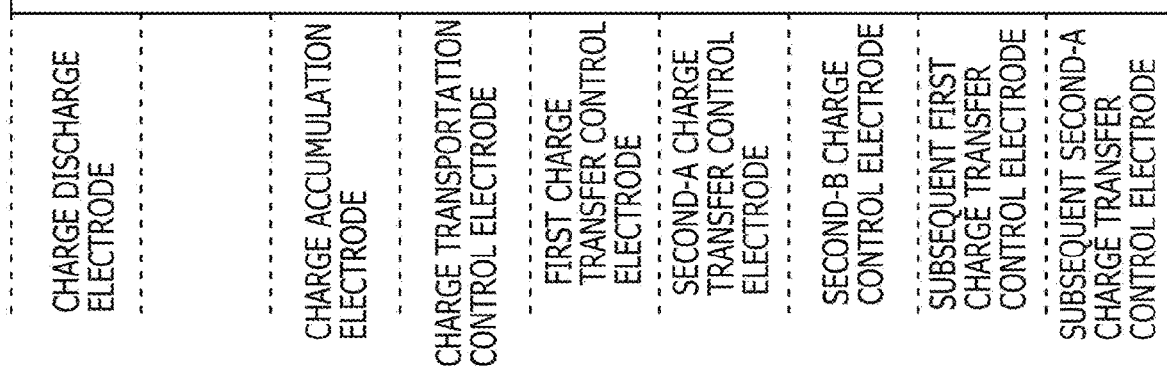

FIG. 29A
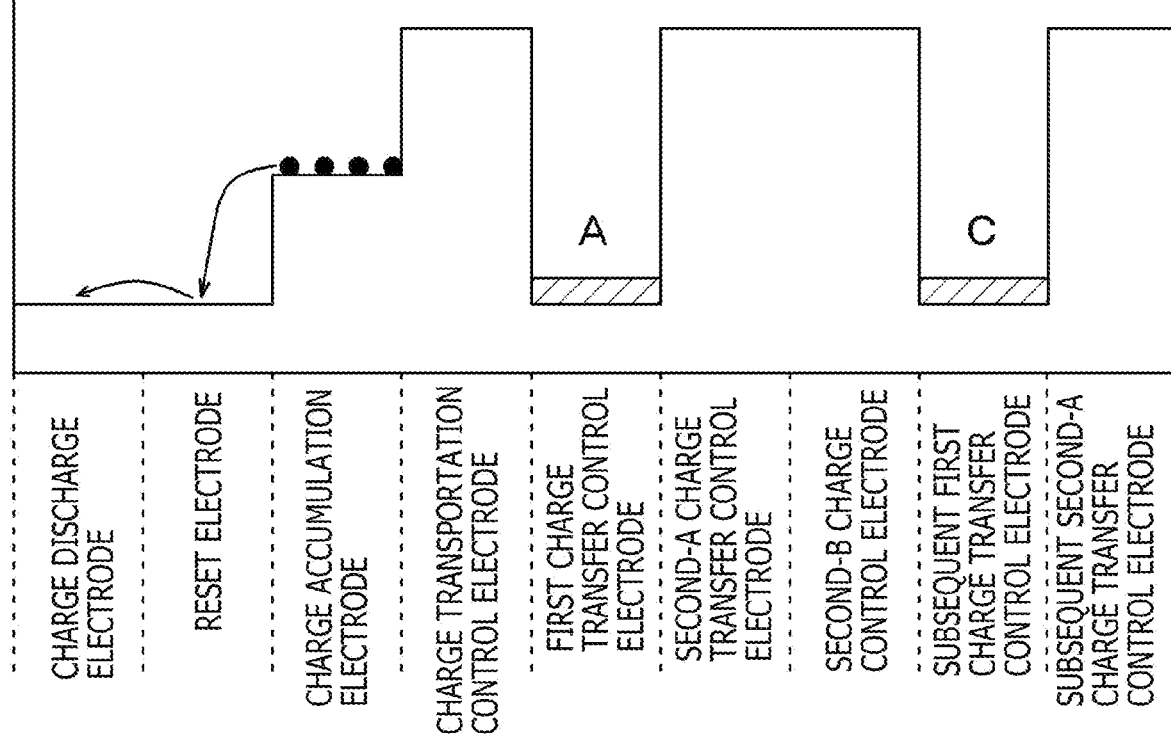
FIG. 29B
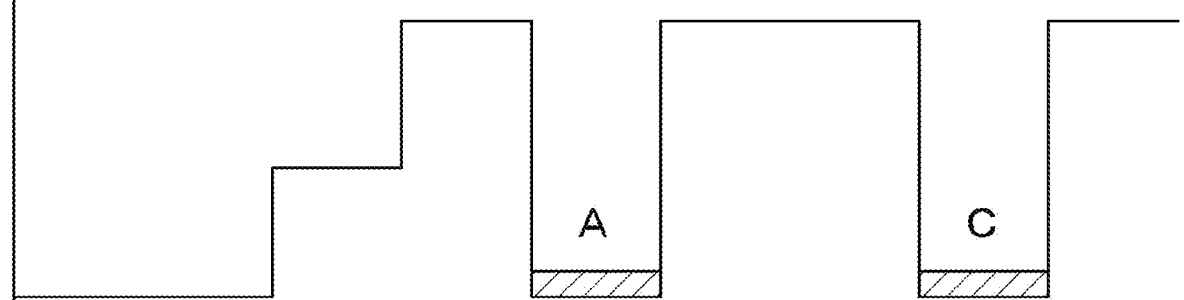
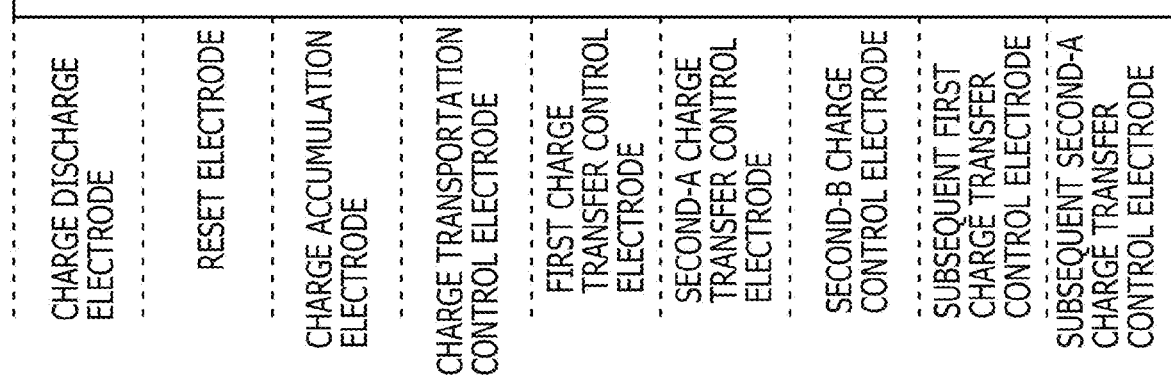

FIG. 34A
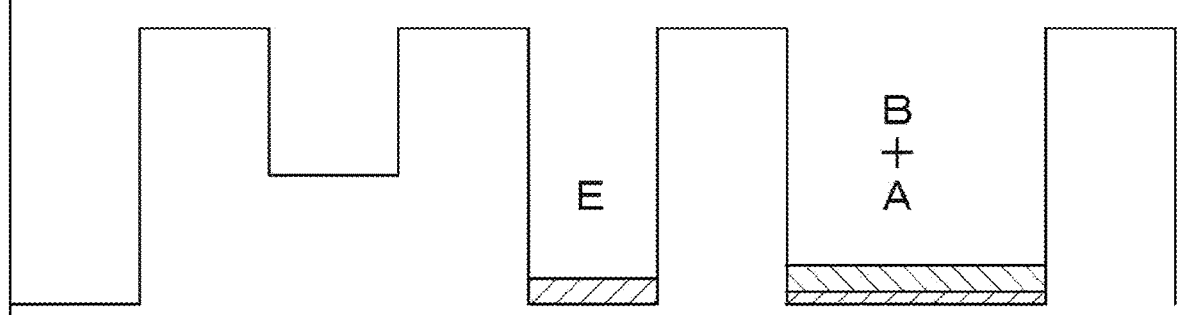
FIG. 34B
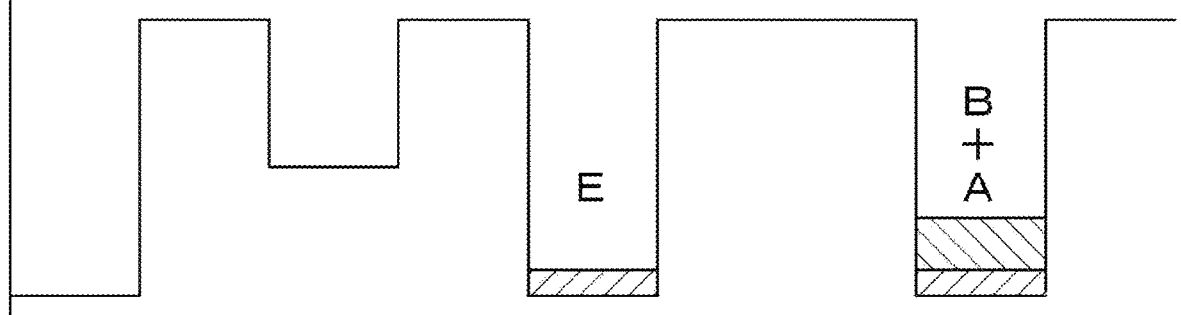
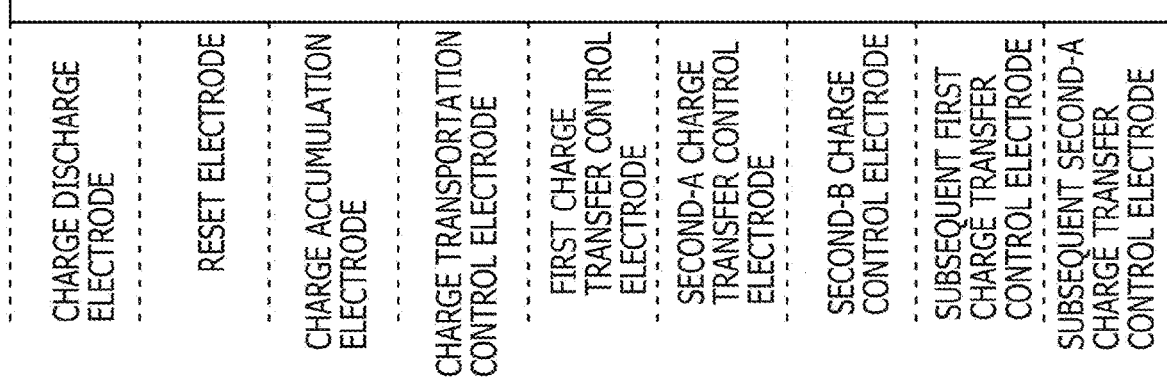

SOLID-STATE IMAGING DEVICE AND IMAGING METHOD

CROSS REFERENCE TO RELATED APPLICATIONS

This application is a U.S. National Phase of International Patent Application No. PCT/JP2020/027987 filed on Jul. 20, 2020, which claims priority benefit of Japanese Patent Application No. JP 2019-188548 filed in the Japan Patent Office on Oct. 15, 2019. Each of the above-referenced applications is hereby incorporated herein by reference in its entirety.

TECHNICAL FIELD

The present disclosure relates to a solid-state imaging device and an imaging method.

BACKGROUND ART

A time delay integration (TDI) line sensor has been used to obtain an image having sufficient brightness even under low illuminance during high-speed imaging or in other situations. The TDI line sensor integrates (sums or accumulates) luminance values according to movement of an object while the object is being slightly shifted. In this manner, a light amount to be obtained is raised and smoothed by integration. Accordingly, noise reduction is also achievable. A TDI sensor using a conventional CMOS image sensor integrates luminance values for each row (e.g., see PTL 1).

CITATION LIST

Patent Literature

[PTL 1]
Japanese Patent Laid-Open No. 2012-120153

SUMMARY

Technical Problem

Meanwhile, the TDI sensor which uses the conventional CMOS image sensor and integrates luminance values for each row requires an analog/digital converter for each row, and also requires an adder and a memory for integration. In this case, such problems as an increase in a circuit area and a rise of power consumption may arise.

Accordingly, an object of the present disclosure is to provide a solid-state imaging device having a configuration and a structure capable of reducing a circuit area and power consumption, and an imaging method using this solid-state imaging device.

Solution to Problem

A solid-state imaging device of the present disclosure for achieving the above object includes an imaging element array that includes M (M≥2) imaging elements arranged in a first direction and N (N≥2) imaging elements arranged in a second direction different from the first direction, that is, M×N imaging elements in total, each of the imaging elements including a photoelectric conversion unit that includes a photoelectric conversion layer, an insulation layer formed in contact with a first surface of the photoelectric conversion layer, a charge discharge electrode formed in contact with the first surface of the photoelectric conversion layer, an upper electrode formed in contact with a second surface of the photoelectric conversion layer on a side opposite to the first surface, and receiving incident light, and a charge accumulation electrode facing the first surface of the photoelectric conversion layer via the insulation layer and disposed away from the charge discharge electrode, the photoelectric conversion layer is provided as a common layer at least for the N imaging elements arranged in the second direction and constituting the imaging element array, the photoelectric conversion unit of each of the imaging elements further includes a first charge transfer control electrode and a second charge transfer control electrode so disposed as to face the first surface of the photoelectric conversion layer via the insulation layer and disposed away from the charge discharge electrode and the charge accumulation electrode, and a light shielding layer, the photoelectric conversion layer includes a photoelectric conversion layer-first region so located as to face the charge accumulation electrode, a photoelectric conversion layer-second region so located as to face the first charge transfer control electrode, and a photoelectric conversion layer-third region so located as to face the second charge transfer control electrode, and the light shielding layer covers at least the photoelectric conversion layer-second region and the photoelectric conversion layer-third region.

An imaging method of the present disclosure for achieving the above object is an imaging method that uses a solid-state imaging device including an imaging element array that includes M (M≥2) imaging elements arranged in a first direction and N (N≥2) imaging elements arranged in a second direction different from the first direction, that is, M×N imaging elements in total, each of the imaging elements including a photoelectric conversion unit that includes a photoelectric conversion layer, an insulation layer formed in contact with a first surface of the photoelectric conversion layer, a charge discharge electrode formed in contact with the first surface of the photoelectric conversion layer, an upper electrode formed in contact with a second surface of the photoelectric conversion layer on a side opposite to the first surface, and receiving incident light, and a charge accumulation electrode facing the first surface of the photoelectric conversion layer via the insulation layer and disposed away from the charge discharge electrode, the photoelectric conversion layer is provided as a common layer at least for the N imaging elements arranged in the second direction and constituting the imaging element array, the photoelectric conversion unit of each of the imaging elements further includes a first charge transfer control electrode and a second charge transfer control electrode so disposed as to face the first surface of the photoelectric conversion layer via the insulation layer, and disposed away from the charge discharge electrode and the charge accumulation electrode, and a light shielding layer, the photoelectric conversion layer includes a photoelectric conversion layer-first region so located as to face the charge accumulation electrode, a photoelectric conversion layer-second region so located as to face the first charge transfer control electrode, and a photoelectric conversion layer-third region so located as to face the second charge transfer control electrode, and the light shielding layer covers at least the photoelectric conversion layer-second region and the photoelectric conversion layer-third region, the imaging method including the steps of, after each of the imaging elements discharges charges remaining in the photoelectric conversion layer-first region by an operation of the charge discharge electrode, applying light to the photoelectric conversion layer of each of the imaging elements with a voltage kept being applied to the upper electrode and the charge accumulation electrode to accumulate charges in the photoelectric conversion layer-first region of each of the imaging elements, subsequently, transferring the charges accumulated in the photoelectric conversion layer-first region in each of the imaging elements to the photoelectric conversion layer-second region, and accumulating the transferred charges in addition to charges already accumulated in the photoelectric conversion layer-second region, and then, transferring the charges accumulated in the photoelectric conversion layer-second region of an nth (n: any positive integer ranging from 1 to (N−1)) imaging element included in the N imaging elements arranged in the second direction to the photoelectric conversion layer-second region of an (n+1)th imaging element according to an operation of the second charge transfer control electrode.

BRIEF DESCRIPTION OF DRAWINGS

FIG. 8 is an equivalent circuit diagram of the imaging element constituting the solid-state imaging device of Embodiment 1.

FIG. 9 is a diagram schematically depicting charge accumulation states of the respective imaging elements of the solid-state imaging device of Embodiment 1 during operation in a case where the solid-state imaging device of Embodiment 1 is used as a TDI line sensor.

FIG. 10 is a diagram continuing from FIG. 9 and schematically depicting charge accumulation states of the respective imaging elements of the solid-state imaging device of Embodiment 1 during operation in a case where the solid-state imaging device of Embodiment 1 is used as a TDI line sensor.

FIGS. 15A and 15B are diagrams continuing from FIG. 14B and schematically depicting a potential state and the like at respective parts of the imaging element constituting the solid-state imaging device of Embodiment 1 during operation.

FIGS. 25A and 25B are diagrams continuing from FIG. 24B and schematically depicting a potential state and the like at respective parts of the imaging element constituting the solid-state imaging device of Embodiment 2 during operation.

FIGS. 26A and 26B are diagrams continuing from FIG. 25B and schematically depicting a potential state and the like at respective parts of the imaging element constituting the solid-state imaging device of Embodiment 2 during operation.

FIGS. 29A and 29B are diagrams each schematically depicting a potential state and the like at respective parts of the imaging element constituting the solid-state imaging device of Embodiment 3 during operation.

FIGS. 34A and 34B are diagrams continuing from FIG. 33B and schematically depicting a potential state and the like at respective parts of the imaging element constituting the solid-state imaging device of Embodiment 3 during operation.

DESCRIPTION OF EMBODIMENTS

Figure 1:
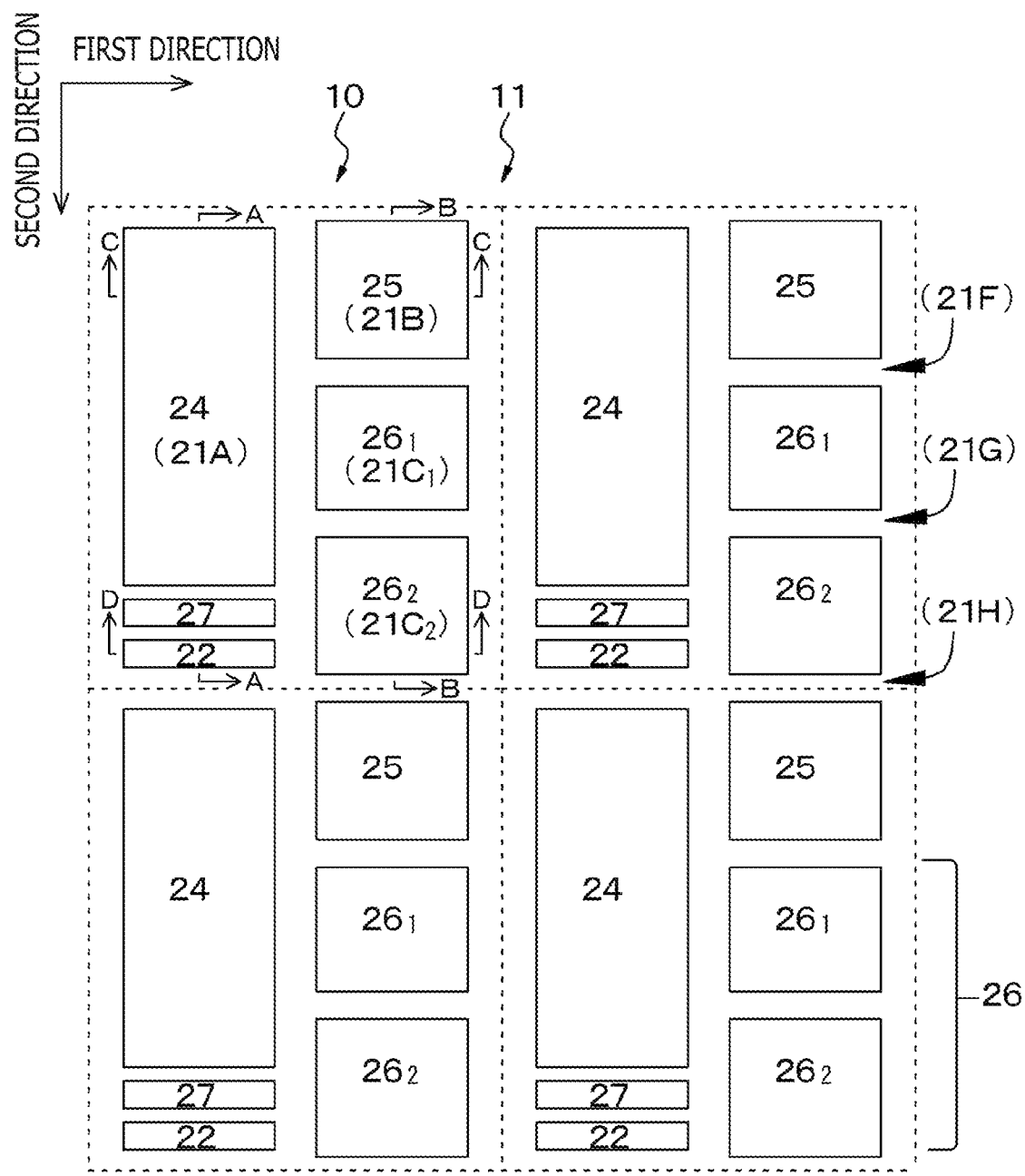
FIG. 1 is a diagram schematically depicting an arrangement of a charge discharge electrode, a reset electrode, a charge accumulation electrode, a first charge transfer control electrode, and a second charge transfer control electrode included in an imaging element constituting a solid-state imaging device of Embodiment 1.

The present disclosure will hereinafter be described on the basis of embodiments with reference to the drawings. However, the present disclosure is not limited to these embodiments, and various numerical values and materials included in the embodiments are only examples of those. Note that the description will be given in the following order.

1. General description concerning solid-state imaging device of present disclosure and imaging method of present disclosure
2. Embodiment 1 (solid-state imaging device of present disclosure and imaging method of present disclosure)
3. Embodiment 2 (modification of Embodiment 1)
4. Embodiment 3 (combination of Embodiment 1 and Embodiment 2)
5. Embodiment 4 (modification of Embodiment 1 to Embodiment 3)
6. Embodiment 5 (modification of Embodiment 1 to Embodiment 4)
7. Embodiment 6 (modification of Embodiment 1 to Embodiment 5)
8. Others <General Description Concerning Solid-State Imaging Device of Present Disclosure and Imaging Method of Present Disclosure>

A solid-state imaging device of the present disclosure, or a solid-state imaging device of the present disclosure used by an imaging method of the present disclosure (these solid-state imaging devices will hereinafter be collectively referred to as a "solid-state imaging device and the like of the present disclosure" in some cases) may have such a form that charges accumulated in a photoelectric conversion layer-first region of each of imaging elements are transferred (transported) to a photoelectric conversion layer-second region.

A first charge transfer control electrode and a second charge transfer control electrode in the solid-state imaging device and the like of the present disclosure including the above preferable form can be configured to be disposed along an imaging element boundary region extending in a second direction. Moreover, in this case, the first charge transfer control electrode and the second charge transfer control electrode in each of the N imaging elements arranged in the second direction can be configured to be alternately disposed in a belt shape. Further, adoptable is a configuration in which charges accumulated in the photoelectric conversion layer-second region included in the nth (n: any positive integer ranging from 1 to (N−1)) imaging element of the N imaging elements arranged in the second direction are transferred (transported) to the photoelectric conversion layer-second region included in the (n+1)th imaging element according to an operation of the second charge transfer control electrode located between the nth imaging element and the (n+1)th imaging element, after charges accumulated in the photoelectric conversion layer-first region of the nth imaging element are transferred (transported) to the photoelectric conversion layer-second region. In addition, in the above configuration the second charge transfer control electrode may include at least a second-A charge transfer control electrode and a second-B charge transfer control electrode, and
the second charge transfer control electrode constituting the nth (n: any positive integer ranging from 1 to (N−1)) imaging element included in the N imaging elements arranged in the second direction can be configured to be disposed between the first charge transfer control electrode constituting the nth imaging element and the first charge transfer control electrode constituting the (n+1)th imaging element, or
the second charge transfer control electrode may include at least a second-A charge transfer control electrode and a second-B charge transfer control electrode, and
the second charge transfer control electrode constituting the (n+1)th (n: any positive integer ranging from 1 to (N−1)) imaging element included in the N imaging elements arranged in the second direction can be configured to be disposed between the first charge transfer control electrode constituting the nth imaging element and the first charge transfer control electrode constituting the (n+1)th imaging element. The second charge transfer control electrode may include not only the two charge transfer control electrodes such as the second-A charge transfer control electrode and the second-B charge transfer control electrode, but also three or more second charge transfer control electrodes.

In such a manner, charges accumulated in the photoelectric conversion layer-first region of the nth imaging element of the N imaging elements arranged in the second direction (referred to as "$(charges)_n$" for convenience) are transferred (transported) to the photoelectric conversion layer-second region. In this case, charges transferred (transported) from the photoelectric conversion layer-second region of the (n−1)th imaging element (referred to as $(charges)_{(n-01)}$ for convenience) are already present in the photoelectric conversion layer-second region of the nth imaging element. Accordingly, the $(charges)_{(n-1)}$ and the $(charges)$ n are accumulated in the photoelectric conversion layer-second region of the nth imaging element. Thereafter, the $(charges)_{(n-1)}$ and the $(charges)_n$ accumulated in the photoelectric conversion layer-second region of the nth imaging element are transferred (transported) to the photoelectric conversion layer-second region of the (n+1)th imaging element.

Moreover, according to the solid-state imaging device and the like including the respective types of preferred forms and configurations described above, the photoelectric conversion unit can be configured to further include a reset electrode disposed away from the charge discharge electrode and the charge accumulation electrode in such a position as to face a first surface of the photoelectric conversion layer via an insulation layer and intervene between the charge discharge electrode and the charge accumulation electrode. In this case, charges can be transferred (transported) to the photoelectric conversion layer-second region, and then charges left in the photoelectric conversion layer-first region can be discharged to the outside of the system by an operation of the charge discharge electrode according to an operation of the reset electrode. As a result, complete depletion of the photoelectric conversion layer-first region is achievable.

Further, according to the solid-state imaging device and the like including the respective types of preferred forms and configurations described above, charges remaining in the photoelectric conversion layer-first region constituting each of the two imaging elements arranged side by side in the first direction can be configured to be discharged to the outside of the system according to an operation of a common charge discharge electrode. In other words, the charge discharge electrode can include a common electrode shared by the two imaging elements disposed adjacent to each other (side by side) in the first direction. In this case, the two imaging elements share the one charge discharge electrode. Alternatively, the charge discharge electrode can include a common electrode shared by the four imaging elements, i.e., the two imaging elements disposed adjacent to each other in the second direction, and the two imaging elements disposed adjacent to these two imaging elements in the first direction. In this case, the four imaging elements share the one charge discharge electrode.

Further, according to the solid-state imaging device and the like including the respective types of preferred forms and configurations described above, the photoelectric conversion unit further includes a charge transportation control electrode so disposed as to face the first surface of the photoelectric conversion layer via the insulation layer and in such a position as to be located between the charge accumulation electrode and the first charge transfer control electrode, and located away from the charge accumulation electrode and the first charge transfer control electrode, and
the light shielding layer can be configured to further cover a photoelectric conversion layer-fourth region so located as to face the charge transportation control electrode. In addition, in this case, charges accumulated in the photoelectric conversion layer-first region of each of the imaging elements can be configured to be transferred (transported) to the photoelectric conversion layer-second region on the basis of an operation of the charge transportation control electrode. The charge transportation control electrode may be formed at the same level as the level of the first charge transfer control electrode or the charge accumulation electrode, or at a level different from these levels.

Further, according to the solid-state imaging device and the like including the respective types of preferred forms and configurations described above, an element separation electrode can be configured to be provided between an mth (m: any positive integer ranging from 1 to (M−1)) imaging element and an (m+1)th imaging element. Specifically, the element separation electrode can be configured to be provided in the imaging element boundary region described above. The element separation electrode is disposed away from the first charge transfer control electrode and the second charge transfer control electrode. Furthermore, according to the solid-state imaging device and the like including the respective types of preferred forms and configurations described above, a second element separation electrode can be configured to be provided between the charge accumulation electrode and the second charge transfer control electrode in each of the imaging elements. The second element separation electrode is disposed away from the charge accumulation electrode and the second charge transfer control electrode.

Further, according to the solid-state imaging device and the like including the respective types of preferred forms and configurations described above, the photoelectric conversion layer-third region of the imaging element located at an end of the N imaging elements arranged in the second direction can be configured to be electrically connected to a floating diffusion layer via a connection portion in contact with the photoelectric conversion layer-third region. In addition, in a case where a final end of the imaging element located at the end includes the photoelectric conversion layer-second region, the photoelectric conversion layer-second region can be configured to be electrically connected to the floating diffusion layer via a connection portion in contact with the photoelectric conversion layer-second region. Moreover, in these cases, the floating diffusion layer can be configured to be electrically connected to an analog/digital conversion circuit or can be configured to be electrically connected to a register circuit. The analog/digital conversion circuit and the register circuit can include a known analog/digital conversion circuit and a known register circuit, respectively.

Further, according to the solid-state imaging device and the like including the respective types of preferred forms and configurations described above, the solid-state imaging device can include a time delay integration (TDI) line sensor. The TDI line sensor is applicable to such fields as inspection of an image display panel, inspection of a film, inspection of foods, cosmetics, and medical supplies, and a flow cytometer, for example. However, the solid-state imaging device is not limited to the TDI line sensor, and can include a digital still camera, a video camera, a camcorder, a monitoring camera, a vehicle-mounted camera, a smart-phone camera, a user interface camera for gaming, and a biometric authentication camera, for example.

Each of the sizes (areas) of the first charge transfer control electrode and the photoelectric conversion layer-second region and each of the sizes (areas) of the second charge transfer control electrode and the photoelectric conversion layer-third region in the N imaging elements arranged in the second direction may be a uniform size (area) regardless of the value n, or may increase as the value n becomes larger. Moreover, a potential applied to each of the first charge transfer control electrode and the second charge transfer control electrode may be uniform regardless of the value n, or may vary as the value n becomes larger. Specifically, in a case where charges are electrons, the potential may increase toward the positive side as the value n becomes larger. Further, the charges accumulated in the first charge transfer control electrode of the nth imaging element are transferred (transported) to the first charge transfer control electrode of the (n+1)th imaging element via the second charge transfer control electrode. In this case, the potential of the first charge transfer control electrode, the potential of the second charge transfer control electrode of the nth imaging element, and the potential of the first charge transfer control electrode of the (n+1)th imaging element may be either equalized or varied. Specifically, in a case where charges are electrons, the potential of the first charge transfer control electrode, the potential of the second charge transfer control electrode of the nth imaging element, and the potential of the first charge transfer control electrode of the (n+1)th imaging element are only required to increase toward the positive side in this order. In a case where charges are holes, the potential of the first charge transfer control electrode, the potential of the second charge transfer control electrode of the nth imaging element, and the potential of the first charge transfer control electrode of the (n+1)th imaging element are only required to decrease toward the positive side in this order.

According to the solid-state imaging device and the like of the present disclosure including the respective types of preferred forms and configurations described above, the value M may be 1024, 2048, 4096, 8192, or 16384, for example, while the value N may be 8, 16, 32, 64, 128, or 256, for example. The values M and N are not limited to these examples.

It is preferable that the first direction and the second direction cross each other at right angles. The photoelectric conversion layer is provided as a common layer shared by the N imaging elements constituting the imaging element array and arranged in the second direction. Specifically, the photoelectric conversion layer may be provided as a common layer shared by the N imaging elements arranged in the second direction, may be provided as a common layer shared by the M×N imaging elements, or may be provided as a common layer shared by (M/M')×N imaging elements (M': integer equal to or larger than 2 and equal to or smaller than M/2). Moreover, the photoelectric conversion layer may be so formed as to cover the entire one imaging element or may be so formed as to cover a part of the one imaging element.

The light shielding layer covers at least the photoelectric conversion layer-second region and the photoelectric conversion layer-third region. Examples of the region covered by the light shielding layer include (A) the photoelectric conversion layer-second region and the photoelectric conversion layer-third region, (B) the photoelectric conversion layer-fourth region in addition to the case (A), (C) a region of the photoelectric conversion layer so disposed as to face a region between the charge accumulation electrode and the charge transportation control electrode, and a photoelectric conversion layer-fifth region corresponding to a region of the photoelectric conversion layer so disposed as to face the charge transportation control electrode and the first charge transfer control electrode in addition to the case (B), (D) a photoelectric conversion layer-sixth region located between the photoelectric conversion layer-second region and the photoelectric conversion layer-third region alternately arranged in a belt shape in addition to the cases (A) to (C), (E) a photoelectric conversion layer-seventh region located between a region of the photoelectric conversion layer so disposed as to face the second-A charge transfer control electrode and a region of the photoelectric conversion layer so disposed as to face the second-B charge transfer control electrode in addition to the cases (A) to (D), (F) a photoelectric conversion layer-eighth region extending from the photoelectric conversion layer-second region and the photoelectric conversion layer-third region and disposed between the adjoining imaging elements, and (G) a region of the photoelectric conversion layer other than the photoelectric conversion layer-first region.

For example, the light shielding layer can include chromium (Cr), copper (Cu), aluminum (Al), tungsten (W), or a resin not transmitting light (e.g., polyimide resin).

Charges accumulated in the photoelectric conversion layer-first region in each of the imaging elements are transferred to the photoelectric conversion layer-second region. This transfer of charges is achieved according to the operation of the charge transportation control electrode in a case where the charge transportation control electrode is provided or achieved according to the state of the potential of the photoelectric conversion layer formed by the charge accumulation electrode and the first charge transfer control electrode in a case where the charge transportation control electrode is not provided.

In a case where the photoelectric conversion layer includes an organic material, the photoelectric conversion layer includes any one of the following four forms (1) a p-type organic semiconductor,
(2) an n-type organic semiconductor,
(3) a stack structure of a p-type organic semiconductor layer and an n-type organic semiconductor layer, a stack structure of a p-type organic semiconductor layer, a mixed layer of a p-type organic semiconductor and an n-type organic semiconductor (bulk hetero structure), and an n-type organic semiconductor layer, a stack structure of a p-type organic semiconductor layer and a mixed layer of a p-type organic semiconductor and an n-type organic semiconductor (bulk hetero structure), or a stack structure of an n-type organic semiconductor layer and a mixed layer of a p-type organic semiconductor and an n-type organic semiconductor (bulk hetero structure), or
(4) a mixture of a p-type organic semiconductor and an n-type organic semiconductor (bulk hetero structure). In this case, a stacking order can be switched in any manners.

Examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, a polyfluorene derivative, and others. Examples of the n-type organic semiconductor include fullerene or a fullerene derivative <e.g., fullerene such as C60, C70, and C74 (higher fullerene), endohedral fullerene) or a fullerene derivative (e.g., fullerene fluoride, PCBM fullerene compound, fullerene polymer)>, an organic semiconductor having larger (deeper) HOMO and LUMO than those of a p-type organic semiconductor, and a transparent inorganic metal oxide. Specifically, examples of the n-type organic semiconductor include a heterocyclic compound containing nitrogen atoms, oxygen atoms, and sulfur atoms, an organic molecule which contains, as a part of a molecular framework, a pyridine derivative, a pyrazine derivative, a pyrimidine derivative, a triazine derivative, a quinoline derivative, a quinoxaline derivative, an isoquinoline derivative, an acridine derivative, a phenazine derivative, a phenanthroline derivative, a tetrazole derivative, a pyrazole derivative, an imidazole derivative, thiazole derivative, an oxazole derivative, a benzimidazole derivative, an benzotriazole derivative, a benzoxazole derivative, a carbazole derivative, a benzofuran derivative, a dibenzofuran derivative, subporphyrazine derivative, a polyphenylene vinylene derivative, a polybenzothiadiazole derivative, polyfluorene derivative, or the like, an organic metal complex, and a subphthalocyanine derivative. Examples of a group or the like contained in the fullerene derivative include halogen atoms, a straight-chain, branched, or annular alkyl group or phenyl group, a group having a straight-chain or condensed-ring aromatic compound, a group having a halide, a partial fluoroalkyl group, a perfluoroalkyl group, a silyl alkyl group, a silyl alkoxy group, an aryl silyl group, an aryl sulfanyl group, an alkyl sulfanyl group, an aryl sulfonyl group, an alkyl sulfonyl group, an aryl sulfide group, an alkyl sulfide group, an amino group, an alkyl amino group, an aryl amino group, a hydroxy group, an alkoxy group, an acylamino group, acyloxy group, a carbonyl group, a carboxy group, a carboxamide group, a carboalkoxy group, an acyl group, a sulfonyl group, a cyano group, a nitro group, a group having a chalcogenide, a phosphine group, a phosphonic group, and derivatives of these. The thickness of the photoelectric conversion layer including an organic material (referred to as "organic photoelectric conversion layer" in some cases) is not particularly limited to any thickness. For example, this thickness may be in a range from $1 \times 10^{-8}$ to $5 \times 10^{-7}$ m, preferably from $2.5 \times 10^{-8}$ m to $3 \times 10^{-7}$ m, more preferably from $2.5 \times 10^{-8}$ m to $2 \times 10^{-7}$ m, and further preferably from $1 \times 10^{-7}$ m to $1.8 \times 10^{-7}$ m. Note that the organic semiconductor is often classified into a p-type and an n-type. In this case, the p-type refers to a type easily transporting holes, while the n-type refers to a type easily transporting electrons. This definition is not limited to such interpretation that holes or electrons are contained as thermal excitation majority carriers like an inorganic semiconductor.

Alternatively, examples of the material constituting the organic photoelectric conversion layer for photoelectrically converting green light include a rhodamine dye, a merocyanine dye, a quinacridone derivative, and a subphthalocyanine dye (subphthalocyanine derivative). Examples of the material constituting the organic photoelectric conversion layer for photoelectrically converting blue light include a coumaric acid dye, tris-8-hydroxyquinolialuminum (Alq3), and a merocyanine dye. Examples of the material constituting the organic photoelectric conversion layer for photoelectrically converting red light include a phthalocyanine dye and a subphthalocyanine dye (subphthalocyanine derivative).

For example, a method for forming the organic layer including the respective types of organic materials and constituting the photoelectric conversion layer may be a dry film forming method or a wet film forming method. Examples of the dry film forming methods include resistance heating or high-frequency heating, a vacuum deposition method using electron beam heating, a flash deposition method, a plasma deposition method, an EB deposition method, various types of sputtering methods (two-pole sputtering method, direct-current sputtering method, direct-current magnetron sputtering method, high-frequency sputtering method, magnetron sputtering method, RF-DC coupled type bias sputtering method, ECR sputtering method, facing target sputtering method, high-frequency sputtering method, ion-beam sputtering method), a DC (Direct Current) method, an RF method, a multicathodic method, an activation reaction method, an electric field deposition method, various types of ion-plating methods such as a high-frequency ion-plating method and a reactive ion-plating method, a laser ablation method, a molecular beam epitaxy method, a laser transfer method, and a molecular beam epitaxy (MBE method). Moreover, examples of the CVD method include a plasma CVD method, a heat CVD method, an MOCVD method, and a light CVD method. On the other hand, specific examples of the wet method include a spin coating method, an immersion method, a cast method, a micro contact print method, a drop cast method, various types of printing methods such as a screen printing method, an ink jet printing method, an offset printing method, a gravure printing method, and flexography, a stamp method, and various types of coating methods such as a spray method, an air doctor coating method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. The coating method may use, as a solvent, an organic solvent having no polarity or low polarity, such as toluene, chloroform, hexane, and ethanol, for example. Examples of the patterning method include chemical etching such as shadow masking, laser transfer, and photolithography, and physical etching using ultraviolet light, laser beams or the like. Examples of the flattening technology of the respective types of organic layer include a laser flattening method and a reflow method.

Alternatively, examples of the inorganic material constituting the photoelectric conversion layer include crystalline silicon, amorphous silicon, microcrystalline silicon, crystalline selenium, amorphous selenium, and CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$ as chalcopyrite compounds, and also include GaAs, InP, AlGaAs, InGaP, and AlGaInP, InGaAsP as group-III-V compounds, and further include compound semiconductors such as CdSe, CdS, In$_2$Se$_3$, In$_2$S$_3$, Bi$_2$Se$_3$, Bi$_2$S$_3$, ZnSe, ZnS, PbSe, and PbS. In addition, quantum dots including these materials are available as the photoelectric conversion layer.

Alternatively, the photoelectric conversion layer may have a stack structure including a lower semiconductor layer and an upper photoelectric conversion layer. Recombination during accumulation of charges is avoidable by providing the lower semiconductor layer in such a manner. Accordingly, transfer (transportation) efficiency of charges accumulated in the photoelectric conversion layer-first region to the photoelectric conversion layer-second region can be raised, and generation of dark currents can be reduced. The material constituting the upper photoelectric conversion layer is only required to be appropriately selected from the foregoing respective materials constituting the photoelectric conversion layer. On the other hand, it is preferable that the material constituting the lower semiconductor layer be a material having a large bandgap value (e.g., a bandgap value of 3.0 eV or higher), and also have higher mobility than that of the material constituting the photoelectric conversion layer. Specifically, examples of the material constituting the lower semiconductor layer include an oxide semiconductor material such as IGZO, transition metal dichalcogenide, silicon carbide, diamond, graphene, carbon nanotube, and an organic semiconductor material such as a condensed polycyclic hydrocarbon compound and a condensed heterocyclic compound. Alternatively, in a case where charges to be accumulated are holes, the material constituting the lower semiconductor layer may be a material having lower ionization potential than the ionization potential of the material constituting the photoelectric conversion layer. In a case where charges to be accumulated are electrons, the material constituting the lower semiconductor layer can be a material having higher electron affinity than the electron affinity of the material constituting the photoelectric conversion layer. Alternatively, it is preferable that the impurity concentration of the material constituting the lower semiconductor layer be $1 \times 10^{18}$ cm$^{-3}$ or lower. In addition, for example, the thickness of the lower semiconductor layer is in a range from $1 \times 10^{-3}$ m to $1.5 \times 10^{-7}$ m, preferably in a range from $2 \times 10^{-3}$ m to $1.0 \times 10^{-7}$ m, and more preferably in a range from $3 \times 10^{-3}$ m to $1.0 \times 10^{-7}$ m. The lower semiconductor layer may have either a single layer configuration or a multilayer configuration. Moreover, the material constituting the lower semiconductor layer located above the charge accumulation electrode may be different from the material constituting the lower semiconductor layer located above the first charge transfer control electrode and the second charge transfer control electrode.

In a case where the lower semiconductor layer used to constitute the lower semiconductor layer is an oxide semiconductor material, the composition of the material constituting the lower semiconductor layer may be obtained using an ICP emission spectral analysis (high frequency inductive coupling plasma emission spectral analysis, ICP-AES), or an X-ray photoelectron spectroscopy (XPS), for example. Other impurities such as hydrogen or other metals or metal compounds may be mixed during a film forming step of the lower semiconductor layer depending on situations. This mixture is not prevented if mixture of such impurities is limited to an extremely small amount (e.g., 3% or lower in molar fraction).

According to the solid-state imaging device and the like including the respective types of preferred forms and configurations described above, photoelectric conversion is caused in the photoelectric conversion layer by irradiation of light. As a result, holes and electrons are separated from each other by carrier separation. Thereafter, the electrode from which holes are extracted is designated as an anode, while the electrode from which electrons are extracted is designated as a cathode. In a certain case, the charge discharge electrode constitutes the cathode, while the upper electrode constitutes the anode. In another case, the charge discharge electrode constitutes the anode, while the upper electrode constitutes the cathode.

A first carrier blocking layer may be provided between the photoelectric conversion layer (or lower semiconductor layer) and the charge discharge electrode, or a second carrier blocking layer may be provided between the photoelectric conversion layer and the upper electrode. Moreover, a first charge injection layer may be provided between the first carrier blocking layer and the charge discharge electrode, or a second charge injection layer may be provided between the second carrier blocking layer and the upper electrode. Examples of the materials constituting the electron injection layers include alkali metal such as lithium (Li), sodium (Na), and potassium (K), and fluoride and oxide of these, alkali earth metal such as magnesium (Mg) and calcium (Ca), and fluoride and oxide of these.

The upper electrode located on the light entrance side may be provided as a common electrode shared by a plurality of the imaging elements. In other words, the upper electrode can include what is called a solid electrode.

The upper electrode can include a transparent conductive material. Moreover, each of the first charge transfer control electrode, the second charge transfer control electrode, the charge accumulation electrode, the charge discharge electrode, the reset electrode, the element separation electrode, and the second element separation electrode (these electrodes are collectively referred to as "first charge transfer control electrode and the like" in some cases) also includes a transparent conductive material. Each of the first charge transfer control electrode and the like can include a metal material in some situations. In this case, specifically, the upper electrode located on the light entrance side includes a transparent conductive material, while each of the first charge transfer control electrode and the like can include Al—Nd (alloy of aluminum and neodymium) or ASC (alloy of aluminum, samarium, and copper), for example. The electrode including a transparent conductive material will be referred to as a "transparent electrode" in some cases. The transparent conductive material constituting the transparent electrode may be a conductive metal oxide, for example. Specific examples of this material include indium oxide, indium-tin oxide (ITO, Indium Tin Oxide, including Sn-doped $In_2O_3$, crystalline ITO and amorphous ITO), indium-zinc oxide (IZO, Indium Zinc Oxide) produced by adding indium to zinc oxide as a dopant, indium-gallium oxide (IGO) produced by adding indium to gallium oxide as a dopant, indium-gallium-zinc oxide (IGZO, In—$GaZnO_4$) produced by adding indium and gallium to zinc oxide as dopants, indium-tin-zinc oxide (ITZO) produced by adding indium and tin to zinc oxide as dopants, IFO (F-doped $In_2O_3$), tin oxide ($SnO_2$), ATO (Sb-doped $SnO_2$), FTO (F-doped $SnO_2$), zinc oxide (including ZnO to which another element is doped), aluminum-zinc oxide (AZO) produced by adding aluminum to zinc oxide as a dopant, gallium-zinc oxide (GZO) produced by adding gallium to zinc oxide as a dopant, titanium oxide ($TiO_2$), niobium-titanium oxide (TNO) produced by adding niobium to titanium oxide as a dopant, antimony oxide, CuI, $InSbO_4$, ZnMgO, $CuInO_2$, $MgIn_2O_4$, CdO, $ZnSnO_3$, spinel oxide, an oxide having $YbFe_2O_4$ structure. Alternatively, a transparent electrode containing gallium oxide, titanium oxide, niobium oxide, nickel oxide or the like as a parent layer is available. The thickness of the transparent electrode may be in a range from $2\times10^{-8}$ m to $2\times10^{-7}$ m, preferably in a range from $3\times10^{-8}$ m to $1\times10^{-7}$ m. It is preferable that the first charge transfer control electrode and the like include the same material in view of simplification of a manufacturing process.

Alternatively, in a case where transparency is unnecessary, it is preferable that the conductive material constituting the cathode functioning as an electrode for extracting electrodes be a conductive material having a low work function (e.g., $\varphi=3.5$ eV to 4.5 eV). Specific examples of the conductive material include alkali metal (e.g., Li, Na, and K) and fluoride or oxide of these, alkali earth metal (e.g., Mg and Ca) and fluoride or oxide of these, aluminum (Al), zinc (Zc), tin (Sn), thallium (Tl), sodium-potassium alloy, aluminum-lithium alloy, magnesium-silver alloy, rare earth metal such as indium and ytterbium, and alloys of these. Alternatively, examples of the material constituting the cathode include metal such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co), and molybdenum (Mo), or alloys containing these metal elements, conductive particles including these metals, conductive particles of alloys containing these metals, polysilicon containing impurities, carbon-based materials, oxide semiconductor materials, and conductive materials such as carbon nanotube and graphene, and a stack structure of layers containing these elements. Further, the material constituting the cathode may be an organic material (conductive high molecule) poly(3,4-ethylenedioxythiophene)/polystyrene sulfonic acid [PEDOT/PSS], for example. In addition, these conductive materials mixed into binders (high molecules) and made into paste or ink may be hardened and used as an electrode.

The film forming method of the first charge transfer control electrode and the like and the upper electrode (cathode or anode 9 may be a dry method or a wet method. The dry method may be a physical vapor deposition method (PVD method) or a chemical vapor deposition method (CVD method). Examples of the film forming method using a principle of the PVD method include vacuum deposition method using resistance heating or high-frequency heating, an EB (electron beam) deposition method, various types of sputtering methods (magnetron sputtering method, RF-DC coupled type bias sputtering method, ECR sputtering method, facing target sputtering method, high-frequency sputtering method), an ion-plating method, a laser ablation method, a molecular beam epitaxy method, and a laser transfer method. Moreover, examples of the CVD method include a plasma CVD method, a heat CVD method, an organic metal (MO) CVD method, and a light CVD method. On the other hand, examples of the wet method include an electroplating method, an electroless plating method, a spin coating method, an ink jet method, a spray coating method, a stamp method, a micro contact printing method, a flexography method, an offset printing method, a gravure printing method, and a dip method. Examples of the patterning method include chemical etching such as shadow masking, laser transfer, and photolithography, and physical etching using ultraviolet light, laser beams or the like. The flattening technology adopted for the first charge transfer control electrode and the like and the upper electrode may be a laser flattening method, a reflow method, a CMP (Chemical Mechanical Polishing) method, or the like.

Examples of the material constituting the insulation layer not only include inorganic insulation materials such as metal oxide highly dielectric insulation materials like silicon-oxide-based material, silicon nitride ($SiN_Y$), and aluminum oxide ($Al_2O_3$), but also include polymethyl methacrylate (PMMA), polyvinyl phenol (PVP), polyvinyl alcohol (PVA), polyimide, polycarbonate (PC), polyethylene terephthalate (PET), polystyrene, silanol derivative (silane coupling agent) such as N-2 (aminoethyl) 3-aminopropyltrimethoxysilane (AEAPTMS), 3-mercaptopropyltrimethoxysilane (MPTMS), and octadecyltrichlorosilane (OTS), novolac phenol resin, fluorine-based resin, and organic insulation materials (organic polymers) such as straight chain hydrocarbons having a functional group provided at one end and capable of coupling with a control electrode, like octadecanethiol and dodecyl isocyanate. Combinations of these are also available. Examples of the silicon-oxide-based material include silicon oxide ($SiO_X$), BPSG, PSG, BSG, AsSG, PbSG, silicon oxynitride (SiON), SOG (spin-on glass), low dielectric constant insulation materials (e.g., polyarylether, cyclo-perfluorocarbon polymer and benzocyclobutene, cyclic fluororesin, polytetrafluoroethylene, aryl fluoride ether, polyimide fluoride, amorphous carbon, and organic SOG). The insulation layer may have a single-layer configuration, or can include a stack of a plurality of layers (e.g., two layers). In the latter case, it is only required to form an insulation layer-lower layer at least on the charge accumulation electrode, and on an area between the charge accumulation electrode and the first charge transfer control electrode, perform a flattening process for the insulation layer-lower layer to leave the insulation layer-lower layer at least on the region between the charge accumulation electrode and the first charge transfer control electrode, and form an insulation layer-upper layer on the left insulation layer-lower layer and the charge accumulation electrode. In this manner, flattening of the insulation layer is reliably achievable. The material constituting a protection material layer and various types of interlayer insulation layers described below is only required to be selected from these materials in an appropriate manner.

The solid-state imaging device and the like of the present disclosure may have such a form further including a control unit provided on the semiconductor substrate and having a driving circuit. The first charge transfer control electrode, the second charge transfer control electrode, the upper electrode, the charge accumulation electrode, the charge discharge electrode, the reset electrode, the element separation electrode, and the second element separation electrode are electrically connected to the control unit. Moreover, at least a floating diffusion layer (Floating Diffusion) and an amplification transistor constituting the control unit are provided on the semiconductor substrate. The photoelectric conversion layer-third region of the imaging element (photoelectric conversion layer-second region depending on situations) located at an end is configured to be connected to gate portions of the floating diffusion layer and the amplification transistor via a connection portion. Further, in this case, a reset transistor and a selection transistor constituting the control unit are further provided on the semiconductor substrate. In this case, an adoptable configuration is as follows. The floating diffusion layer is connected to one source/drain region of the reset transistor. One source/drain region of the amplification transistor is connected to one source/drain region of the selection transistor. The other source/drain region of the selection transistor is connected to a signal line.

Configurations and structures of the floating diffusion layer, the amplification transistor, the reset transistor, and the selection transistor constituting the control unit may be similar to configurations and structures of a conventional floating diffusion layer, a conventional amplification transistor, a conventional reset transistor, and a conventional selection transistor. The driving circuit may also have a known configuration and a known structure.

As described above, the connection portion is connected to the gate portions of the floating diffusion layer and the amplification transistor. The connection portion is only required to include a contact hole portion formed for connection between the photoelectric conversion layer-third region (photoelectric conversion layer-second region depending on situations) of the imaging element located at an end and the gate portions of the floating diffusion layer and the amplification transistor. Examples of the material constituting the connection portion (contact hole portion) include polysilicon to which impurities are doped, high melting metal or metal silicide such as tungsten, Ti, Pt, Pd, Cu, TiW, TiN, TiNW, $WSi_2$, and $MoSi_2$, and a stack structure of layers including these materials (e.g., Ti/TiN/W).

For example, the imaging element may have such a form that the first charge transfer control electrode and the like are formed on an interlayer insulation layer provided on the semiconductor substrate. Moreover, the imaging element may be either of a back-illuminated type or a front-illuminated type. The imaging element including a photoelectric conversion unit provided on or above the semiconductor substrate will be referred to as a "first type imaging element" for convenience, a photoelectric conversion unit constituting the first type imaging element will be referred to as a "first type photoelectric conversion unit" for convenience, an imaging element provided within the semiconductor substrate will be referred to as a "second type imaging element" for convenience, and a photoelectric conversion unit constituting the second type imaging element will be referred to as a "second type photoelectric conversion unit" for convenience in some cases.

The solid-state imaging device may be provided with an on-chip micro-lens as necessary, may be equipped with a shutter for controlling entrance of light into the imaging element as necessary, and may include an optical cut filter according to a purpose of the solid-state imaging device.

In a case where the solid-state imaging device is stacked with a reading integrated circuit (ROIC), for example, stacking is achievable by overlapping a driving substrate which has a connection region including the reading integrated circuit and copper (Cu) with an imaging element having a connection region such that the respective connection regions come into contact with each other, and bonding the respective connection regions. Alternatively, the connection regions may be bonded using a solder bump or the like.

Embodiment 1

Figure 2:
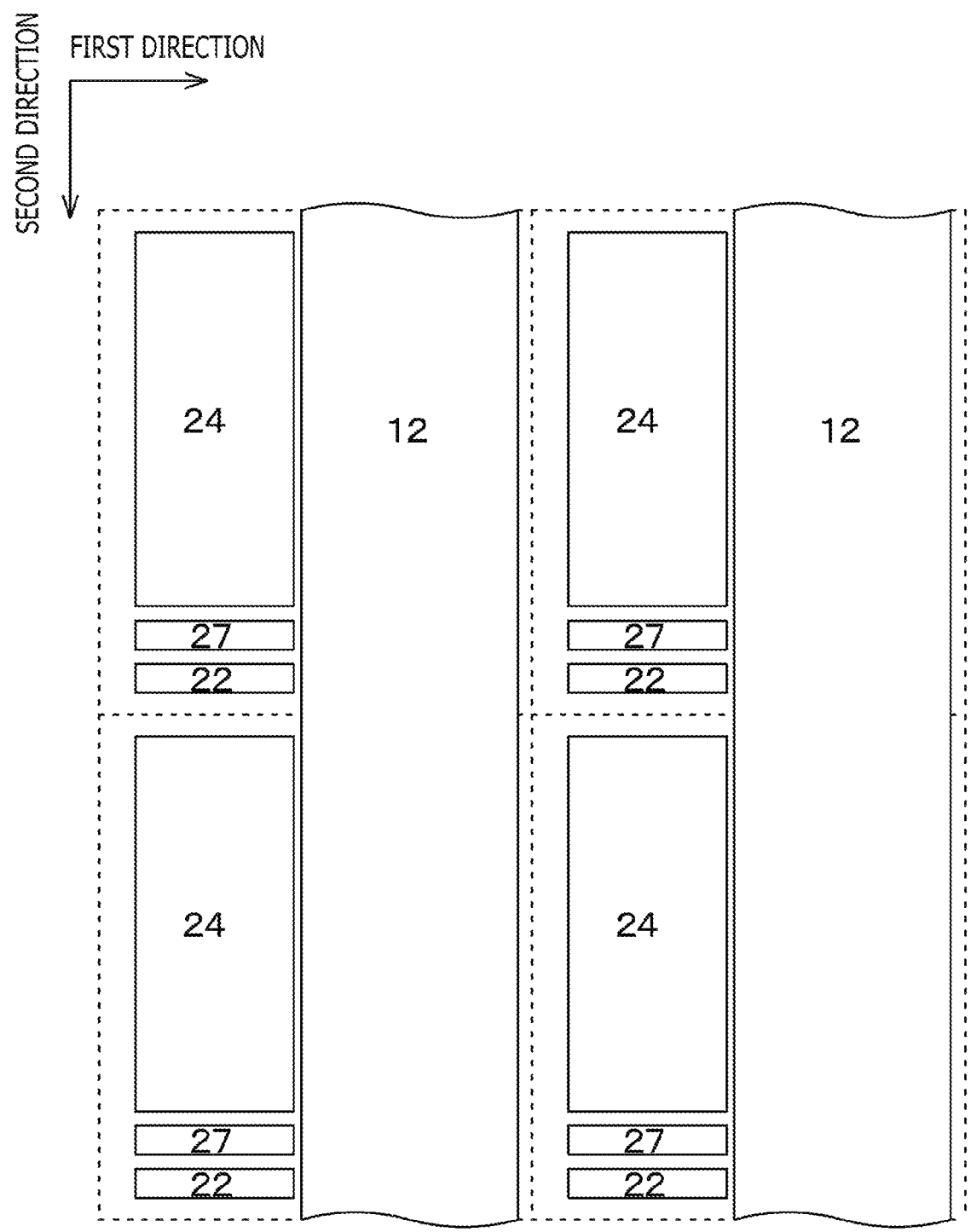
FIG. 2 is a diagram schematically depicting an arrangement of the charge discharge electrode, the reset electrode, the charge accumulation electrode, and a light shielding layer included in the imaging element constituting the solid-state imaging device of Embodiment 1.
Figure 3:
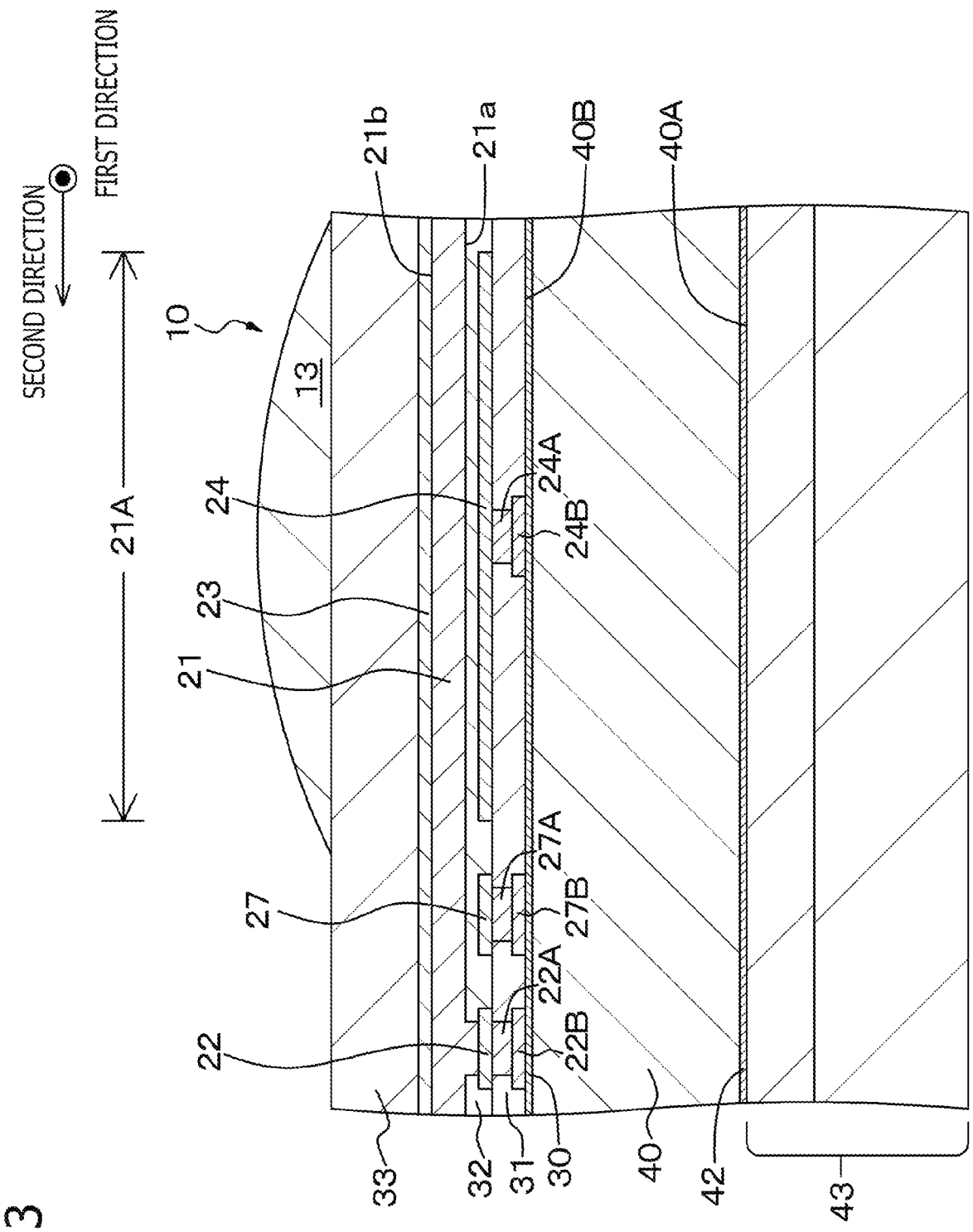
FIG. 3 is a partial cross-sectional diagram schematically depicting the imaging element constituting the solid-state imaging device of Embodiment 1 and taken along arrows A-A in FIG. 1.
Figure 4:
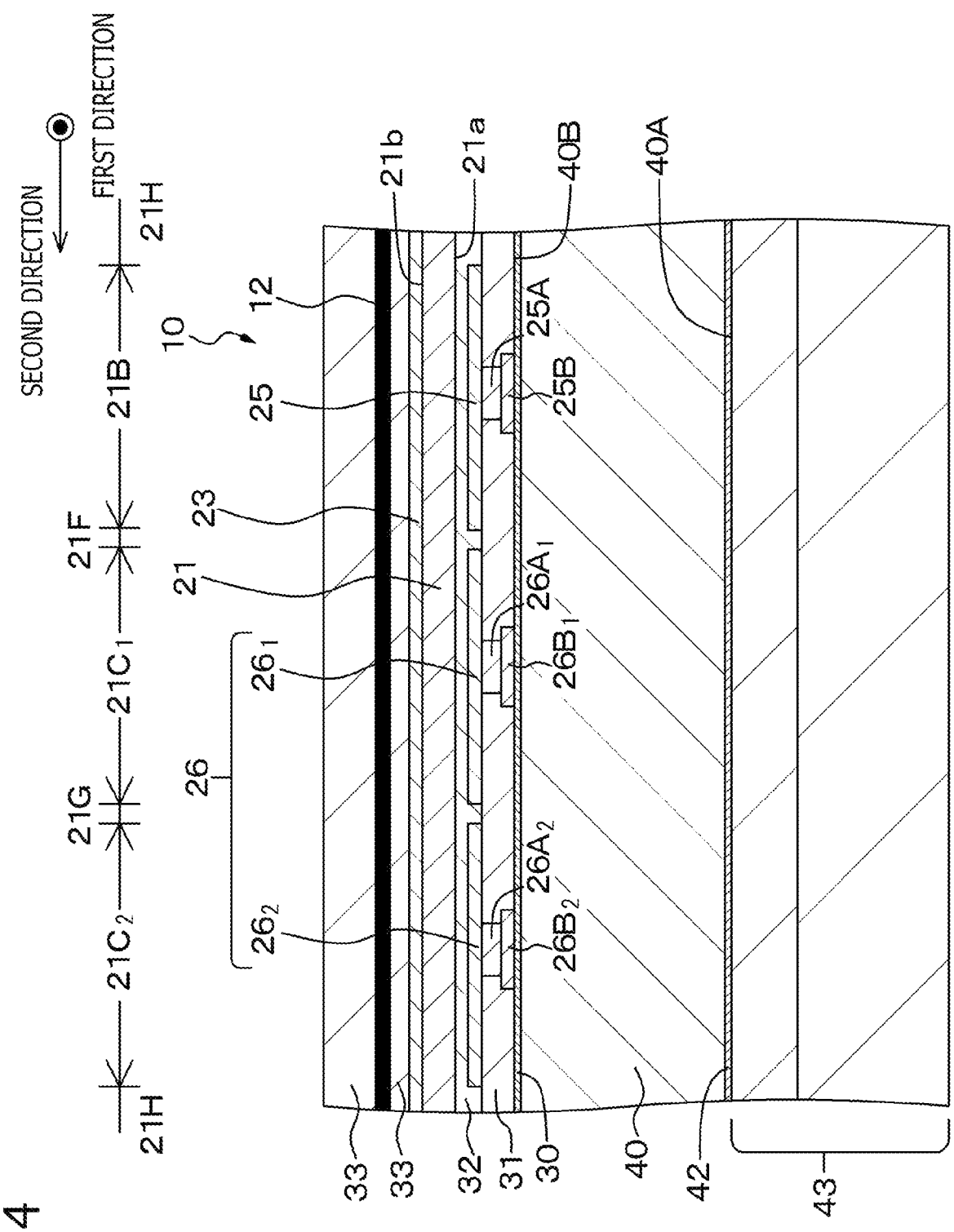
FIG. 4 is a partial cross-sectional diagram schematically depicting the imaging element constituting the solid-state imaging device of Embodiment 1 and taken along arrows B-B in FIG. 1.
Figure 5:
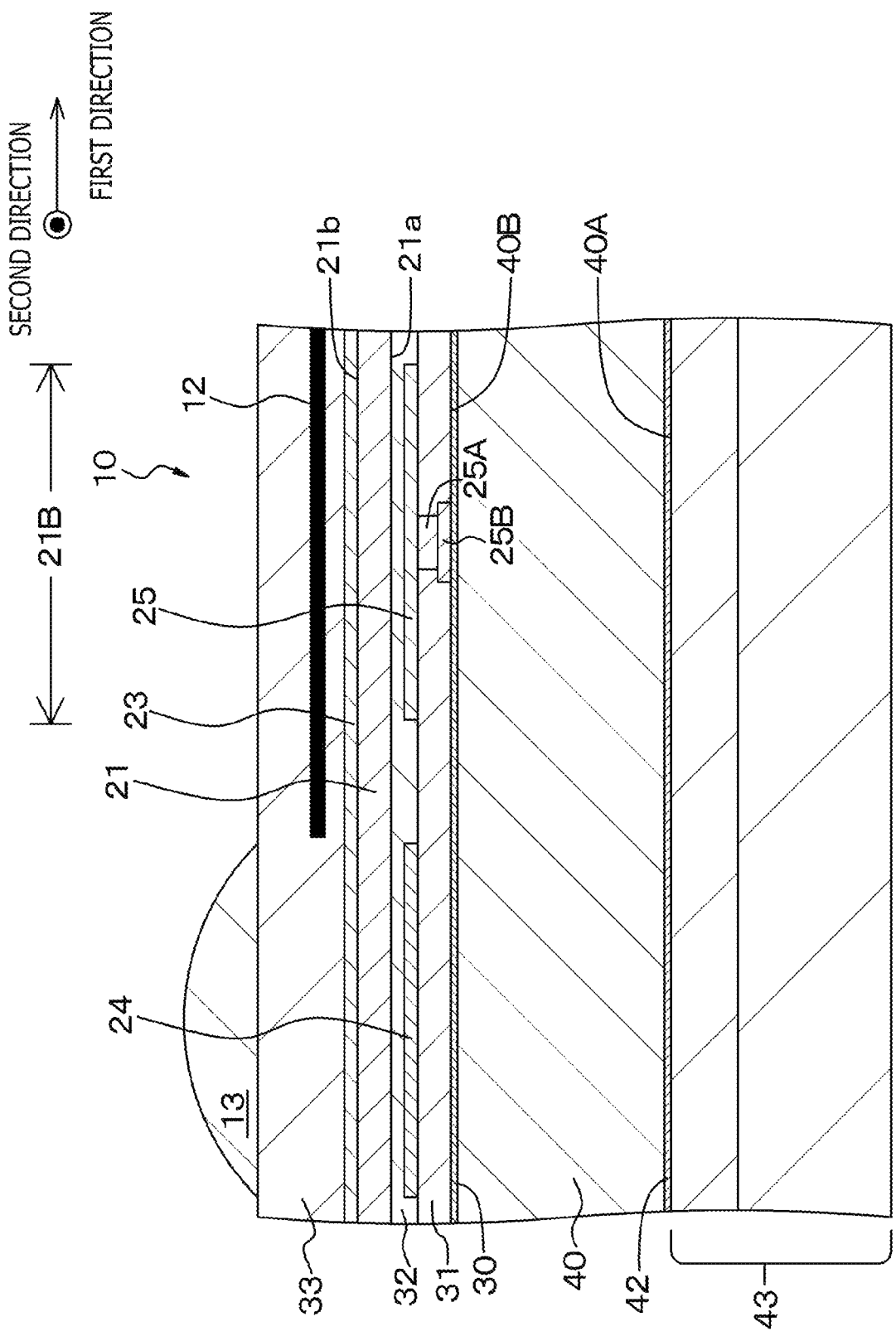
FIG. 5 is a partial cross-sectional diagram schematically depicting the imaging element constituting the solid-state imaging device of Embodiment 1 and taken along arrows C-C in FIG. 1.
Figure 6:
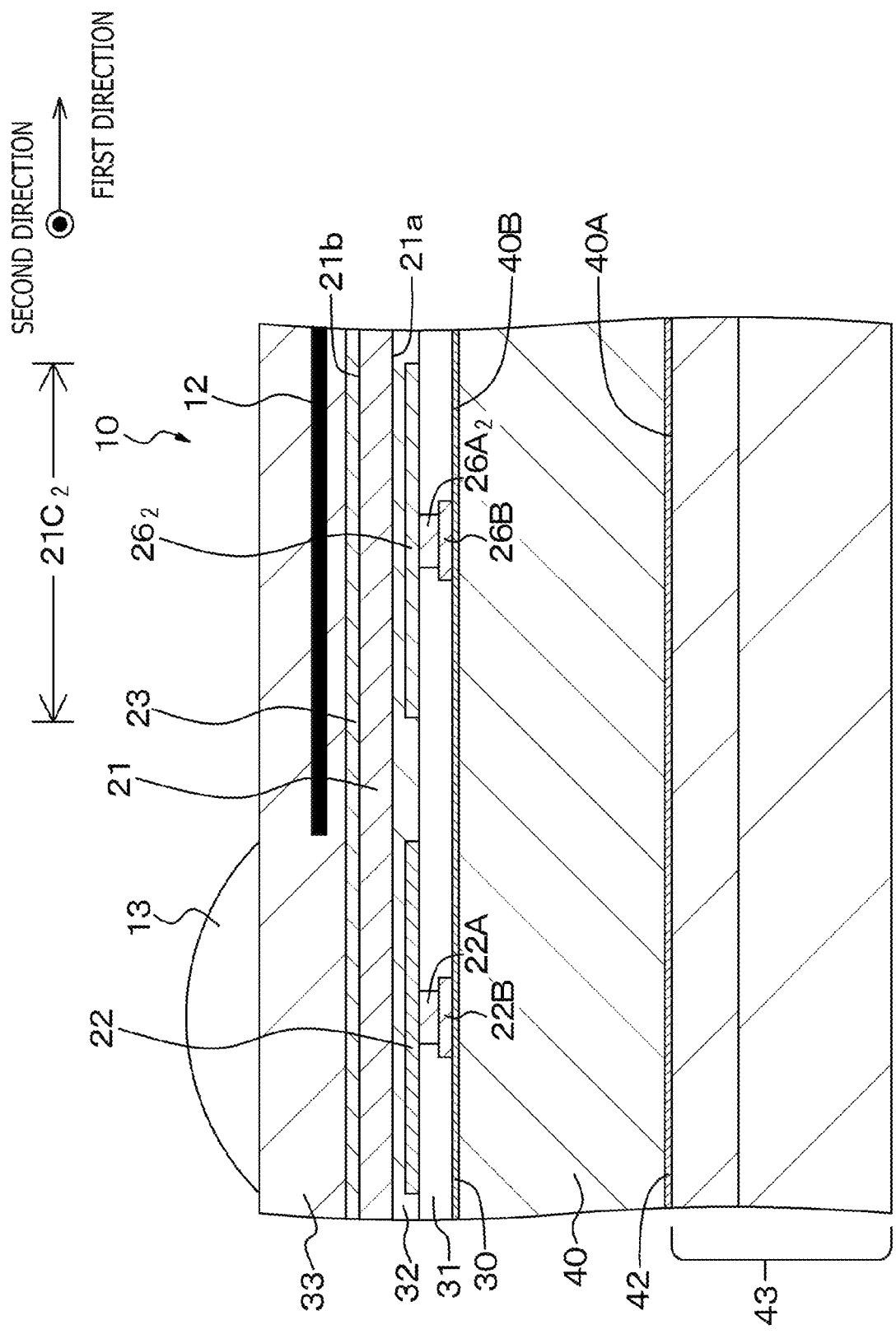
FIG. 6 is a partial end surface diagram schematically depicting the imaging element constituting the solid-state imaging device of Embodiment 1 and taken along arrows D-D in FIG. 1.
Figure 7:
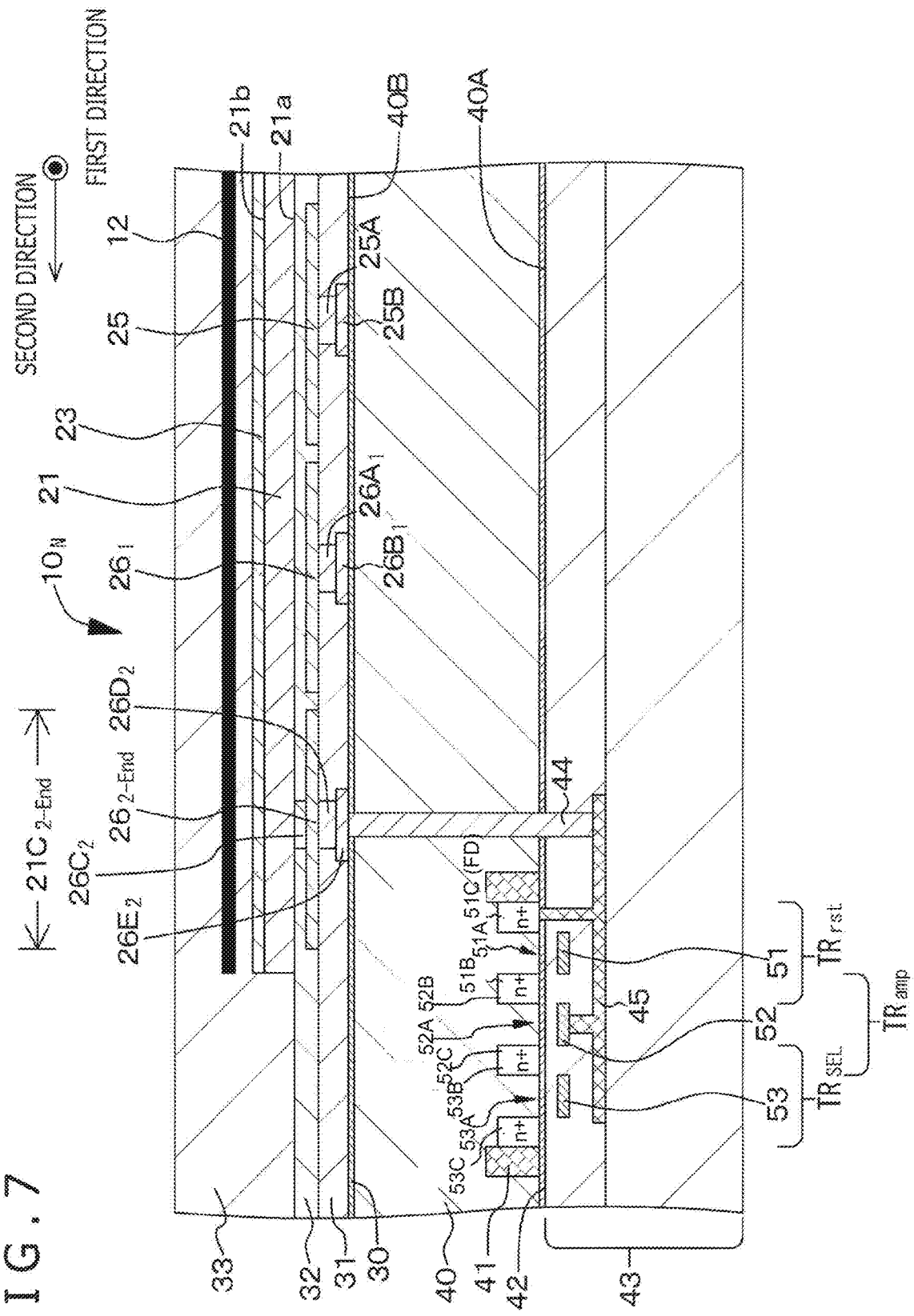
FIG. 7 is a partial cross-sectional diagram schematically depicting the imaging element located at an end of the N imaging elements arranged in a second direction in the solid-state imaging device of Embodiment 1 and similarly taken along the arrows B-B in FIG. 1.

Embodiment 1 relates to a solid-state imaging device of the present disclosure and an imaging method of the present disclosure. FIG. 1 schematically depicts an arrangement of a charge discharge electrode, a reset electrode, a charge accumulation electrode, a first charge transfer control electrode, and a second charge transfer control electrode included in each of imaging elements constituting the solid-state imaging device of Embodiment 1. FIG. 2 schematically depicts an arrangement of the charge discharge electrode, the reset electrode, the charge accumulation electrode, and a light shielding layer. Moreover, FIGS. 3, 4, 5, and 6 are partial cross-sectional diagrams each schematically depicting the imaging element constituting the solid-state imaging device of Embodiment 1 and taken along arrows A-A, arrows B-B, arrows C-C, and arrows D-D, respectively. Further, FIG. 7 is a partial cross-sectional diagram schematically depicting an imaging element located at an end of N imaging elements included in the solid-state imaging device of Embodiment 1 and arranged in a second direction and taken along the arrows B-B similarly to FIG. 1. In addition, FIG. 8 is an equivalent circuit diagram of the imaging element constituting the solid-state imaging device of Embodiment 1, while FIGS. 9 and 10 each schematically depict a charge accumulation state of the respective imaging elements of the solid-state imaging device of Embodiment 1 during operation in a case where the solid-state imaging device of Embodiment 1 is used as a TDI line sensor. Besides, FIGS. 11A, 11B, 12, 13A, 13B, 14A, 14B, 15A, 15B, 16A, and 16B each schematically depict a potential state and the like at respective parts of the imaging element constituting the solid-state imaging device of Embodiment 1 during operation. FIGS. 1, 2, 17, 20, 28, 35, 36, 37, 38, 39, and 40 each depict 2×2 imaging elements. Each of the imaging elements is surrounded by a dotted line.

The solid-state imaging device of Embodiment 1 includes an imaging element array that includes M (M≥2) imaging elements 10 arranged in a first direction and N (N≥2) imaging elements 10 arranged in a second direction different from the first direction, i.e., M×N imaging elements in total, each of the imaging elements 10 including a photoelectric conversion unit that includes
a photoelectric conversion layer 21,
an insulation layer 32 formed in contact with a first surface 21a of the photoelectric conversion layer 21,
a charge discharge electrode 22 formed in contact with the first surface 21a of the photoelectric conversion layer 21,
an upper electrode 23 formed in contact with a second surface 21b that faces the first surface 21a of the photoelectric conversion layer 21, and receiving incident light, and
a charge accumulation electrode 24 facing the first surface 21a of the photoelectric conversion layer 21 via the insulation layer 32 and disposed away from the charge discharge electrode 22.

The photoelectric conversion layer 21 is provided as a common layer at least for the N imaging elements 10 arranged in the second direction and constituting the imaging element array.

Moreover, the photoelectric conversion unit of each of the imaging elements 10 further includes
a first charge transfer control electrode 25 and a second charge transfer control electrode 26 so disposed as to face the first surface 21a of the photoelectric conversion layer 21 via the insulation layer 32, and disposed away from the charge discharge electrode 22 and the charge accumulation electrode 24, and
a light shielding layer 12.

The photoelectric conversion layer 21 includes a photoelectric conversion layer-first region 21A so located as to face the charge accumulation electrode 24, a photoelectric conversion layer-second region 21B so located as to face the first charge transfer control electrode 25, and a photoelectric conversion layer-third region 21C so located as to face the second charge transfer control electrode 26.

The light shielding layer 12 covers at least the photoelectric conversion layer-second region 21B and the photoelectric conversion layer-third region 21C.

The solid-state imaging device of Embodiment 1 here includes a time delay integration line sensor (TDI sensor).

Further, according to the solid-state imaging device of Embodiment 1, charges accumulated in the photoelectric conversion layer-first region 21A of each of the imaging elements 10 are transferred (transported) to the photoelectric conversion layer-second region 21B. This transfer of charges is achieved according to a state of a potential of the photoelectric conversion layer 21 formed by the charge accumulation electrode 24 and the first charge transfer control electrode 25.

Moreover, the first charge transfer control electrode 25 and the second charge transfer control electrode 26 are disposed along an imaging element boundary region 11 extending in the second direction. Further, the first charge transfer control electrode 25 and the second charge transfer control electrode 26 in each of the N imaging elements 10 arranged in the second direction are alternately disposed in a belt shape. Besides, charges accumulated in the photoelectric conversion layer-second region 21B included in the nth (n: any positive integer ranging from 1 to (N−1)) imaging element 10$_n$ of the N imaging elements 10 arranged in the second direction are transferred (transported) to the photoelectric conversion layer-second region 21B included in the (n+1)th imaging element 10$_{(n+1)}$ according to an operation of the second charge transfer control electrode 26 located between the nth imaging element 10$_n$ and the (n+1)th imaging element 10$_{(n+1)}$ after charges accumulated in the photoelectric conversion layer-first region 21A of the nth imaging element 10 are transferred (transported) to the photoelectric conversion layer-second region 21B. The second charge transfer control electrode 26 includes at least a second-A charge transfer control electrode 26$_1$ and a second-B charge transfer control electrode 26$_2$ (specifically, the second charge transfer control electrode includes the second-A charge transfer control electrode 26$_1$ and the second-B charge transfer control electrode 26$_2$). A photoelectric conversion layer-third region 21C$_1$ is so located as to face the second-A charge transfer control electrode 26$_1$, while a photoelectric conversion layer-third region 21C$_2$ is so located as to face the second-B charge transfer control electrode 26$_2$. In addition, the second charge transfer control electrode 26 (26$_1$ and 26$_2$) constituting the nth imaging element 10 is disposed between the first charge transfer control electrode 25 constituting the nth imaging element 10 and the first charge transfer control electrode 25 constituting the (n+1)th imaging element 10 in each of the N imaging elements 10 arranged in the second direction.

Moreover, the photoelectric conversion unit further includes a reset electrode 27 so disposed as to face the first surface 21a of the photoelectric conversion layer 21 via the insulation layer 32 and intervene between the charge discharge electrode 22 and the charge accumulation electrode 24 and in a position away from the charge discharge electrode 22 and the charge accumulation electrode 24. Further, charges remaining in the photoelectric conversion layer-first region 21A are discharged to the outside of the system by an operation of the charge discharge electrode 22 according to an operation of the reset electrode 27 after charges are transferred (transported) to the photoelectric conversion layer-second region 21B. In such a manner, charges remaining in the photoelectric conversion layer-first region 21A are discharged to the outside of the system by the operation of the charge discharge electrode 22 according to the operation of the reset electrode 27. As a result, complete depletion of the photoelectric conversion layer-first region 21A is achievable.

According to the solid-state imaging device of Embodiment 1, M=8192, and N=64 are assumed. However, the respective numbers are not limited to these values. The first direction and the second direction cross each other at right angles. The photoelectric conversion layer 21 is provided as a common layer at least for the N imaging elements 10 arranged in the second direction and constituting the imaging element array. Specifically, for example, the photoelectric conversion layer 21 is provided as a common layer for the M×N imaging elements 10. Specifically, the light shielding layer 12 covers (A) the photoelectric conversion layer-second region 21B and the photoelectric conversion layer-third region 21C (21C$_1$ and 21C$_2$)

(D) a photoelectric conversion layer-sixth region 21F located between the photoelectric conversion layer-second region 21B and the photoelectric conversion layer-third region 21C (specifically, photoelectric conversion layer 21C$_1$) alternately arranged in a belt shape, (E) a photoelectric conversion layer-seventh region 21G located between a region of a photoelectric conversion layer so disposed as to face the second-A charge transfer control electrode 26$_1$ and a region of a photoelectric conversion layer so disposed as to face the second-B charge transfer control electrode 26$_2$, and (F) a photoelectric conversion layer-eighth region 21H extending from the photoelectric conversion layer-second region 21B and the photoelectric conversion layer-third region 21C, and disposed between the adjoining imaging elements. Further, an on-chip microlens 13 is provided in a region of a protection material layer 33 on the photoelectric conversion layer-first region 21A. The first charge transfer control electrode 25 and the like except for the upper electrode 23 are formed on an interlayer insulation layer 31 provided on the semiconductor substrate.

Specifically, the imaging element of Embodiment 1 is a first type imaging element, and also a back-illuminated imaging element. More specifically, the solid-state imaging device of Embodiment 1 has a structure including a first type green light imaging element (first imaging element) including a green light photoelectric conversion layer for absorbing green light (light in a range from 495 to 570 nm), a first type blue light imaging element (second imaging element) including a blue light photoelectric conversion layer for absorbing blue light (light in a range from 425 to 495 nm), and a first type red light imaging element (third imaging element) including a red light photoelectric conversion layer for absorbing red light (light in a range from 620 to 750 nm). These imaging elements are arranged on a flat surface. The first imaging element, the second imaging element, and the third imaging element constitute one pixel. The plurality of these imaging elements is arranged in Bayer array, for example. Color filter layers for separating blue light, green light, and red light may be provided on the light entrance side of the respective imaging elements as necessary. Examples of the arrangement of the imaging elements of the solid-state imaging device of Embodiment 1 described above include interline array, G-stripe RB checkered array, G-stripe RB complete checkered array, checkered complementary color array, stripe array, oblique stripe array, primary color chrominance array, field chrominance sequence array, frame chrominance sequence array, MOS type array, improved MOS type array, frame interleave array, and field interleave array, as well as Bayer array.

The color filters (wavelength selection means) to be adopted are not limited to color filter layers for red, green, and blue, but also filter layers for transmitting light having particular wavelengths such as cyan, magenta, and yellow depending on situations. The color filter layers can include not only organic material color filter layers using organic compounds such as pigments and dyes, but also photonic crystals, wavelength selection elements utilizing plasmon (color filter layers having a conductor grid structure where a grid-shaped hole structure is formed in a conductor thin film, e.g., see Japanese Patent Laid-Open No. 2008-177191), and thin films each including inorganic material such as amorphous silicon.

For example, the photoelectric conversion layer 21 includes a layer containing a known organic photoelectric conversion material having sensitivity to green light (e.g., organic material such as rhodamine dye, merocyanine dye, and quinacridone). Each of the interlayer insulation layer 31, the insulation layer 32, and the protection material layer 33 includes a known insulation material (e.g., $SiO_2$ and SiN). The photoelectric conversion layer 21 may also have a stack structure including a lower semiconductor layer and an upper photoelectric conversion layer. Recombination during accumulation of charges is avoidable by providing the lower semiconductor layer in such a manner. Accordingly, transfer (transportation) efficiency of charges accumulated in the photoelectric conversion layer to the photoelectric conversion layer-second region can be raised, and generation of dark currents can be reduced. Examples of the material constituting the lower semiconductor layer include IGZO (indium-gallium-zinc oxide produced by adding indium and gallium to zinc oxide as dopants).

The pixel region of the solid-state imaging device of Embodiment 1 includes the imaging elements regularly arranged in a two-dimensional array shape. The pixel region generally includes an effective pixel region where signal charges generated by actual light reception and photoelectric conversion are amplified and read to the driving circuit, and a black reference pixel region for outputting optical black as a reference for a black level (also called an optical black pixel region (OPB)). The black reference pixel region is generally arranged in an outer peripheral portion of the effective pixel region.

Further, according to the solid-state imaging device of Embodiment 1, as depicted in FIG. 7, the photoelectric conversion layer-third region 21C of the imaging elements $10_N$ located at the end of the N imaging elements arranged in the second direction (a photoelectric conversion layer-third region $21C_{2\text{-}End}$ in the example depicted in FIG. 7) is electrically connected to a floating diffusion layer FD via a connection portion $26C_2$ in contact with the photoelectric conversion layer-third region $21C_{2\text{-}End}$, and further via the second charge transfer control electrode 26 (specifically, second-B charge transfer control electrode $26_{2\text{-}End}$), a connection hole $26D_2$, a pad portion $26E_2$, and a contact hole portion 44. In addition, the floating diffusion layer FD is electrically connected to an analog/digital conversion circuit via a control unit, or electrically connected to a register circuit via the control unit.

Hereinafter described will be an operation of a solid-state imaging device of Embodiment 1 in a case where the solid-state imaging device of Embodiment 1 is used as a TDI line sensor.

FIGS. 9 and 10 each schematically depict charge accumulation states of respective imaging elements during operation of the solid-state imaging device of Embodiment 1 in this case. FIGS. 9 and 10 each depict 4×4 imaging elements. Subscripts "11 to 14, 21 to 24, 31 to 34, and 41 to 44" each given to the reference number "10" of the corresponding imaging element indicate numbers of the 16 imaging elements 10. A second digit of each of these numbers indicates a value "n," while a first digit indicates a value "m." In addition, each of "A, B, C, and D" given within a frame indicating the corresponding imaging element represents a charge obtained by imaging the same region of an object. Each of the subscripts indicates how many times the same region of the object is imaged, and how many times the charge is integrated. For example, "$B_3$" in (1-1) indicates that a charge of "B" is integrated three times for the image element of n=3. In the following description, "m" is set to 1, 2, 3, or 4, and "n" is set to 1, 2, 3, or 4 for convenience. In addition, it is assumed that the imaging element of n=4 is connected to the floating diffusion layer FD. These definitions are made only for a purpose of explanation.

In (1-1) in FIG. 9, respective charges "A, B, C, and D" are accumulated in the photoelectric conversion layer-first regions 21A of the four imaging elements 10, and then transferred to the first charge transfer control electrodes 25 constituting the respective imaging elements. As a result, the charge "D" is integrated once for the first charge transfer control electrode 25 of the imaging element $10_{(1,m)}$. The charge "C" is integrated twice for the first charge transfer control electrode 25 of the imaging element $10_{(2,m)}$. The charge "B" is integrated three times for the first charge transfer control electrode 25 of the imaging element $10_{(3,m)}$.

The charge "A" is integrated four times for the first charge transfer control electrode 25 of the imaging element $10_{(4,m)}$.

Subsequently, in (1-2) in FIG. 9, the charges remaining in the photoelectric conversion layer-first regions 21A of the imaging elements are discharged to the outside (i.e., reset).

Thereafter, in (1-3) in FIG. 9, the charges accumulated in the first charge transfer control electrodes 25 of the respective imaging elements are transferred to the adjoining first charge transfer control electrodes 25 in the second direction. As a result, no charge remains in the first charge transfer control electrode 25 of the imaging element $10_{(1,m)}$. The charge "D" integrated once is present in the first charge transfer control electrode 25 of the imaging element $10_{(2,m)}$. The charge "C" integrated twice is present in the first charge transfer control electrode 25 of the imaging element $10_{(3,m)}$. The charge "B" integrated three times is present in the first charge transfer control electrode 25 of the imaging element $10_{(4,m)}$. On the other hand, the charge "A" integrated four times is transported to the floating diffusion layer FD, and sent to the analog/digital conversion circuit or the register circuit. Note that the floating diffusion layer FD is reset before this step. In addition, the charge remaining in the first charge transfer control electrode 25 of the imaging element $10_{(1,m)}$ is discharged to the outside via the photoelectric conversion layer-first region 21A (i.e., reset).

In (2-1) in FIG. 9, respective charges "B, C, D, and E" are accumulated the in photoelectric conversion layer-first regions 21A of the four imaging elements 10, and then transferred to the first charge transfer control electrodes 25 constituting the respective imaging elements. As a result, the charge "E" is integrated once for the first charge transfer control electrode 25 of the imaging element $10_{(1,m)}$. The charge "D" is integrated twice for the first charge transfer control electrode 25 of the imaging element $10_{(2,m)}$. The charge "C" is integrated three times for the first charge transfer control electrode 25 of the imaging element $10_{(3,m)}$. The charge "B" is integrated four times for the first charge transfer control electrode 25 of the imaging element $10_{(4,m)}$.

Subsequently, in (2-2) in FIG. 9, the charges remaining in the photoelectric conversion layer-first regions 21A of the imaging elements are discharged to the outside (i.e., reset).

Thereafter, in (2-3) in FIG. 9, the charges accumulated in the first charge transfer control electrodes 25 of the imaging elements are transferred to the first charge transfer control electrodes 25 of the adjoining imaging elements in the second direction. As a result, no charge remains in the first charge transfer control electrode 25 of the imaging element $10_{(1,m)}$. The charge "E" integrated once is present in the first charge transfer control electrode 25 of the imaging element $10_{(2,m)}$. The charge "D" integrated twice is present in the first charge transfer control electrode 25 of the imaging element $10_{(3,m)}$. The charge "C" integrated three times is present in the first charge transfer control electrode 25 of the imaging element $10_{(4,m)}$. On the other hand, the charge "B" integrated four times is transported to the floating diffusion layer FD, and sent to the analog/digital conversion circuit or the register circuit. Note that the floating diffusion layer FD is reset before this step. In addition, the charge remaining in the first charge transfer control electrode 25 of the imaging element $10_{(1,m)}$ is discharged to the outside via the photoelectric conversion layer-first region 21A (i.e., reset).

In (3-1) in FIG. 9, respective charges "C, D, E, and F" are accumulated the in photoelectric conversion layer-first regions 21A of the four imaging elements 10, and then transferred to the first charge transfer control electrodes 25 constituting the respective imaging elements. As a result, the charge "F" is integrated once for the first charge transfer control electrode 25 of the imaging element $10_{(1,m)}$. The charge "E" is integrated twice for the first charge transfer control electrode 25 of the imaging element $10_{(2,m)}$. The charge "D" is integrated three times for the first charge transfer control electrode 25 of the imaging element $10_{(3,m)}$. The charge "C" is integrated four times for the first charge transfer control electrode 25 of the imaging element $10_{(4,m)}$.

Subsequently, in (3-2) in FIG. 10, the charges remaining in the photoelectric conversion layer-first regions 21A of the imaging elements are discharged to the outside (i.e., reset).

Thereafter, in (3-3) in FIG. 10, the charges accumulated in the first charge transfer control electrodes 25 are transferred to the first charge transfer control electrodes 25 of the adjoining imaging elements in the second direction. As a result, no charge remains in the first charge transfer control electrode 25 of the imaging element $10_{(1,m)}$. The charge "F" integrated once is present in the first charge transfer control electrode 25 of the imaging element $10_{(2,m)}$. The charge "E" integrated twice is present in the first charge transfer control electrode 25 of the imaging element $10_{(3,m)}$. The charge "D" integrated three times is present in the first charge transfer control electrode 25 of the imaging element $10_{(4,m)}$. On the other hand, the charge "C" integrated four times is transported to the floating diffusion layer FD, and sent to the analog/digital conversion circuit or the register circuit. Note that the floating diffusion layer FD is reset before this step. In addition, the charge remaining in the first charge transfer control electrode 25 of the imaging element $10_{(1,m)}$ is discharged to the outside via the photoelectric conversion layer-first region 21A (i.e., reset).

In (4-1) in FIG. 10, respective charges "C, D, E, and F" are accumulated the in photoelectric conversion layer-first regions 21A of the four imaging elements 10, and then transferred to the first charge transfer control electrodes 25 constituting the respective imaging elements. As a result, the charge "G" is integrated once for the first charge transfer control electrode 25 of the imaging element $10_{(1,m)}$. The charge "F" is integrated twice for the first charge transfer control electrode 25 of the imaging element $10_{(2,m)}$. The charge "E" is integrated three times for the first charge transfer control electrode 25 of the imaging element $10_{(3,m)}$. The charge "D" is integrated four times for the first charge transfer control electrode 25 of the imaging element $10_{(4,m)}$.

Subsequently, in (4-2) in FIG. 10, the charges remaining in the photoelectric conversion layer-first regions 21A of the imaging elements are discharged to the outside (i.e., reset).

Thereafter, in (4-3) in FIG. 10, the charges accumulated in the first charge transfer control electrodes 25 of the imaging elements are transferred to the first charge transfer control electrodes 25 of the adjoining imaging elements in the second direction. As a result, no charge remains in the first charge transfer control electrode 25 of the imaging element $10_{(1,m)}$. The charge "G" integrated once is present in the first charge transfer control electrode 25 of the imaging element $10_{(2,m)}$. The charge "F" integrated twice is present in the first charge transfer control electrode 25 of the imaging element $10_{(3,m)}$. The charge "E" integrated three times is present in the first charge transfer control electrode 25 of the imaging element $10_{(4,m)}$. On the other hand, the charge "D" integrated four times is transported to the floating diffusion layer FD, and sent to the analog/digital conversion circuit or the register circuit. Note that the floating diffusion layer FD is reset before this step. In addition, the charge remaining in the first charge transfer control electrode 25 of the imaging element $10_{(1,m)}$ is discharged to the outside via the photoelectric conversion layer-first region 21A (i.e., reset).

Thereafter, the operations of the imaging elements as described above are repeated.

Operations of the imaging elements constituting the solid-state imaging device of Embodiment 1 will next be described with reference to FIGS. 11A, 11B, 12, 13A, 13B, 14A, 14B, 15A, 15B, 16A, and 16B each schematically depicting a potential state and the like at respective parts of each of the imaging elements of Embodiment 1 during operation. Note that charges to be read are electrons in the following description. In a case where charges to be read are holes, it is only required to reverse the potential state and the like.

An operation of the nth imaging element $10_n$ included in the N imaging elements 10 arranged in the second direction will be solely described hereinafter. In these figures, the "charge discharge electrode," the "reset electrode," the "charge accumulation electrode," the "first charge transfer control electrode," the "2-A charge transfer control electrode," and the "2-B charge transfer control electrode" each indicate an electrode constituting the nth imaging element $10_n$, while the "subsequent first charge transfer control electrode" and the "subsequent second-A charge transfer control electrode" each indicate an electrode constituting the (n+1)th imaging element $10_{(n+1)}$. In addition, a vertical axis represents a potential. A positive potential becomes higher as a value on the vertical axis decreases because charges are electrons. States of charges described above the respective electrodes indicate accumulation and transfer (transportation) states of charges in respective regions of the photoelectric conversion layer. A charge (electron) is represented in a conceptual manner using a black circle and hatching. The charges "A" and "E" each represent electrons transferred from a region of the photoelectric conversion layer of the (n−1)th imaging element $10_{(n-1)}$ to a region of the photoelectric conversion layer of the nth imaging element $10_n$. The charge "B" represents electrons accumulated or handled in other manners in the region of the photoelectric conversion layer in the nth imaging element $10_n$. The charge "C" represents electrons transferred from the region of the photoelectric conversion layer of the nth imaging element $10_n$ to a region of the photoelectric conversion layer of the (n+1)th imaging element $10_{(n+1)}$. The charge "D" represents electrons accumulated or handled in other manners in the region of the photoelectric conversion layer of the (n+1)th imaging element $10_{(n+1)}$.

In addition, Table 1 presented below indicates signs representing potentials applied to the respective types of electrodes.

TABLE 1

|  | Charge Accumulation Period | Charge transfer period |
| --- | --- | --- |
| First charge transfer control electrode | $V_{11}$ | $V_{12}$ |
| Upper electrode | $V_{21}$ | $V_{22}$ |
| Charge accumulation electrode | $V_{31}$ | $V_{32}$ |
| Reset electrode | $V_{41}$ | $V_{42}$ |
| Charge transfer control electrode | $V_{51}$ | $V_{52}$ |

[Step-100]

Figure 11A:
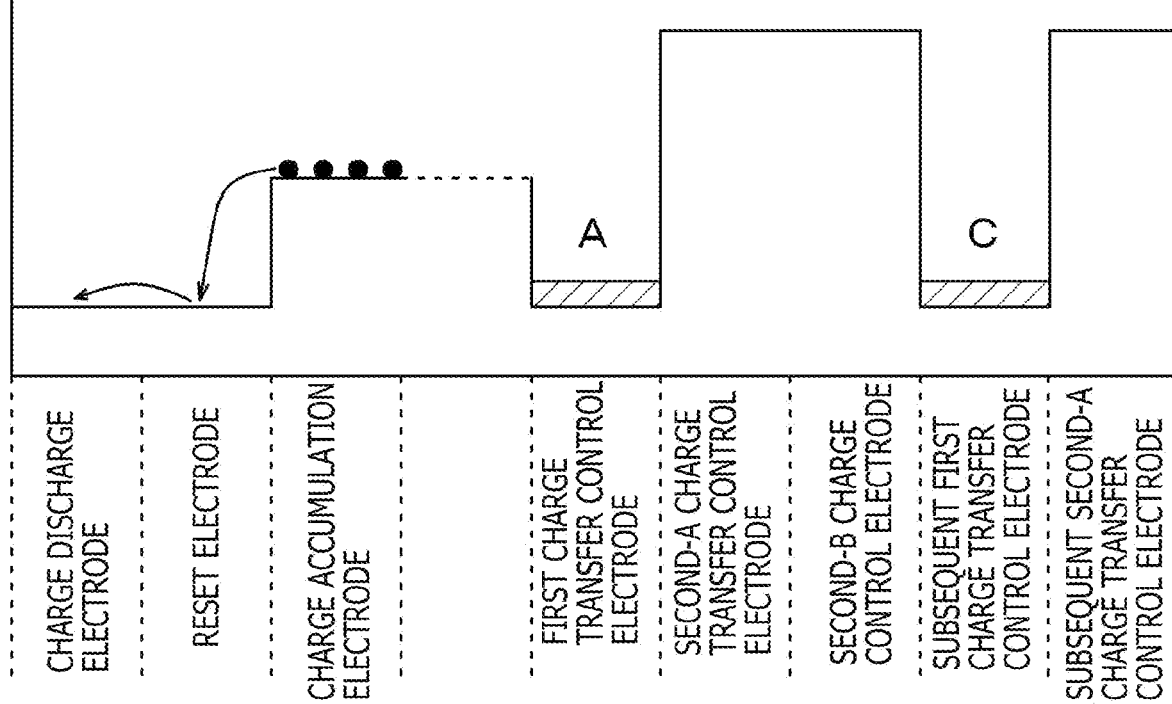
FIGS. 11A and 11B are diagrams each schematically depicting a potential state and the like at respective parts of the imaging element constituting the solid-state imaging device of Embodiment 1 during operation.
Figure 11B:
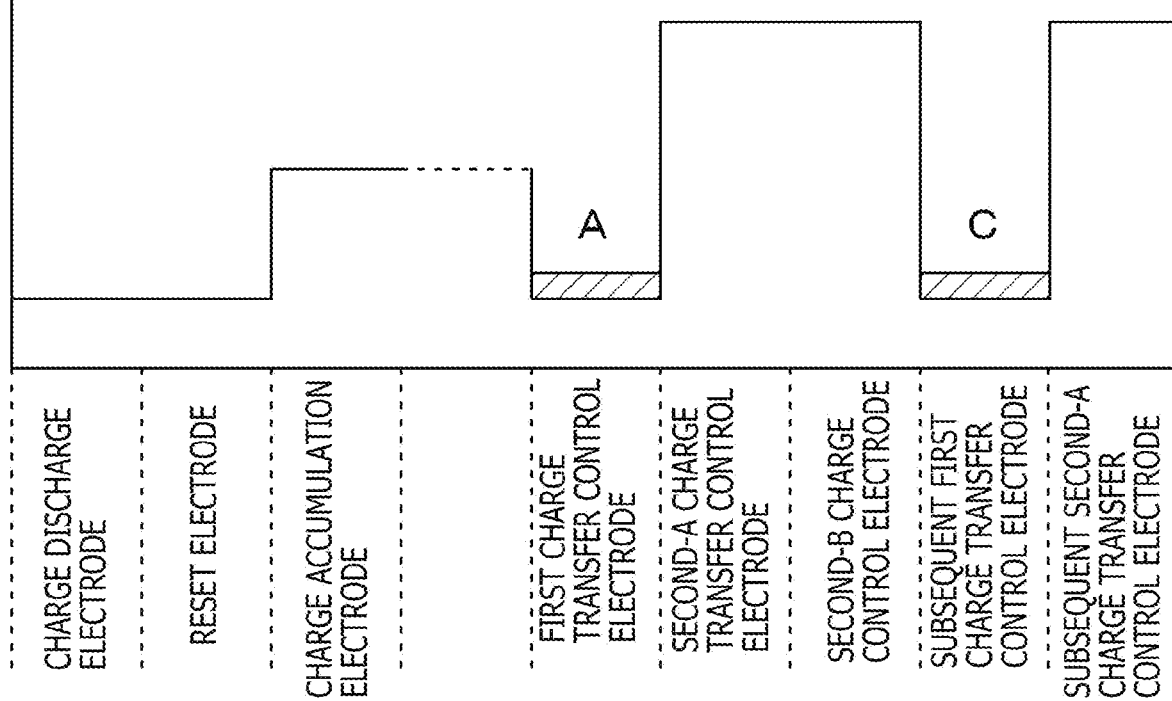

First, each of the imaging elements 10 discharges charges remaining in the photoelectric conversion layer-first regions 21A to the outside according to an operation of the charge discharge electrode 22. Specifically, as depicted in FIGS. 11A and 11B, the reset electrode 27 and the charge discharge electrode 22 are caused to discharge the charge remaining in the photoelectric conversion layer-first region 21A to the outside of the system. Note that no electrode is provided below each region indicated by a "dotted line" in each figure schematically depicting the potential state and the like at the respective portions during operation of the imaging element. For example, a barrier is formed by optimizing a distance between the charge accumulation electrode 24 and the first charge transfer control electrode 25. Accordingly, expression by the "dotted line" is given.

[Step-110]

Figure 12:
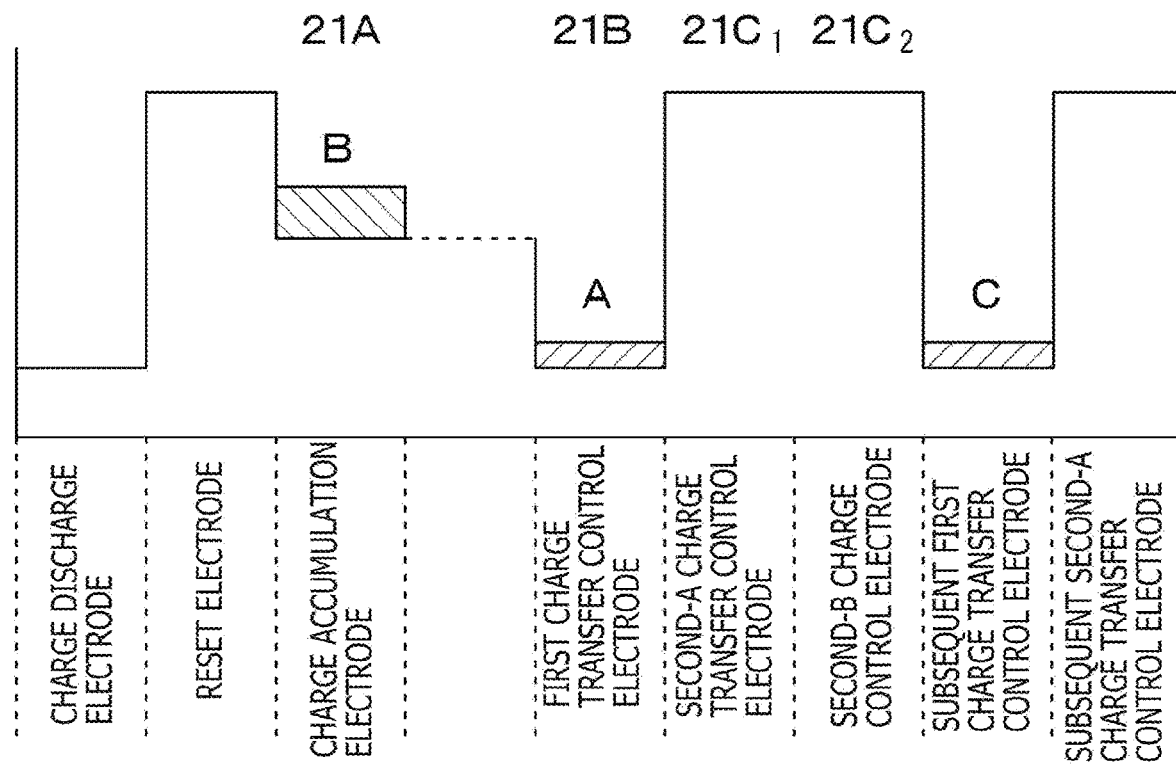
FIG. 12 is a diagram continuing from FIG. 11B and schematically depicting a potential state and the like at respective parts of the imaging element constituting the solid-state imaging device of Embodiment 1 during operation.

Subsequently, as depicted in FIG. 12, a high barrier is formed in a region of the photoelectric conversion layer facing the reset electrode 27 by application of a negative potential (specifically, potential of upper electrode 23<0 volt<potential of reset electrode 27<potential of charge accumulation electrode 24, for example) to the reset electrode 27. Thereafter, light is applied to the photoelectric conversion layer 21 of each of the imaging elements 10 with the voltage kept being applied to the upper electrode 23 and the charge accumulation electrode 24 to accumulate charges in the photoelectric conversion layer-first region 21A of each of the imaging elements 10 (charge accumulation period). Holes are discharged to the outside of the system via the upper electrode 23. Electrons are attracted to the charge accumulation electrode 24 and accumulated in the photoelectric conversion layer-first region 21A. The charge discharge electrode 22 may function as an overflow drain of the photoelectric conversion unit.

In the charge accumulation period herein, the driving circuit applies the potential $V_{11}$ to the first charge transfer control electrode 25, the potential $V_{11}$ to the charge accumulation electrode 24, and the potential $V_{41}$ to the reset electrode 27 to accumulate charges in the photoelectric conversion layer-first region 21A.

In the subsequent charge transfer period, the driving circuit applies the potential $V_{12}$ to the first charge transfer control electrode 25, the potential $V_{32}$ to the charge accumulation electrode 24, and the potential $V_{42}$ to the reset electrode 27 to read the charges accumulated in the photoelectric conversion layer-first region 21A to the control unit via the first charge transfer control electrode 25 and the second charge transfer control electrode 26.

In this case, $V_{21}<V_{31}$, $V_{41}<V_{31}$, $V_{31}<V_{11}$, $V_{22}<V_{32}$, $V_{42}<V_{32}$, and $V_{32}<V_{12}$ all hold.

[Step-120]

Figure 13A:
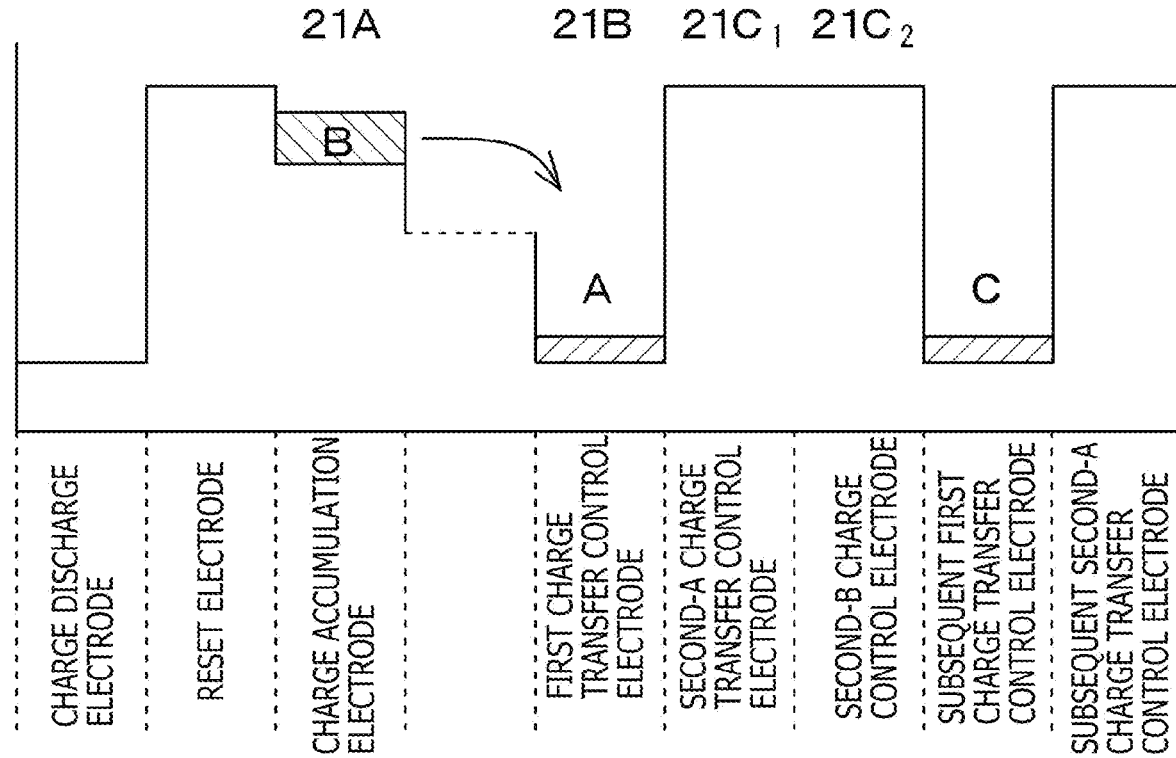
FIGS. 13A and 13B are diagrams continuing from FIG. 12 and schematically depicting a potential state and the like at respective parts of the imaging element constituting the solid-state imaging device of Embodiment 1 during operation.
Figure 13B:
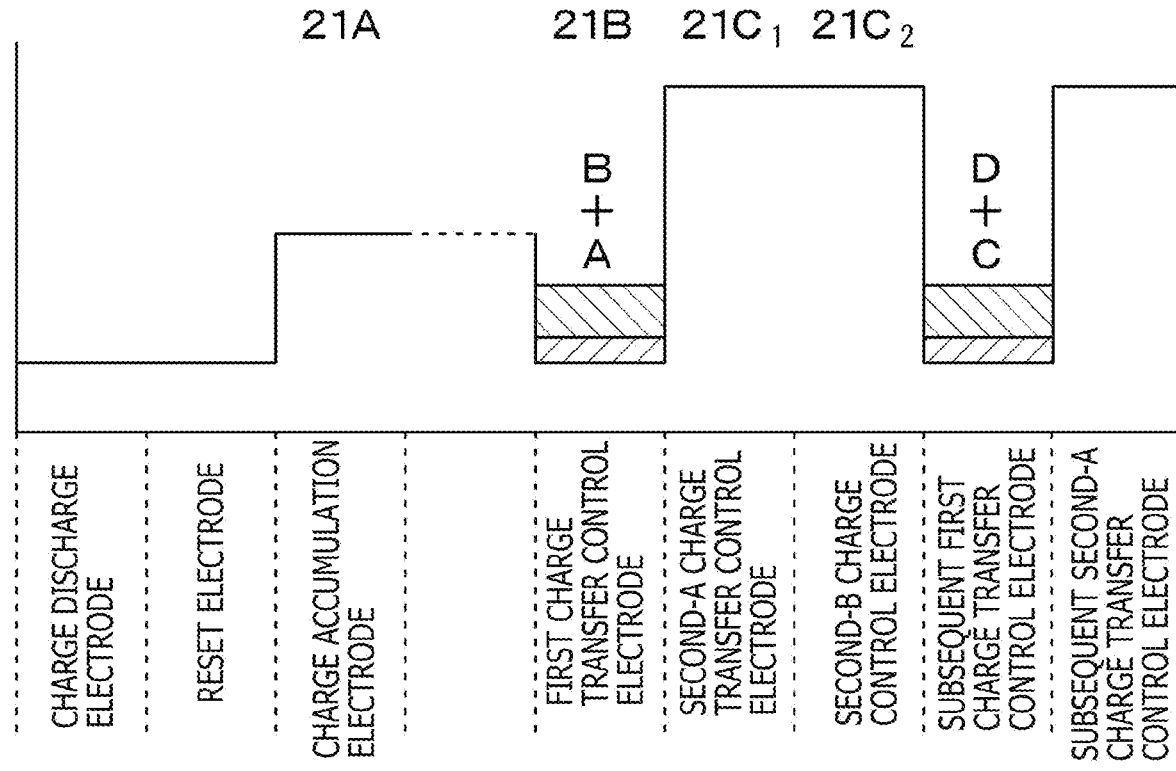

Thereafter, as depicted in FIGS. 13A and 13B, a potential on the negative side with respect to the potential applied in [step-110] (specifically, potential of upper electrode 23<0 volt<potential of reset electrode 27<potential of charge accumulation electrode 24<potential of first charge transfer control electrode 25) is applied to the charge accumulation electrode 24 to transfer the charges accumulated in the photoelectric conversion layer-first region 21A of each of the imaging elements 10 to the photoelectric conversion layer-second region 21B (charge transfer period) and accumulate the transferred charges in addition to the charges already accumulated in the photoelectric conversion layer-second region 21B. Specifically, the charges accumulated in the photoelectric conversion layer-first region 21A can be transferred to the photoelectric conversion layer-second region 21B by controlling the potentials of the charge accumulation electrode 24 and the first charge transfer control electrode 25. The charges accumulated in the photoelectric conversion layer-second region 21B are expressed as "B+A." The second-B charge transfer control electrode $26_2$ of the (n−1)th imaging element $10_{(n-1)}$ and the second-A charge transfer control electrode $26_1$ of the nth imaging element $10_n$ are controlled to prevent a flow of the charges into a region of the photoelectric conversion layer 21 facing these electrodes. The potential of the charge accumulation electrode 24 need not be changed in the state depicted in FIG. 13A depending on situations.

[Step-130]

Figure 14A:
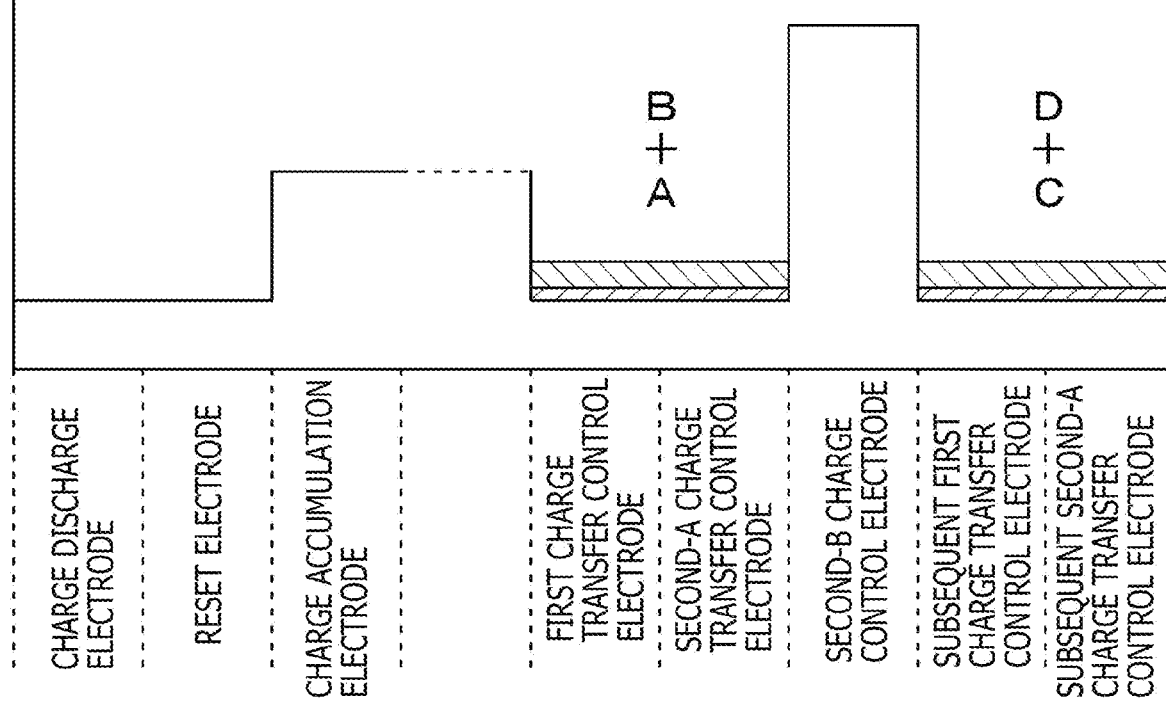
FIGS. 14A and 14B are diagrams continuing from FIG. 13B and schematically depicting a potential state and the like at respective parts of the imaging element constituting the solid-state imaging device of Embodiment 1 during operation.
Figure 14B:
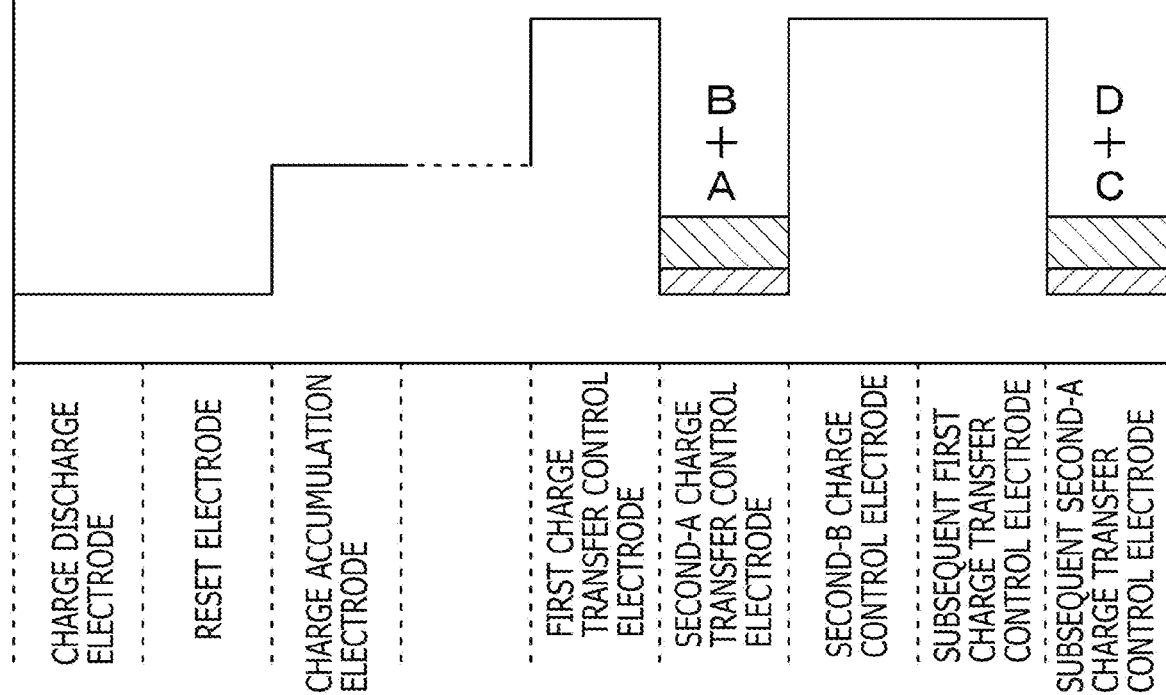

Subsequently, as depicted in FIGS. 14A and 14B, the charges "B+A" accumulated in the photoelectric conversion layer-second region 21B of the nth imaging element $10_n$ included in the N imaging elements 10 arranged in the second direction are transferred to the photoelectric conversion layer-second region 21B of the (n+1)th imaging element 10 according to an operation of the second charge transfer control electrode 26.

Specifically, the charges "B+A" accumulated in the first charge transfer control electrode 25 can be transferred to the second-A charge transfer control electrode $26_1$ by controlling the potentials of the first charge transfer control electrode 25 and the second-A charge transfer control electrode $26_1$.

[Step-140]

Subsequently, as depicted in FIGS. 15A and 15B, the charges "B+A" accumulated in the second-A charge transfer control electrode $26_1$ can be transferred to the second-B charge transfer control electrode $26_2$ by controlling the potentials of the second-A charge transfer control electrode $26_1$ and the second-B charge transfer control electrode $26_2$.

[Step-150]

Figure 16A:
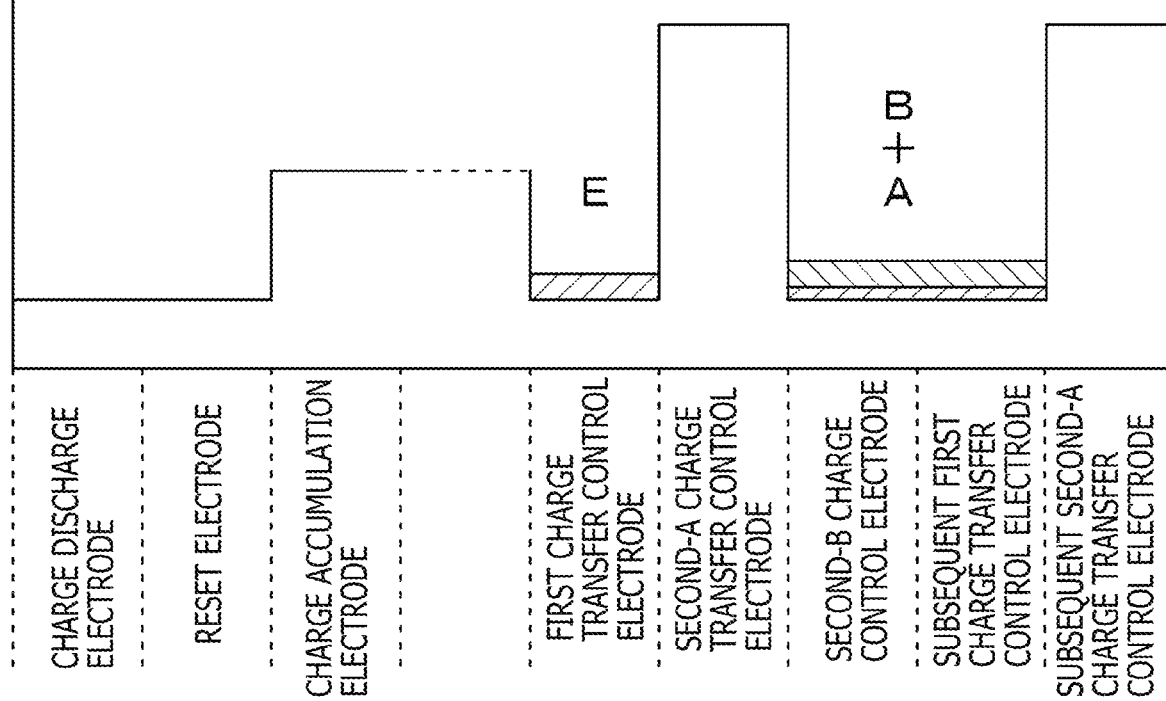
FIGS. 16A and 16B are diagrams continuing from FIG. 15B and schematically depicting a potential state and the like at respective parts of the imaging element constituting the solid-state imaging device of Embodiment 1 during operation.
Figure 16B:
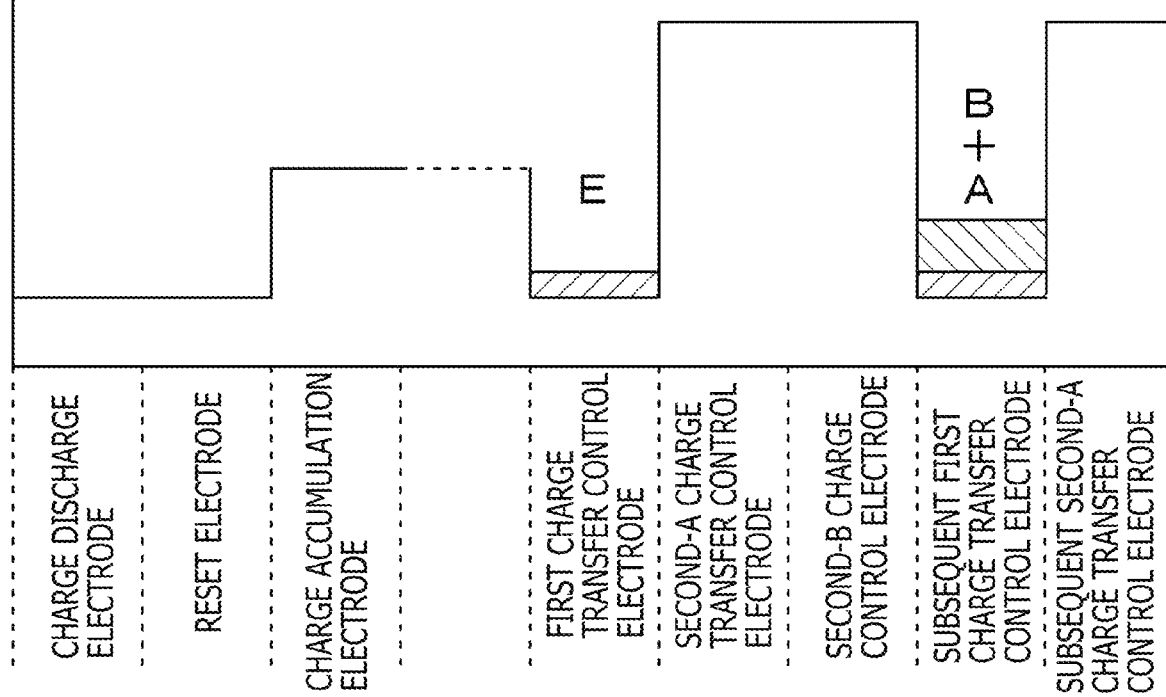

Thereafter, as depicted in FIGS. 16A and 16B, the charges "B+A" accumulated in the second-B charge transfer control electrode $26_2$ can be transferred to the first charge transfer control electrode 25 of the (n+1)th imaging element $10_{(n+1)}$ by controlling the potentials of the second-B charge transfer control electrode $26_2$ and the first charge transfer control electrode 25 of the (n+1)th imaging element $10_{(n+1)}$. Moreover, the charge "E" accumulated in the second-B charge transfer control electrode $26_2$ of the (n−1)th imaging element $10_{(n-1)}$ can be transferred to the first charge transfer control electrode 25 of the nth imaging element $10_n$ by controlling the potentials of the second-B charge transfer control electrode $26_2$ of the (n−1)th imaging element $10_{(n-1)}$ and the first charge transfer control electrode 25 of the nth imaging element $10_n$.

Thereafter, the operations of the imaging elements as described above are repeated.

Specifically, the imaging element 10 of Embodiment 1 further includes a semiconductor substrate (more specifically, silicon semiconductor layer) 40. The photoelectric conversion unit is disposed above the semiconductor substrate 40. In addition, the imaging element 10 further includes a control unit provided on the semiconductor substrate 40 and having a driving circuit to which various types of electrodes are connected. It is assumed here that a light entrance surface of the semiconductor substrate 40 is located on the upper side, and that the opposite side of the semiconductor substrate 40 is located on the lower side. A wiring layer 45 including a plurality of wires is provided below the semiconductor substrate 40.

At least a floating diffusion layer FD and an amplification transistor $TR_{amp}$ constituting the control unit are provided on the semiconductor substrate 40. A photoelectric conversion layer-third region $21c_{2-End}$ is connected to gate portions of the floating diffusion layer FD and the amplification transistor $TR_{amp}$. A reset transistor $TR_{rst}$ and a selection transistor $TR_{sel}$ are further provided on the semiconductor substrate 40. The floating diffusion layer FD is connected to one source/drain region of the reset transistor $TR_{rst}$. The other source/drain region of the amplification transistor $TR_{amp}$ is connected to one source/drain region of the selection transistor $TR_{sel}$. The other source/drain of the selection transistor $TR_{sel}$ is connected to a signal line VSL. The amplification transistor $TR_{amp}$, the reset transistor $TR_{rst}$, and the selection transistor $TR_{sel}$ described above constitute a driving circuit.

According to the imaging element 10 of Embodiment 1, the charge discharge electrode 22, the reset electrode 27, the charge accumulation electrode 24, the first charge transfer control electrode 25, and the second charge transfer control electrode 26 ($26_1$ and $26_2$) are formed away from each other on the interlayer insulation layer 31. These electrodes and the interlayer insulation layer 31 are covered by the insulation layer 32. The photoelectric conversion layer 21 is formed on the insulation layer 32. The upper electrode 23 is formed on the photoelectric conversion layer 21. The protection material layer 33 is provided on an entire surface including the upper electrode 23. The on-chip micro-lens 13 is provided on a part corresponding to the protection material layer 33 above the charge accumulation electrode 24. Moreover, the light shielding layer 12 is formed on the protection material layer 33.

The charge discharge electrode 22, the reset electrode 27, the charge accumulation electrode 24, the first charge transfer control electrode 25, and the second charge transfer control electrode 26 ($26_1$ and $26_2$) are connected to the driving circuit. In addition, the upper electrode 23 is connected to the driving circuit via a wire $V_{OU}$. Specifically, the charge discharge electrode 22 is connected to a vertical driving circuit 112 constituting the driving circuit via a connection hole 22A formed in the interlayer insulation layer 31, a pad portion 22B, and a not-depicted wire. The reset electrode 27 is connected to the vertical driving circuit 112 constituting the driving circuit via a connection hole 27A formed in the interlayer insulation layer 31, a pad portion 27B, and a not-depicted wire. The charge accumulation electrode 24 is connected to the vertical driving circuit 112 constituting the driving circuit via a connection hole 24A formed in the interlayer insulation layer 31 and a pad portion 24B. The first charge transfer control electrode 25 and the second charge transfer control electrode 26 ($26_1$ and $26_2$) are connected to the vertical driving circuit 112 constituting the driving circuit via connection holes 25A, $26A_1$, and $26A_2$ formed in the interlayer insulation layer 31, pad portions 25B, $26B_1$, and $26B_2$, and not-depicted wires.

For example, the upper electrode 23 includes a transparent electrode including ITO (work function: approximately 4.4 eV). Each of the charge discharge electrode 22, the reset electrode 27, the charge accumulation electrode 24, a charge transportation control electrode 28 to be described below, the first charge transfer control electrode 25, and the second charge transfer control electrode 26 ($26_1$ and $26_2$) may include either a transparent conductive material or a non-transparent metal material, for example.

An element separation region 41 is formed on the side of a first surface (front surface) 40A of the semiconductor substrate 40. In addition, an oxide film 42 is formed on the first surface 40A of the semiconductor substrate 40. Moreover, the reset transistor $TR_{rst}$, the amplification transistor $TR_{amp}$, and the selection transistor $TR_{sel}$ constituting the control unit of the imaging element and also the floating diffusion layer FD are provided on the first surface side of the semiconductor substrate 40.

The reset transistor $TR_{rst}$ includes a gate portion 51, a channel forming region 51A, and source/drain regions 51B and 51C. The gate portion 51 of the reset transistor $TR_{rst}$ is connected to a reset line RST. The source/drain region 51C constituting the one source/drain region of the reset transistor $TR_{rst}$ also functions as the first floating diffusion layer FD, while the source/drain region 51B constituting the other source/drain region is connected to a power source $V_{DD}$.

The photoelectric conversion layer-third region $21C_{2\text{-}End}$ is connected to the one source/drain region 51C (also functions as first floating diffusion layer FD) via a connection portion $26C_2$ in contact with the photoelectric conversion layer-third region $21C_{2\text{-}End}$, and further via a second-B charge transfer control electrode $26_{2\text{-}End}$, a connection hole $26D_2$, a pad portion $26E_2$, a contact hole portion 44, and a wiring layer 45.

The amplification transistor $TR_{amp}$ includes a gate portion 52, a channel forming region 52A, and source/drain regions 52B and 52C. The gate portion 52 is connected to the photoelectric conversion layer-third region $21C_{2\text{-}End}$ and the one source/drain region 51C (first floating diffusion layer FD) of the reset transistor $TR_{rst}$ via the wiring layer 45. Moreover, the one source/drain region 52B is connected to the power source $V_{DD}$, and shares a region with the other source/drain region 51B of the reset transistor $TR_{rst}$.

The selection transistor $TR_{sel}$ includes a gate portion 53, a channel forming region 53A, and source/drain regions 53B and 53C. The gate portion 53 is connected to a selection line SEL. Moreover, the one source/drain region 53B shares a region with the other source/drain region 52C constituting the amplification transistor $TR_{amp}$, while the other source/drain region 53C is connected to a signal line (data output line) VSL (117). Note that the signal line (data output line) VSL (117) specifically includes the first charge transfer control electrode 25 and the second charge transfer control electrode 26.

Operations performed by the amplification transistor $TR_{amp}$ and the selection transistor $TR_{sel}$ after transfer of charges to the floating diffusion layer FD (i.e., after reading of electrons) are the same as those operations performed by conventional transistors of these types. Moreover, reset noise of the floating diffusion layer FD can be removed by correlated double sampling (CDS, Correlated Double Sampling) processing in a manner similar to a conventional manner.

The reset line RST and the selection line SEL are connected to the vertical driving circuit 112 constituting the driving circuit, while the signal line (data output line) VSL is connected to corresponding one of column signal processing circuits 113 constituting the driving circuit.

Figure 41:
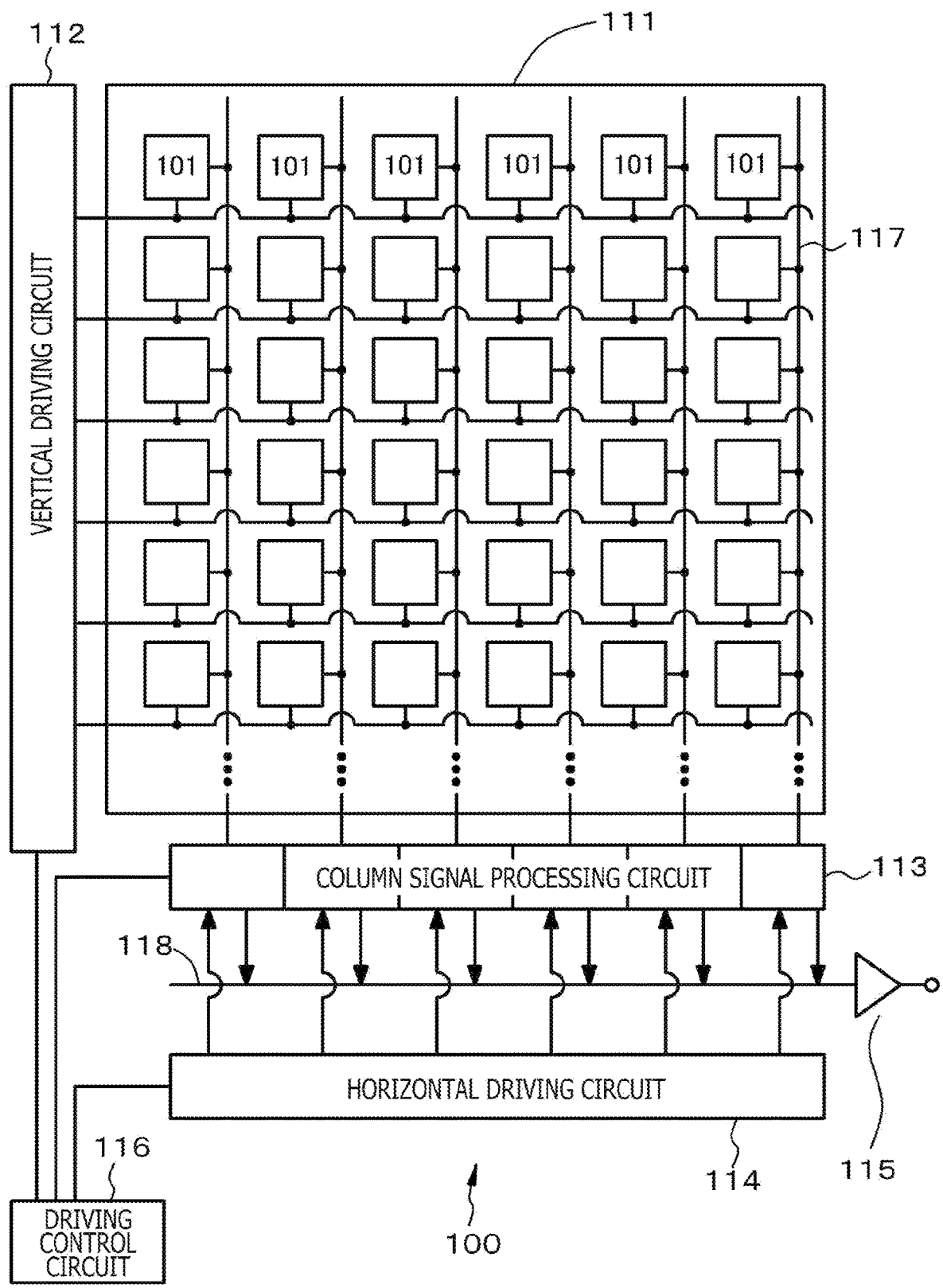
FIG. 41 is a conceptual diagram of the solid-state imaging device according to Embodiment 1.

FIG. 41 is a conceptual diagram of the solid-state imaging device according to Embodiment 1. A solid-state imaging device 100 of Embodiment 1 includes an imaging region 111 where imaging elements 101 are arranged in a two-dimensional array shape, and also includes, as driving circuits (peripheral circuits) of the imaging region 111, the vertical driving circuit 112, the column signal processing circuit 133 each including an analog/digital conversion circuit or a register circuit, a horizontal driving circuit 114, an output circuit 115, a driving control circuit 116, and others. Each of these circuits can include a known circuit or by using other circuit configurations (e.g., various circuits used for a CCD imaging device or a CMOS imaging device). In FIG. 41, an indication of the reference number "101" is given to only one row of the imaging elements 101.

The driving control circuit 116 generates a clock signal and a control signal indicating references for operations of the vertical driving circuit 112, the column signal processing circuits 113, and the horizontal driving circuit 114 on the basis of a vertical synchronized signal, a horizontal synchronized signal, and a master clock. Thereafter, the generated clock signal and control signal are input to the vertical driving circuit 112, the column signal processing circuit 113, and the horizontal driving circuit 114.

For example, the vertical driving circuit 112 includes a shift register, and selectively scans the respective imaging elements 101 in the imaging region 111 sequentially in the vertical direction for each row. Thereafter, a pixel signal (image signal) based on a current (signal) generated according to a light amount received by each of the imaging elements 101 is sent to the corresponding column signal processing circuit 113 via the signal line (data output line) 117 and the VSL.

For example, the column signal processing circuits 113 are disposed one for each column of the imaging elements 101, and each perform signal processing of noise removal and signal amplification processing for image signals output from the imaging elements 101 in one row for each imaging element according to signals received from black reference pixels (not depicted, but formed around an effective pixel region). A horizontal selection switch (not depicted) is provided and connected between the horizontal signal line 118 and an output stage of each of the column signal processing circuits 113.

The horizontal driving circuit 114 including a shift register, for example, sequentially selects the respective column signal processing circuits 113 by sequentially outputting a horizontal scanning pulse, and outputs signals from the respective column signal processing circuits 113 to the horizontal signal line 118.

The output circuit 115 performs signal processing for the signals sequentially supplied from the column signal processing circuits 113 via the horizontal signal line 118, and outputs the processed signals.

For example, the imaging elements of Embodiment 1 can be manufactured by the following method. Specifically, an SOI substrate is initially prepared. Subsequently, an element separation region 41, an oxide film 42, various types of transistors constituting the control unit of the imaging elements and the like are formed on a silicon layer located on the front surface side of the SOI substrate. The wiring layer 45, the interlayer insulation layer 43, and various types of wires are further formed on the respective parts thus formed. The interlayer insulation layer 43 is then affixed to a support substrate (not depicted). Thereafter, the SOI substrate is removed to expose a silicon layer. One of the surfaces of the silicon layer corresponds to the front surface 40A of the semiconductor substrate 40, while the other surface of the silicon layer corresponds to a rear surface 40B of the semiconductor substrate 40. Subsequently, the interlayer insulation layer 30 is formed on the side of the rear surface 40B of the semiconductor substrate 40. The contact hole 44 is further formed. Various types of pad portions, the interlayer insulation layer 31, various types of connection holes, the charge discharge electrode 22, the reset electrode 27, the charge accumulation electrode 24, the first charge transfer control electrode 25, the second charge transfer control electrode 26, and the insulation layer 32 are formed on the interlayer insulation layer 30. Thereafter, the photoelectric conversion layer 21, the upper electrode 23, the protection material layer 33 including the light shielding layer 12, and the on-chip micro-lens 13 are formed on the insulation layer 32. The imaging elements of Embodiment 1 can be obtained in the foregoing manner. The photoelectric conversion layer 21 is connected to the charge discharge electrode 22 and the second charge transfer control electrode 26 constituting the Nth imaging element during formation of the photoelectric conversion layer 21.

As described above, each of the imaging elements constituting the solid-state imaging device includes the charge accumulation electrode, the first charge transfer control electrode, and the second charge transfer control electrode in Embodiment 1. Accordingly, by using these electrodes, charges accumulated in the photoelectric conversion layer can be transferred (transported) to the adjoining imaging elements, and also can be integrated with charges already accumulated in the adjoining imaging elements. Such integration does not require an additional circuit. Specifically, no analog/digital converter is needed for each row, and no adder nor memory is needed for integration. Accordingly, such problems as an increase in a circuit area, and an increase in power consumption are avoidable and therefore reduction of the circuit area and power consumption is achievable. Moreover, the charge accumulation electrode disposed away from the charge discharge electrode and facing the photoelectric conversion layer via the insulation layer is provided. In this case, a type of capacitor is formed by the photoelectric conversion layer, the insulation layer, and the charge accumulation electrode during photoelectric conversion achieved in the photoelectric conversion layer by irradiation of light to the photoelectric conversion layer. In this state, charges can be accumulated in the photoelectric conversion layer-first region (a lower semiconductor layer and an upper photoelectric conversion layer in a case of the photoelectric conversion layer having a stack structure including the lower semiconductor layer and the upper semiconductor layer). Accordingly, charges can be eliminated by complete depletion of the charge accumulation unit at the time of an exposure start. As a result, such phenomena as an increase in kTC noise, deterioration of random noise, and lowering of imaging quality can be reduced. Moreover, all pixels can be simultaneously reset. In addition, charges can be accumulated in the photoelectric conversion layer-first region, and the charges accumulated in the photoelectric conversion layer-first region can be simultaneously transferred (transported) to the photoelectric conversion layer-second region. Accordingly, what is called a global shutter function is realizable.

Figure 17:
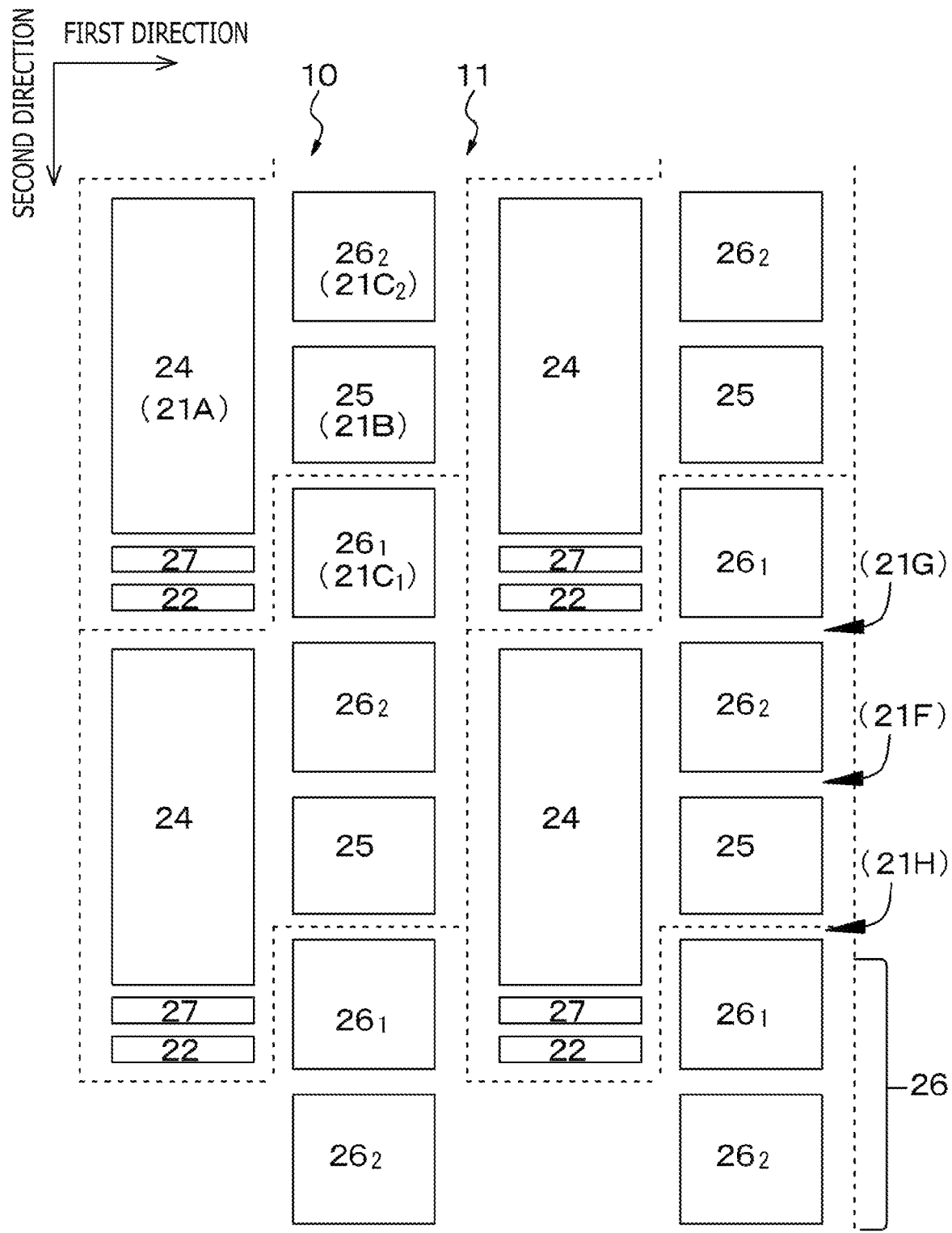
FIG. 17 is a diagram schematically depicting an arrangement of a charge discharge electrode, a reset electrode, a charge accumulation electrode, a first charge transfer control electrode, and a second charge transfer control electrode included in an imaging element constituting Modification 1 of the solid-state imaging device of Embodiment 1.

As depicted in FIG. 17 which schematically illustrates an arrangement of the charge discharge electrode 22, the reset electrode 27, the charge accumulation electrode 24, the first charge transfer control electrode 25, and the second charge transfer control electrode 26 ($26_1$ and $26_2$) in Modification 1 of the solid-state imaging device of Embodiment 1, the second charge transfer control electrode 26 constituting the (n+1)th imaging element 10 can be configured to be disposed between the first charge transfer control electrode 25 constituting the nth imaging element 10 and the first charge transfer control electrode 25 constituting the (n+1)th imaging element 10 in the N imaging elements 10 arranged in the second direction.

Figure 18:
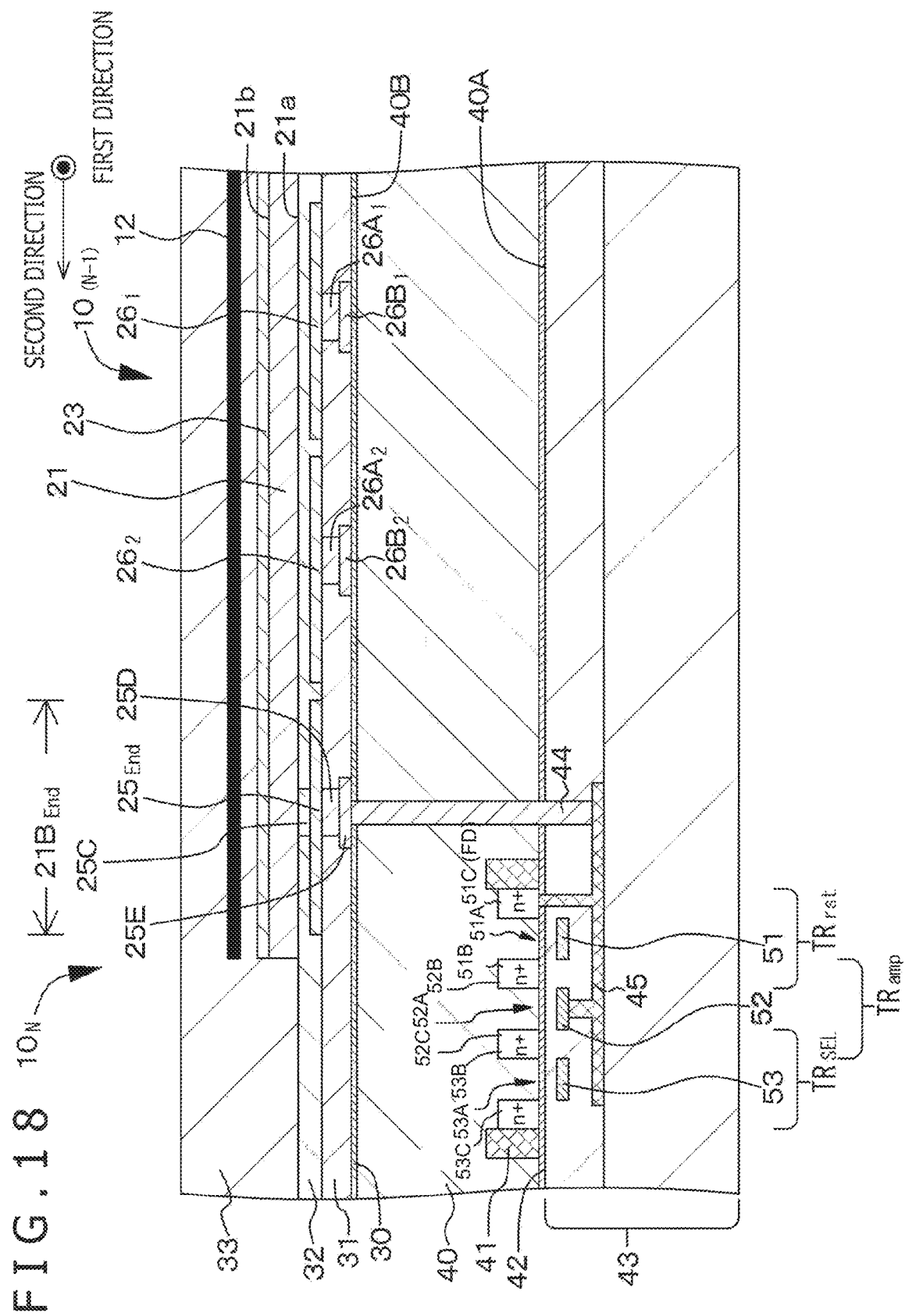
FIG. 18 is a partial cross-sectional diagram schematically depicting the imaging element located at an end of the N imaging elements arranged in the second direction in Modification 2 of the solid-state imaging device of Embodiment 1 and similarly taken along the arrows B-B in FIG. 1.

Moreover, as depicted in FIG. 18 which is a schematic partial cross-sectional diagram similarly taken along the arrows B-B in FIG. 1 and illustrating the imaging element located at the end of the N imaging elements arranged in the second direction in Modification 2 of the solid-state imaging device of Embodiment 1, in a case where a final end of the imaging element $10_N$ located at the end includes the photoelectric conversion layer-second region $21B_{End}$, the photoelectric conversion layer-second region $21B_{End}$ can be configured to be electrically connected to the floating diffusion layer FD via a connection portion 25C in contact with the photoelectric conversion layer-second region $21B_{End}$, and further via a first charge transfer control electrode $25_{End}$, a connection hole 25D, a pad portion 25E, and the contact hole portion 44.

Figure 19:
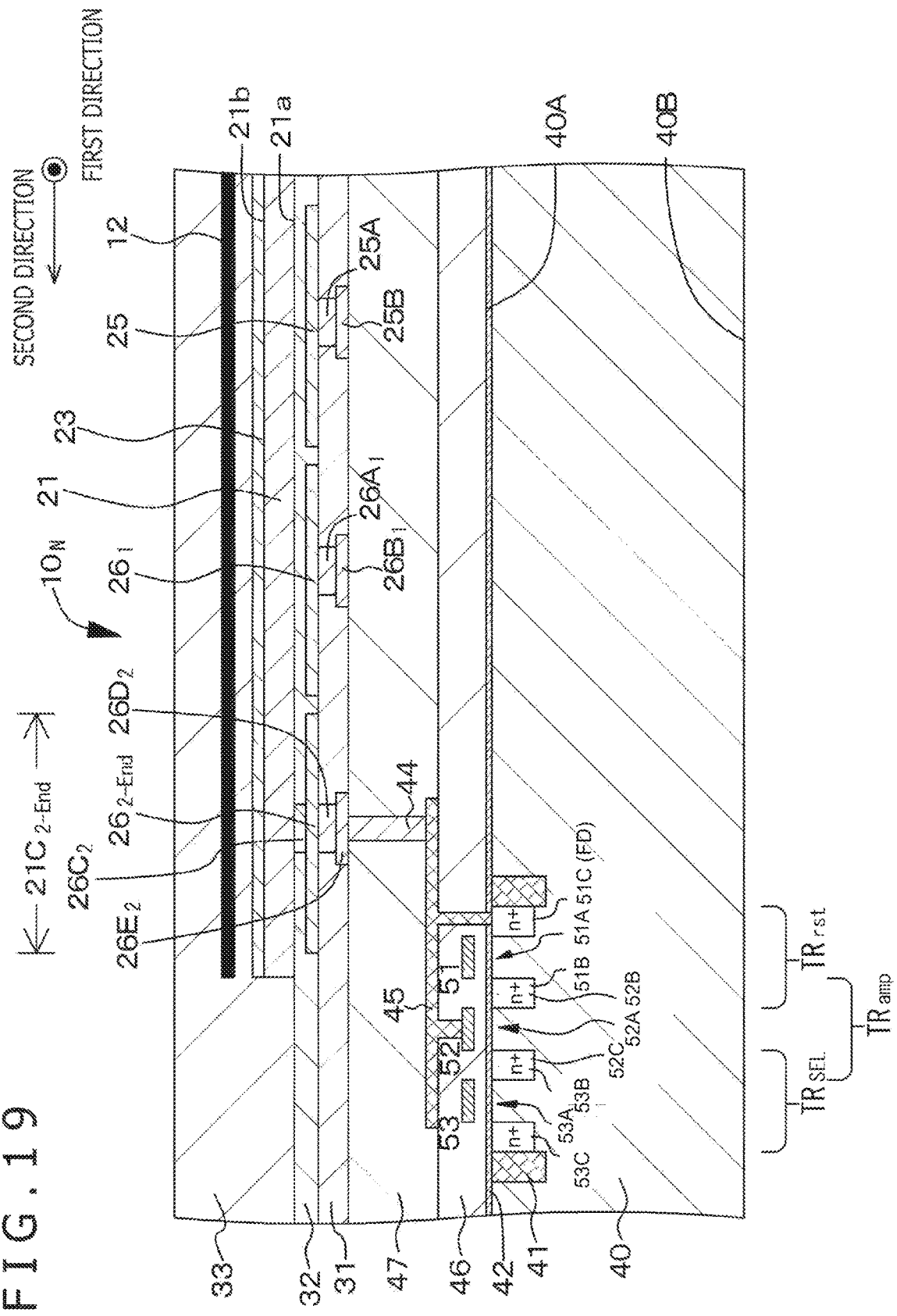
FIG. 19 is a partial cross-sectional diagram schematically depicting the imaging element located at an end of the N imaging elements arranged in the second direction in Modification 3 of the solid-state imaging device of Embodiment 1 and taken along the arrows B-B in FIG. 1 similarly to FIG. 1.

As depicted in FIG. 19 which is a schematic partial cross-sectional diagram similarly taken along the arrows B-B in FIG. 1 and illustrating the imaging element located at the final end of the N imaging elements arranged in the second direction in Modification 3 of the solid-state imaging device of Embodiment 1 in the second direction, each of the imaging elements can also be of a front-irradiation type. Specifically, various types of transistors constituting the control unit are provided on the front surface 40A side of the semiconductor substrate 40 as in Embodiment 1. These transistors can have configurations and structures substantially similar to those of the transistors described in Embodiment 1. Further, interlayer insulation layers 46 and 47 are formed on the front surface 40A of the semiconductor substrate 40, and the photoelectric conversion unit and the like constituting each of the imaging elements of Embodiment 1 are provided on the interlayer insulation layer 47.

Embodiment 2

Figure 20:
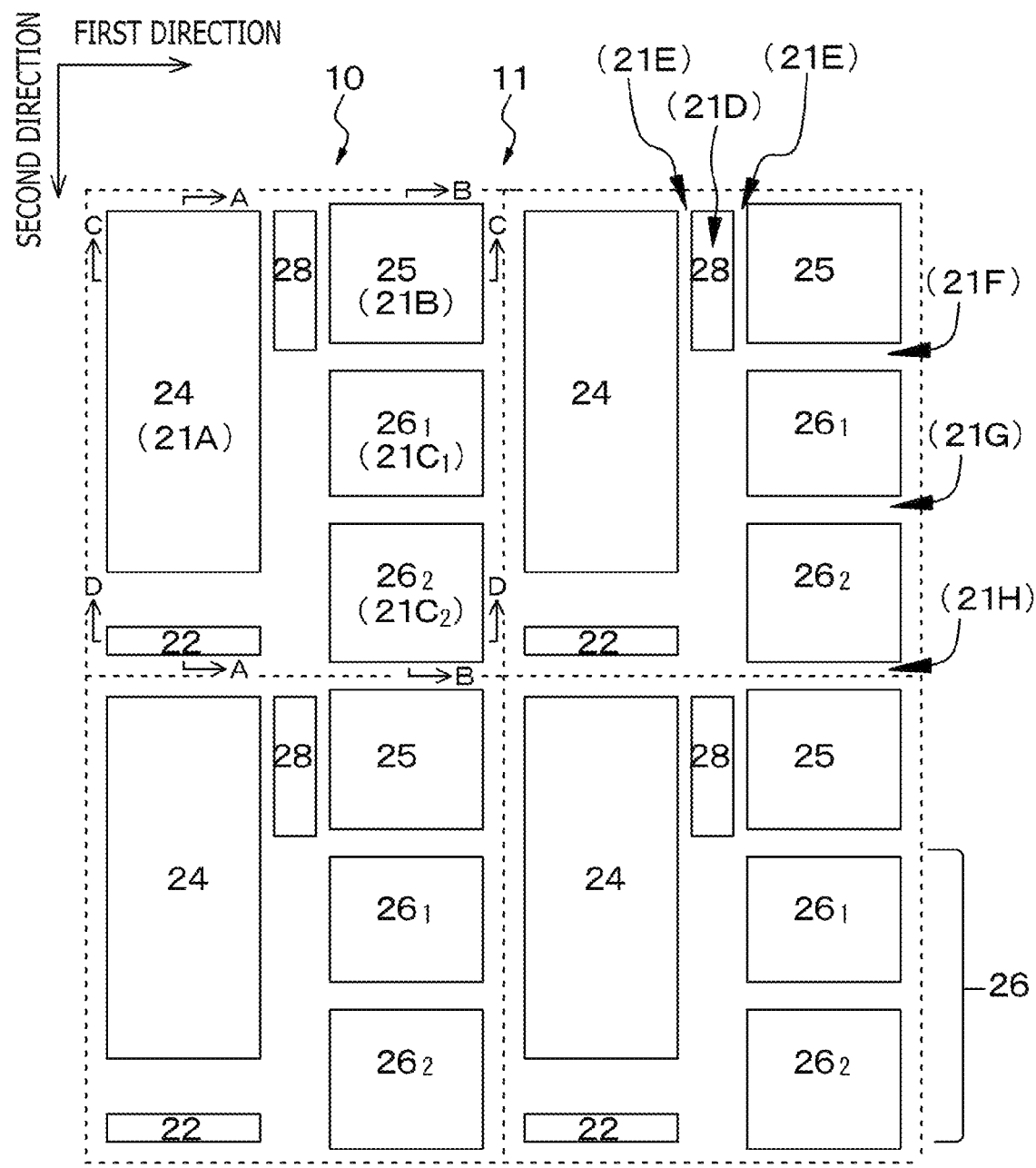
FIG. 20 is a diagram schematically depicting an arrangement of a charge discharge electrode, a charge accumulation electrode, a charge transfer control electrode, a first charge transfer control electrode, and a second charge transfer control electrode included in an imaging element constituting a solid-state imaging device of Embodiment 2.
Figure 21:
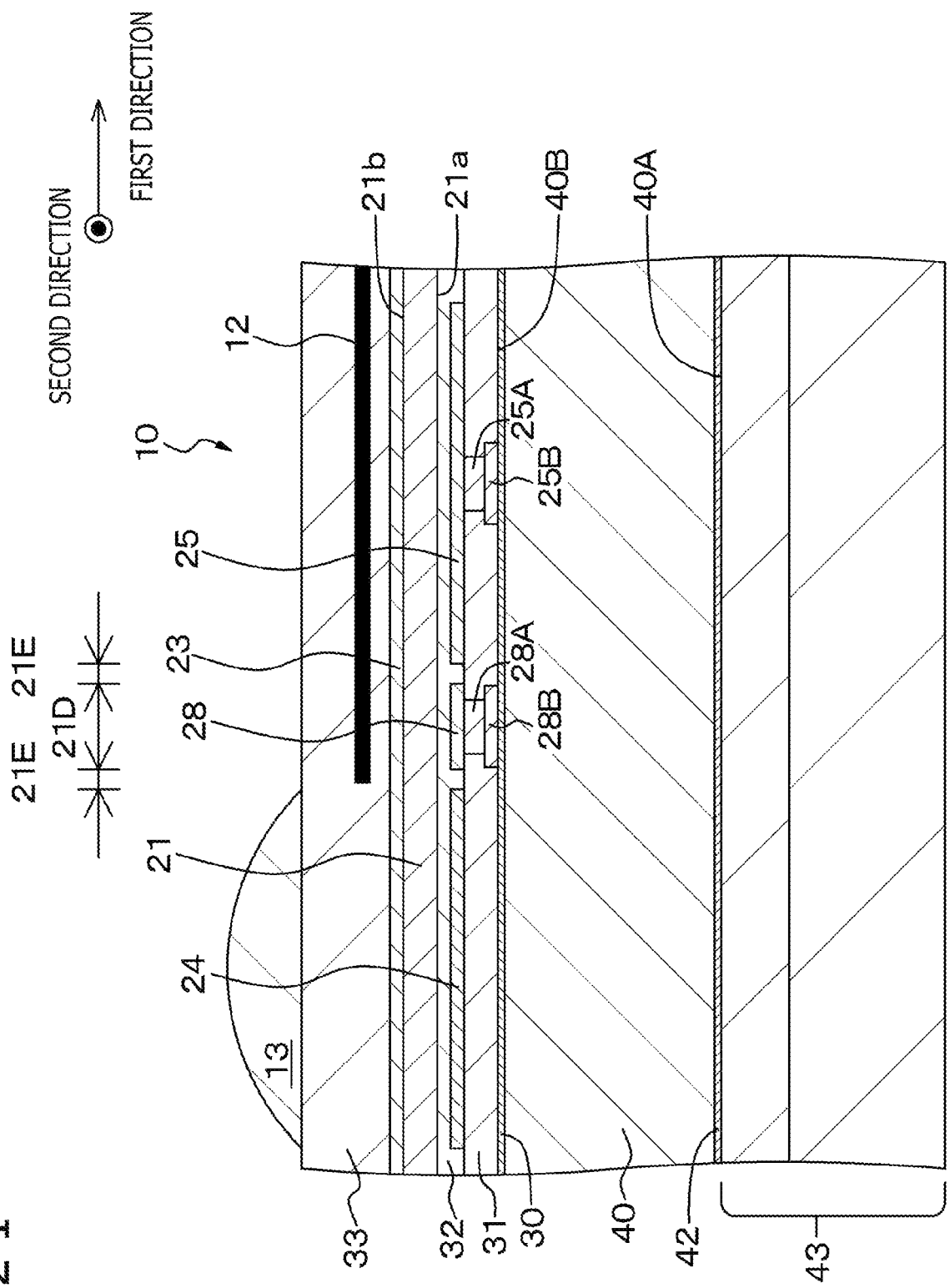
FIG. 21 is a partial cross-sectional diagram schematically depicting the imaging element constituting the solid-state imaging device of Embodiment 2 and taken along arrows C-C in FIG. 20.

Embodiment 2 is a modification of Embodiment 1. FIG. 20 schematically depicts an arrangement of a charge discharge electrode, a charge accumulation electrode, a charge transportation control electrode, a first charge transfer control electrode, and a second charge transfer control electrode included in an imaging element constituting the solid-state imaging device of Embodiment 2. FIG. 21 is a schematic partial cross-sectional diagram of the imaging element constituting the solid-state imaging device of Embodiment 2 taken along arrows C-C in FIG. 20. Unlike Embodiment 1, a reset electrode is not provided in Embodiment 2.

The arrangement of the charge discharge electrode, the charge accumulation electrode, and a light shielding layer included in the imaging element constituting the solid-state imaging device of Embodiment 2 is similar to that arrangement in FIG. 2 except for the absence of a reset electrode. A schematic partial cross-sectional diagram of the imaging element constituting the solid-state imaging device of Embodiment 2 taken along arrows A-A in FIG. 20 is similar to that of FIG. 3. A schematic partial cross-sectional diagram of the imaging element constituting the solid-state imaging device of Embodiment 2 taken along arrows B-B in FIG. 20 is similar to that of FIG. 4. A schematic partial cross-sectional diagram of the imaging element constituting the solid-state imaging device of Embodiment 2 taken along arrows D-D in FIG. 20 is similar to that of FIG. 6. A schematic partial cross-sectional diagram of the imaging element located at the end of the N imaging elements arranged in the second direction in the solid-state imaging device of Embodiment 2 similarly to the diagram taken along the arrows B-B in FIG. 20 is similar to each of FIGS. 7, 18, and 19.

A photoelectric conversion unit in Embodiment 2 further includes the charge transportation control electrode 28 disposed away from the charge accumulation electrode 24 and the first charge transfer control electrode 25, and located in such a position as to face the first surface 21a of the photoelectric conversion layer 21 via the insulation layer 32 and intervene between the charge accumulation electrode 24 and the first charge transfer control electrode 25. Moreover, the light shielding layer 12 further covers a photoelectric conversion layer-fourth region 21D so positioned as to face the charge transportation control electrode 28. Further, in this case, charges accumulated in the photoelectric conversion layer-first region 21A of each of the imaging elements are transferred to the photoelectric conversion layer-second region 21B according to an operation of the charge transportation control electrode 28. The charge transportation control electrode 28 is connected to the vertical driving circuit 112 constituting the driving circuit via a connection hole 28A formed in the interlayer insulation layer 31, a pad portion 28B, and a not-depicted wire.

The light shielding layer 12 covers (A) the photoelectric conversion layer-second region 21B and the photoelectric conversion layer-third region 21C ($21C_1$ and $21C_2$), (B) the photoelectric conversion layer-fourth region 21D, (C) a region of the photoelectric conversion layer so disposed as to face a region between the charge accumulation electrode 24 and the charge transportation control electrode 28, and a photoelectric conversion layer-fifth region 21E corresponding to a region of the photoelectric conversion layer so disposed as to face the charge transportation control electrode 28 and the first charge transfer control electrode 25, (D) a photoelectric conversion layer-sixth region 21F located between the photoelectric conversion layer-second region 21B and the photoelectric conversion layer-third region 21C alternately arranged in a belt shape, (E) a photoelectric conversion layer-seventh region 21G located between a region of the photoelectric conversion layer so disposed as to face the second-A charge transfer control electrode $26_1$ and a region of the photoelectric conversion layer so disposed as to face the second-B charge transfer control electrode $26_2$, and (F) a photoelectric conversion layer-eighth region 21H extending from the photoelectric conversion layer-second region 21B and the photoelectric conversion layer-third region 21C, and disposed between the adjoining imaging elements.

Configurations and structures of the solid-state imaging device and the imaging elements of Embodiment 2 may be similar to the configurations and the structures of the solid-state imaging device and the imaging elements described in Embodiment 1 and the modifications of Embodiment 1 except for the foregoing points. Accordingly, detailed description of these configurations and structures is omitted.

Operations of the imaging elements constituting the solid-state imaging device of Embodiment 2 will hereinafter be described with reference to FIGS. 22A, 22B, 23, 24A, 24B, 25A, 25B, 26A, 26B, 27A, and 27B each schematically depicting a potential state and the like at respective parts of each of the imaging elements of Embodiment 2 during operation.

[Step-200]

Figure 22A:
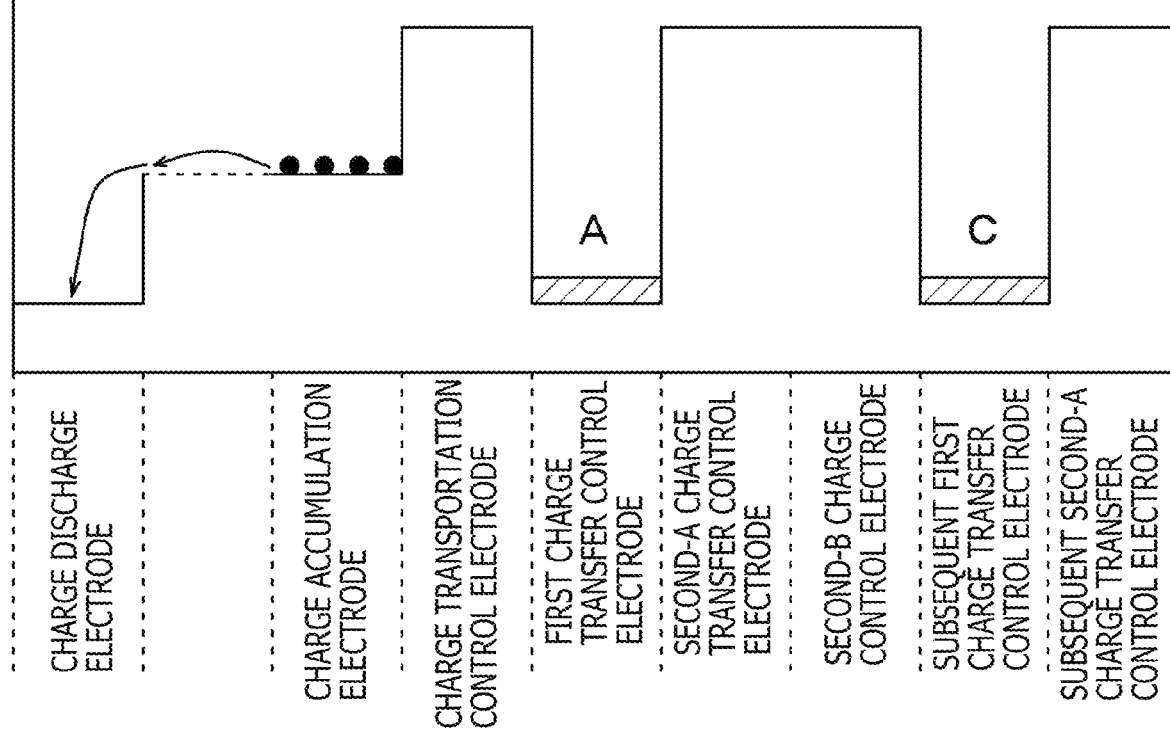
FIGS. 22A and 22B are diagrams each schematically depicting a potential state and the like at respective parts of the imaging element constituting the solid-state imaging device of Embodiment 2 during operation.

First, each of the imaging elements 10 discharges charges remaining in the photoelectric conversion layer-first region 21A to the outside according to an operation of the charge discharge electrode 22. Specifically, as depicted in FIG. 22A, the charge discharge electrode 22 is caused to discharge charges remaining in the photoelectric conversion layer-first region 21A to the outside of the system. A high barrier is formed in the photoelectric conversion layer-fourth region 21D by application of a negative potential (specifically, for example, potential of upper electrode 23<0 volt<potential of charge transportation control electrode 28<potential of charge accumulation electrode 24<potential of charge discharge electrode 22) to the charge transportation control electrode 28.

[Step-210]

Figure 22B:
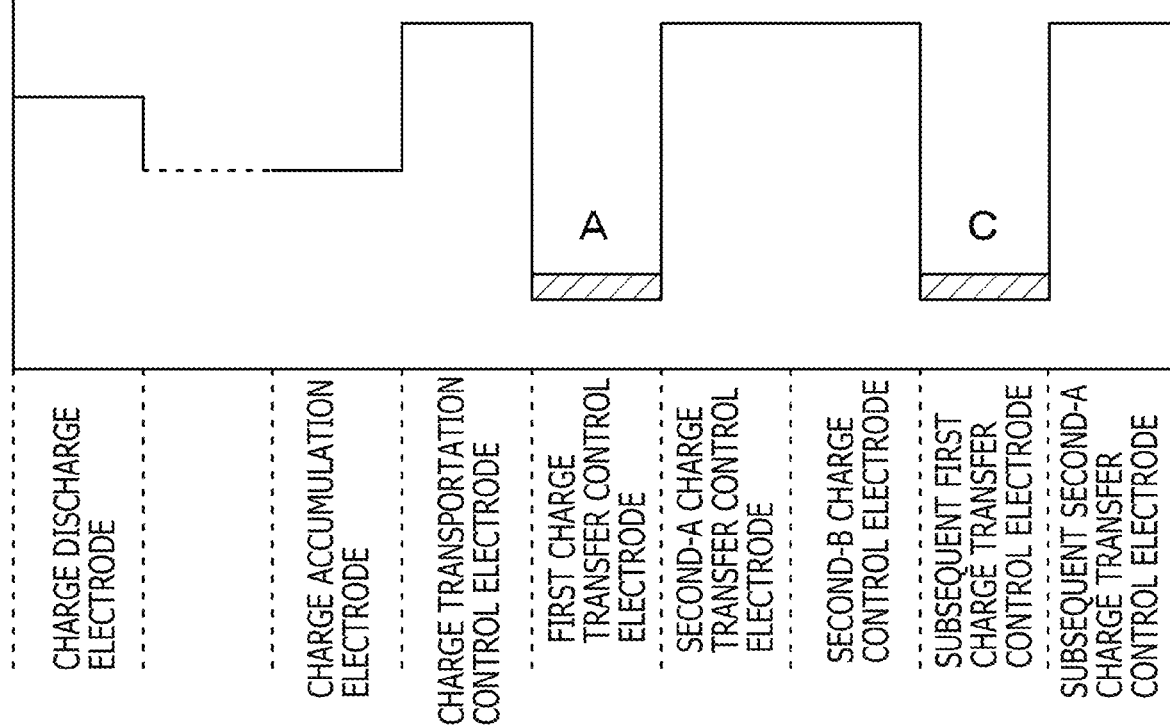
Figure 23:
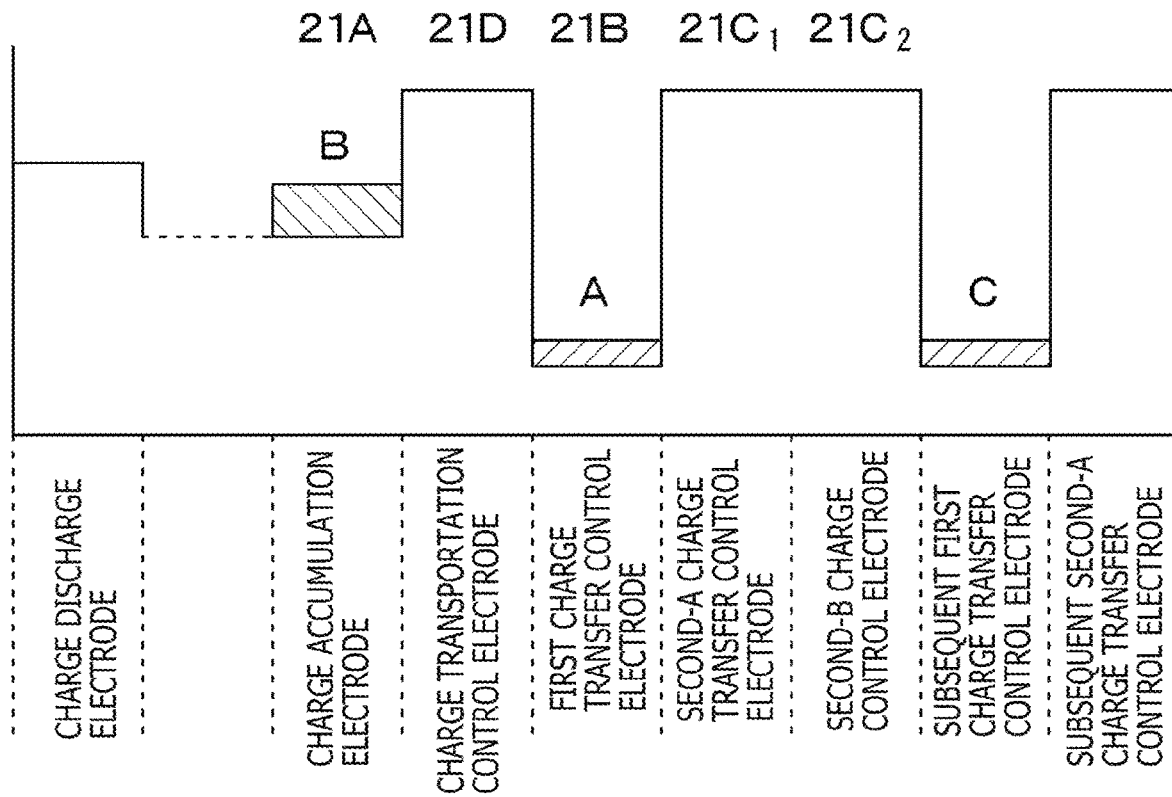
FIG. 23 is a diagram continuing from FIG. 22B and schematically depicting a potential state and the like at respective parts of the imaging element constituting the solid-state imaging device of Embodiment 2 during operation.

Thereafter, as depicted in FIGS. 22B and 23, a high barrier is formed in a region of the photoelectric conversion layer facing the charge discharge electrode 22 by application of a negative potential (specifically, for example, potential of upper electrode 23<0 volt<potential of transportation control electrode 28 potential of charge discharge electrode 22<potential of charge accumulation electrode 24, or as a not-depicted potential, potential of upper electrode 23<0 volt<potential of charge discharge electrode 22<potential of charge transportation control electrode 28<potential of charge accumulation electrode 24) to the charge discharge electrode 22. Light is applied to the photoelectric conversion layer 21 of each of the imaging elements 10 with a voltage kept being applied to the upper electrode 23 and the charge accumulation electrode 24 to accumulate charges in the photoelectric conversion layer-first region 21A of each of the imaging elements 10 (charge accumulation period). Holes are discharged to the outside of the system via the upper electrode 23. Electrons are attracted to the charge accumulation electrode 24 and accumulated in the photoelectric conversion layer-first region 21A.

In the charge accumulation period herein, the driving circuit applies the potential $V_{11}$ to the first charge transfer control electrode 25, the potential $V_{31}$ to the charge accumulation electrode 24, and a potential $V_{51}$ to the charge transportation control electrode 28 to accumulate charges in the photoelectric conversion layer-first region 21A.

In the subsequent charge transfer period, the driving circuit applies the potential $V_{12}$ to the first charge transfer control electrode 25, the potential $V_{32}$ to the charge accumulation electrode 24, and a potential $V_{52}$ to the charge transportation control electrode 28 to read the charges accumulated in the photoelectric conversion layer-first region 21A to the control unit via the first charge transfer control electrode 25 and the second charge transfer control electrode 26. In this case, $V_{21}<V_{31}$, $V_{51}<V_{31}$, $V_{31}<V_{11}$, and $V_{22}<V_{32}<V_{52}\leq V_{12}$ all hold.

[Step-220]

Figure 24A:
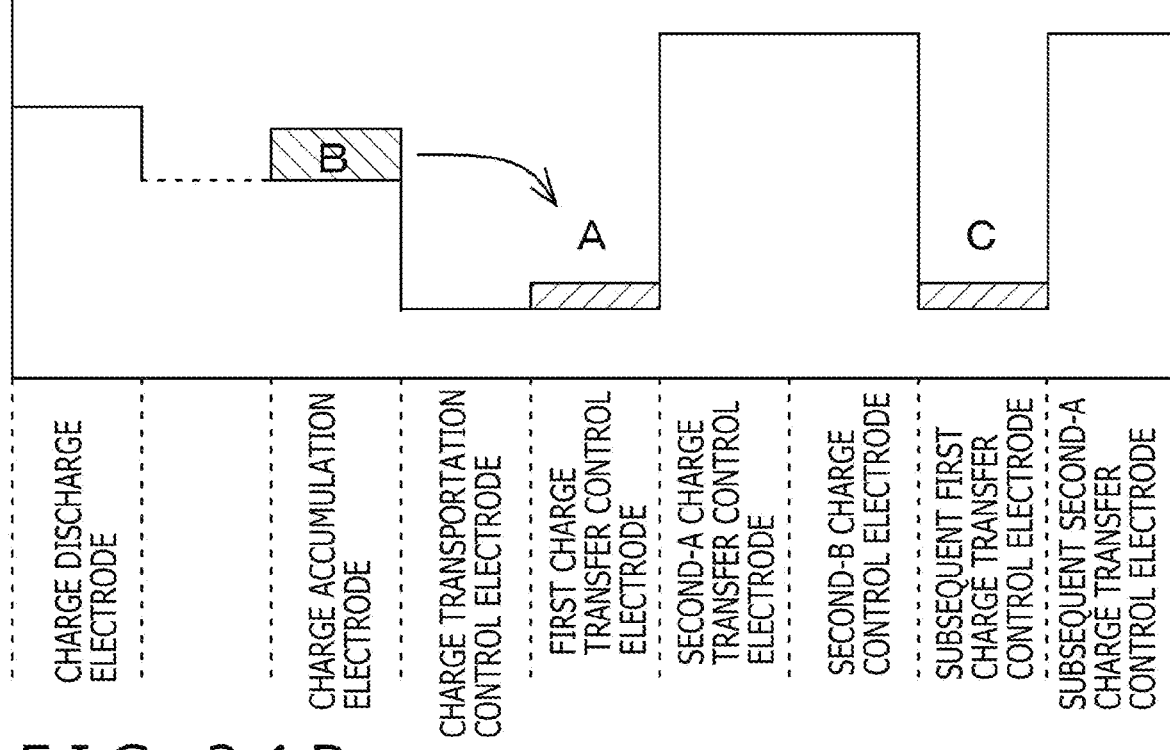
FIGS. 24A and 24B are diagrams continuing from FIG. 23 and schematically depicting a potential state and the like at respective parts of the imaging element constituting the solid-state imaging device of Embodiment 2 during operation.
Figure 24B:
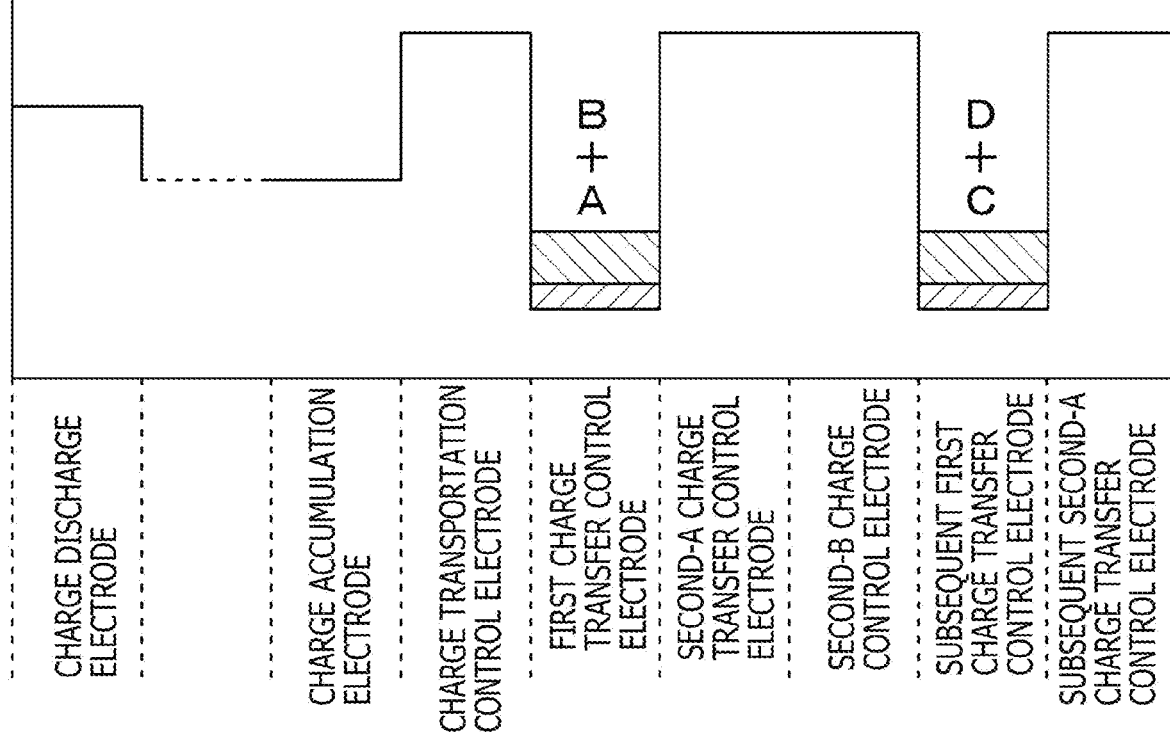

Thereafter, as depicted in FIG. 24A, a potential on the positive side with respect to the potential applied in [step-210] (specifically, for example, potential of upper electrode 23<0 volt<potential of charge discharge electrode 22<charge accumulation electrode 24<potential of charge transportation control electrode 28) is applied to the charge transportation control electrode 28 to transfer the charges accumulated in the photoelectric conversion layer-first region 21A of each of the imaging elements 10 to the photoelectric conversion layer-second region 21B (charge transfer period) and accumulate the transferred charges therein in addition to charges already accumulated in the photoelectric conversion layer-second region 21B. Specifically, the charges accumulated in the photoelectric conversion layer-first region 21A can be transferred to the photoelectric conversion layer-second region 21B by controlling the potentials of the charge accumulation electrode 24, the charge transportation control electrode 28, and the first charge transfer control electrode 25. The charges accumulated in the photoelectric conversion layer-second region 21B are expressed as "B+A." The second-B charge transfer control electrode $26_2$ of the (n−1)th imaging element $10_{(n-1)}$ and the second-A charge transfer control electrode $26_1$ of the nth imaging element $10_n$ are controlled to prevent a flow of the charges into a region of the photoelectric conversion layer 21 facing these electrodes. Thereafter, as depicted in FIG. 24B, a high barrier is formed in the photoelectric conversion layer-fourth region 21D by application of a negative potential to the charge transportation control electrode 28 (specifically, for example, potential of upper electrode 23<0 volt<potential of charge transportation control electrode 28≤potential of charge discharge electrode 22<potential of charge accumulation electrode 24, or as a not-depicted potential, potential of upper electrode 23<0 volt<potential of charge discharge electrode 22<potential of charge transportation control electrode 28<potential of charge accumulation electrode 24).

[Step-230]

Subsequently, as depicted in FIGS. 25A and 25B, the charges "B+A" accumulated in the photoelectric conversion layer-second region 21B of the nth imaging element $10_n$ included in the N imaging elements 10 arranged in the second direction are transferred to the photoelectric conversion layer-second region 21B of the (n+1)th imaging element 10 according to an operation of the second charge transfer control electrode 26.

Specifically, the charges "B+A" accumulated in the first charge transfer control electrode 25 can be transferred to the second-A charge transfer control electrode $26_1$ by controlling the potentials of the first charge transfer control electrode 25 and the second-A charge transfer control electrode $26_1$.

[Step-240]

Subsequently, as depicted in FIGS. 26A and 26B, the charges "B+A" accumulated in the second-A charge transfer control electrode $26_1$ can be transferred to the second-B charge transfer control electrode $26_2$ by controlling the potentials of the second-A charge transfer control electrode $26_1$ and the second-B charge transfer control electrode $26_2$.

[Step-250]

Figure 27A:
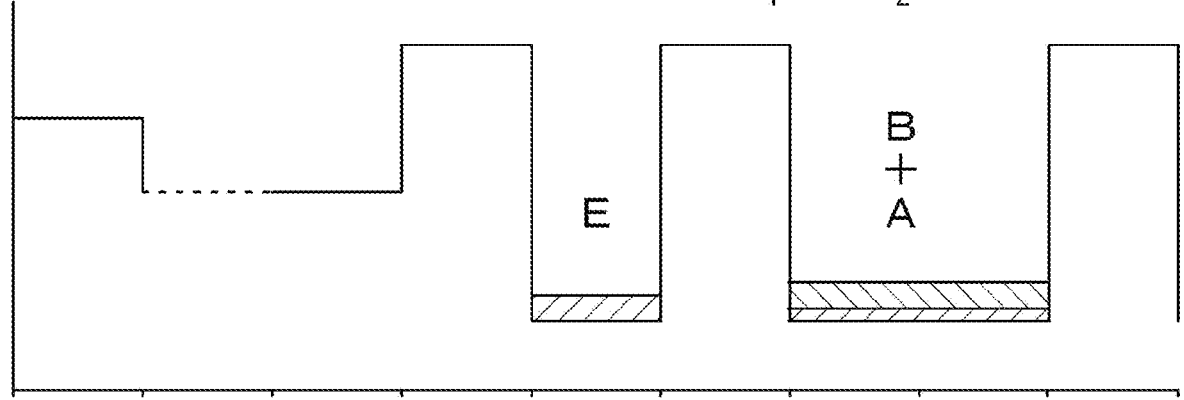
FIGS. 27A and 27B are diagrams continuing from FIG. 26B and schematically depicting a potential state and the like at respective parts of the imaging element constituting the solid-state imaging device of Embodiment 2 during operation.
Figure 27B:
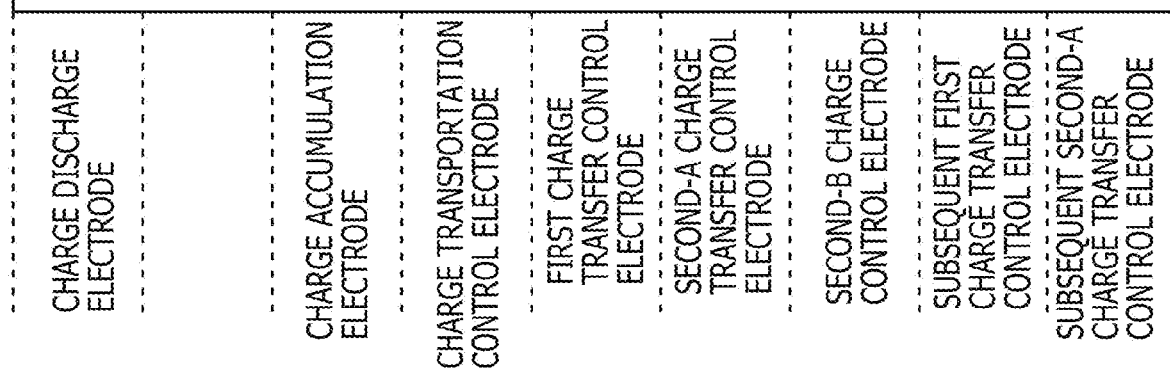

Thereafter, as depicted in FIGS. 27A and 27B, the charges "B+A" accumulated in the second-B charge transfer control electrode $26_2$ can be transferred to the first charge transfer control electrode 25 of the (n+1)th imaging element $10_{(n+1)}$ by controlling the potentials of the second-B charge transfer control electrode $26_2$ and the first charge transfer control electrode 25 of the (n+1)th imaging element $10_{(n+1)}$. Moreover, the charge "E" accumulated in the second-B charge transfer control electrode $26_2$ of the (n−1)th imaging element $10_{(n-1)}$ can be transferred to the first charge transfer control electrode 25 of the nth imaging element $10_n$ by controlling the potentials of the second-B charge transfer control electrode $26_2$ of the (n−1)th imaging element $10_{(n-1)}$ and the first charge transfer control electrode 25 of the nth imaging element $10_n$.

Thereafter, the operations of the imaging elements as described above are repeated.

Embodiment 3

Figure 28:
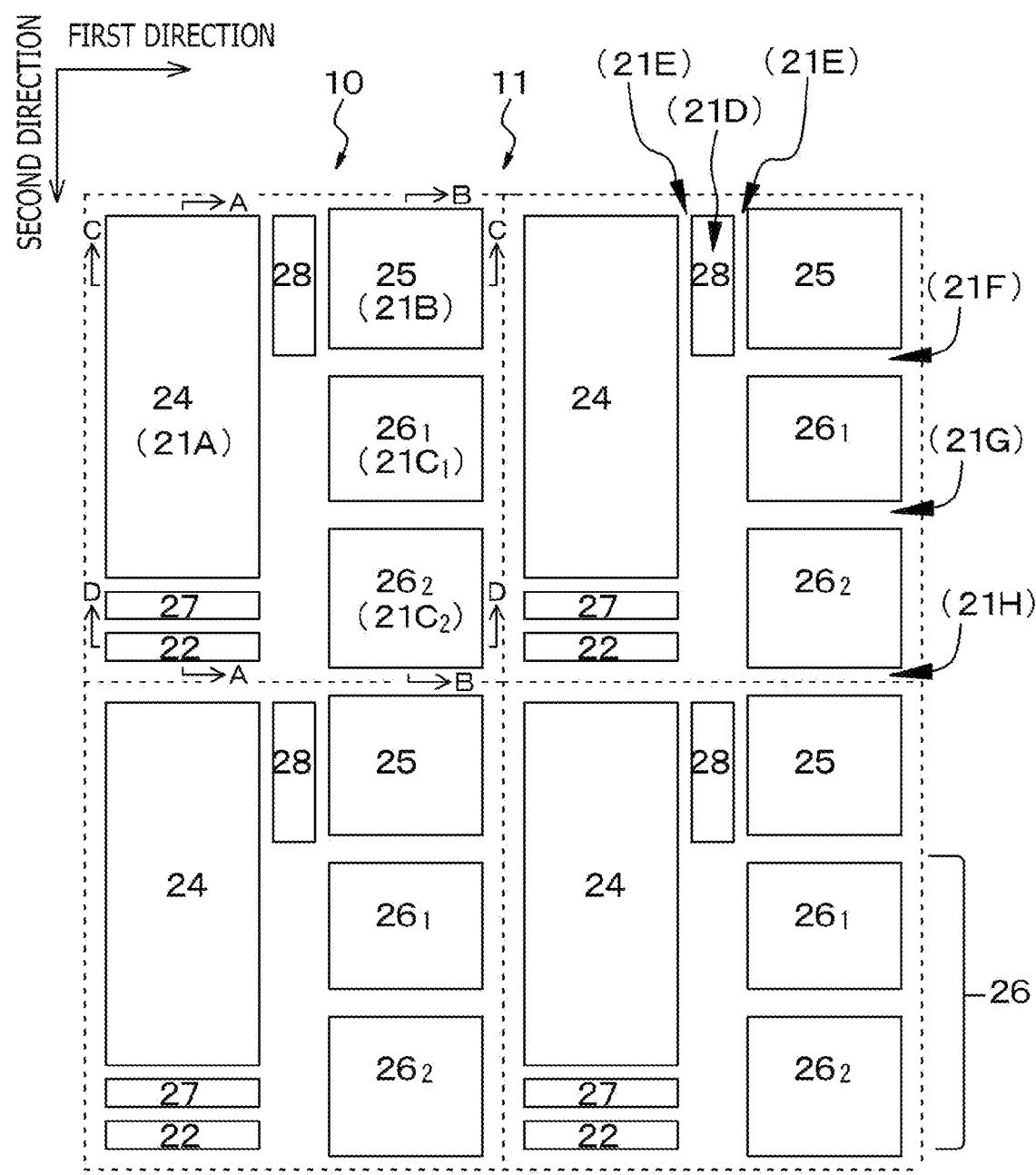
FIG. 28 is a diagram schematically depicting an arrangement of a charge discharge electrode, a reset electrode, a charge accumulation electrode, a charge transportation control electrode, a first charge transfer control electrode, and a second charge transfer control electrode included in an imaging element constituting a solid-state imaging device of Embodiment 3.

Embodiment 3 relates to a solid-state imaging device produced by combining Embodiment 1 and Embodiment 2. FIG. 28 schematically depicts an arrangement of a charge discharge electrode, a reset electrode, a charge accumulation electrode, a charge transportation control electrode, a first charge transfer control electrode, and a second charge transfer control electrode included in each of imaging elements constituting the solid-state imaging device of Embodiment 3. In Embodiment 3, a reset electrode is provided as in Embodiment 1, and a charge transportation control electrode is provided as in Embodiment 2.

Specifically, a photoelectric conversion unit of each of imaging elements constituting the solid-state imaging device of Embodiment 3 further includes the reset electrode 27 disposed away from the charge discharge electrode 22 and the charge accumulation electrode 24 in such a position as to face the first surface 21a of the photoelectric conversion layer 21 via the insulation layer 32 and intervene between the charge discharge electrode 22 and the charge accumulation electrode 24, and also includes the charge transportation control electrode 28 disposed away from the charge accumulation electrode 24 and the first charge transfer control electrode 25 in such a position as to face the first surface 21a of the photoelectric conversion layer 21 via the insulation layer 32 and intervene between the charge accumulation electrode 24 and the first charge transfer control electrode 25.

The arrangement of the charge discharge electrode, the reset electrode, the charge accumulation electrode, and the light shielding layer included in the imaging element constituting the solid-state imaging device of Embodiment 3 is similar to that arrangement in FIG. 2 except for the presence of the charge accumulation electrode. A schematic partial cross-sectional diagram of the imaging element constituting the solid-state imaging device in Embodiment 3 taken along arrows A-A in FIG. 28 is similar to that of FIG. 3. A schematic partial cross-sectional diagram of the imaging element constituting the solid-state imaging device in Embodiment 3 taken along arrows B-B in FIG. 28 is similar to that of FIG. 4. A schematic partial cross-sectional diagram of the imaging element constituting the solid-state imaging device in Embodiment 3 taken along arrows C-C in FIG. 28 is similar to that of FIG. 21. A schematic partial cross-sectional diagram of the imaging element constituting the solid-state imaging device in Embodiment 3 taken along arrows D-D in FIG. 28 is similar to that of FIG. 6. A schematic partial cross-sectional diagram of the imaging element located at the end of the N imaging elements arranged in the second direction in the solid-state imaging device of Embodiment 3 similarly to the diagram taken along the arrows B-B in FIG. 28 is similar to each of FIGS. 7, 18, and 19.

Configurations and structures of the solid-state imaging device and the imaging elements of Embodiment 3 may be similar to the configurations and the structures of the solid-state imaging device and the imaging elements described in Embodiment 1, the modifications of Embodiment 1, and Embodiment 2 except for the foregoing points. Accordingly, detailed description of these configurations and structures is omitted. Note that a plurality of the charge transportation control electrodes may be provided.

Operations of the imaging elements constituting the solid-state imaging device of Embodiment 3 will hereinafter be described with reference to FIGS. 29A, 29B, 30, 31A, 31B, 32A, 32B, 33A, 33B, 34A, and 34B each schematically depicting a potential state and the like at respective parts of each of the imaging elements of Embodiment 3 during operation.

[Step-300]

First, each of the imaging elements 10 discharges charges remaining in the photoelectric conversion layer-first region 21A to the outside according to an operation of the charge discharge electrode 22. Specifically, as depicted in FIGS. 29A and 29B, the reset electrode 27 and the charge discharge electrode 22 are caused to discharge charges remaining in the photoelectric conversion layer-first region 21A to the outside of the system. A high barrier is formed in the photoelectric conversion layer-fourth region 21D by application of a negative potential (specifically, for example, potential of upper electrode 23<0 volt<potential of charge transportation control electrode 28<potential of charge accumulation electrode 24<potential of reset electrode 27≤potential of charge discharge electrode 22) to the charge transportation control electrode 28.

[Step-310]

Figure 30:
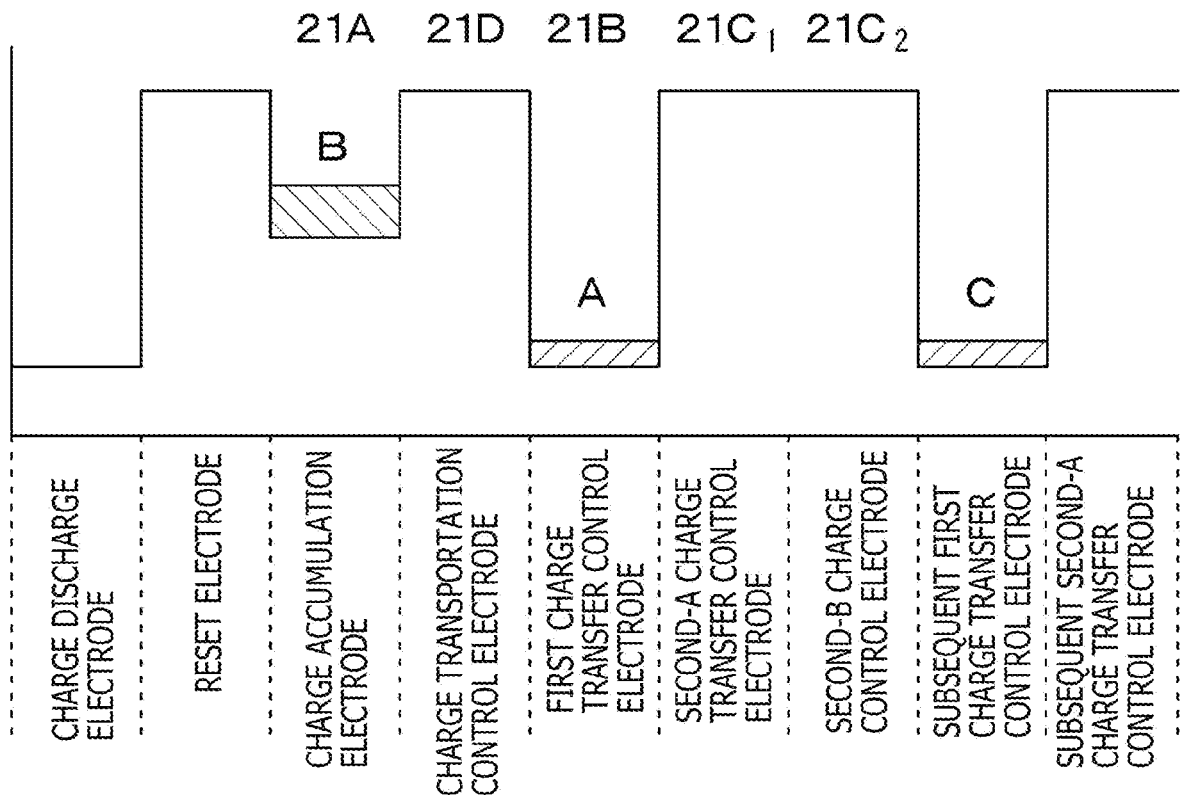
FIG. 30 is a diagram continuing from FIG. 29B and schematically depicting a potential state and the like at respective parts of the imaging element constituting the solid-state imaging device of Embodiment 3 during operation.

Thereafter, as depicted in FIG. 30, a high barrier is formed in a region of the photoelectric conversion layer facing the reset electrode 27 by application of a negative potential (specifically, for example, potential of upper electrode 23<0 volt<potential of transportation control electrode 28 potential of reset electrode 27<potential of charge accumulation electrode 24<potential of charge discharge electrode 22, or as a not-depicted potential, potential of upper electrode 23<0 volt<potential of reset electrode 27<potential of charge transportation control electrode 28<potential of charge accumulation electrode 24<potential of charge discharge electrode 22) to the reset electrode 27. Light is applied to the photoelectric conversion layer 21 of each of the imaging elements 10 with a voltage kept being applied to the upper electrode 23 and the charge accumulation electrode 24 to accumulate charges in the photoelectric conversion layer-first region 21A of each of the imaging elements 10. Holes are discharged to the outside of the system via the upper electrode 23. Electrons are attracted to the charge accumulation electrode 24 and accumulated in the photoelectric conversion layer-first region 21A.

In the charge accumulation period herein, the driving circuit applies the potential $V_{11}$ to the first charge transfer control electrode 25, the potential $V_{31}$ to the charge accumulation electrode 24, a potential $V_{41}$ to the reset electrode 27, and a potential $V_{51}$ to the charge transportation control electrode 28 to accumulate charges in the photoelectric conversion layer-first region 21A.

In the subsequent charge transfer period, the driving circuit applies the potential $V_{12}$ to the first charge transfer control electrode 25, the potential $V_{32}$ to the charge accumulation electrode 24, a potential $V_{42}$ to the reset electrode 27, and a potential $V_{52}$ to the charge transportation control electrode 28 to read the charges accumulated in the photoelectric conversion layer-first region 21A to the control unit via the first charge transfer control electrode 25 and the second charge transfer control electrode 26. In this case, $V_{21}<V_{31}$, $V_{41}<V_{31}$, $V_{51}<V_{31}$, $V_{31}<V_{11}$, $V_{22}<V_{32}$, $V_{42}<V_{32}$, and $V_{32}<V_{52}\leq V_{12}$ all hold.

[Step-320]

Figure 31A:
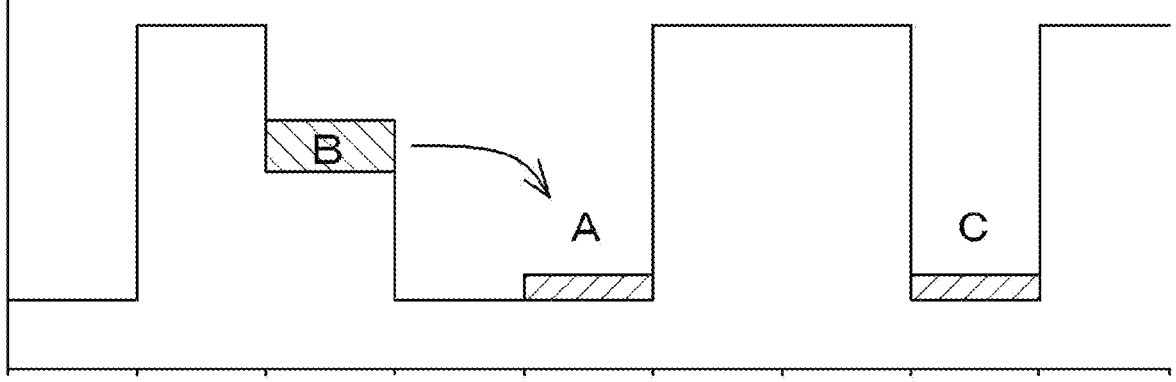
FIGS. 31A and 31B are diagrams continuing from FIG. 30 and schematically depicting a potential state and the like at respective parts of the imaging element constituting the solid-state imaging device of Embodiment 3 during operation.
Figure 31B:
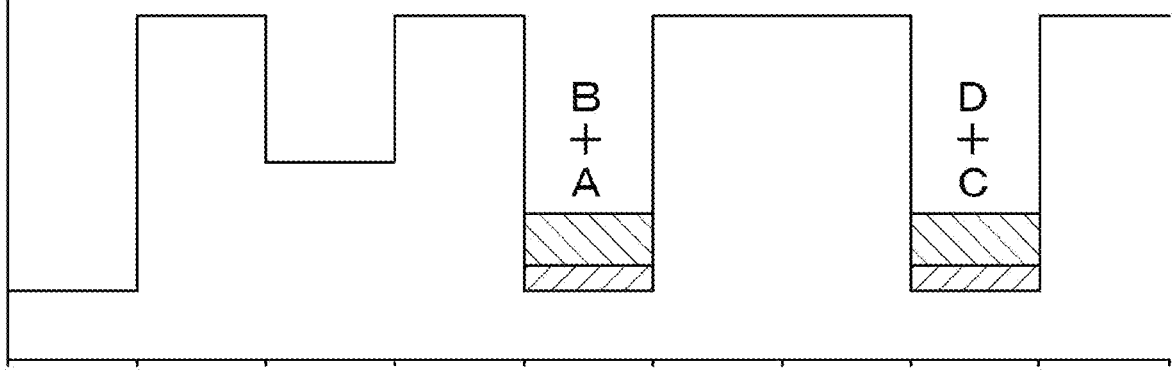

Thereafter, as depicted in FIG. 31A, a potential on the positive side with respect to the potential applied in [step-310] (specifically, for example, potential of upper electrode 23<0 volt<potential of reset electrode 27<potential of charge accumulation electrode 24<potential of charge transportation control electrode 28 potential of first charge transfer control electrode 25) is applied to the charge transportation control electrode 28 to transfer the charges accumulated in the photoelectric conversion layer-first region 21A of each of the imaging elements 10 to the photoelectric conversion layer-second region 21B and accumulate the transferred charges in addition to charges already accumulated in the photoelectric conversion layer-second region 21B. Specifically, the charges accumulated in the photoelectric conversion layer-first region 21A can be transferred to the photoelectric conversion layer-second region 21B by controlling the potentials of the charge accumulation electrode 24, the charge transportation control electrode 28, and the first charge transfer control electrode 25. The charges accumulated in the photoelectric conversion layer-second region 21B are expressed as "B+A." The second-B charge transfer control electrode $26_2$ of the (n−1)th imaging element $10_{(n-1)}$ and the second-A charge transfer control electrode $26_1$ of the nth imaging element $10_n$ are controlled to prevent a flow of the charges into a region of the photoelectric conversion layer 21 facing these electrodes. Thereafter, as depicted in FIG. 31B, a high barrier is formed in the photoelectric conversion layer-fourth region 21D by application of a negative potential (specifically, for example, potential of upper electrode 23<0 volt<potential of charge transportation control electrode 28 potential of reset electrode 27<potential of charge accumulation electrode 24<potential of charge discharge electrode 22, or as a not-depicted potential, potential of upper electrode 23<0 volt<potential of reset electrode 27<potential of charge transportation control electrode 28<potential of charge accumulation electrode 24<potential of charge discharge electrode 22) to the charge transportation control electrode 28.

[Step-330]

Figure 32A:
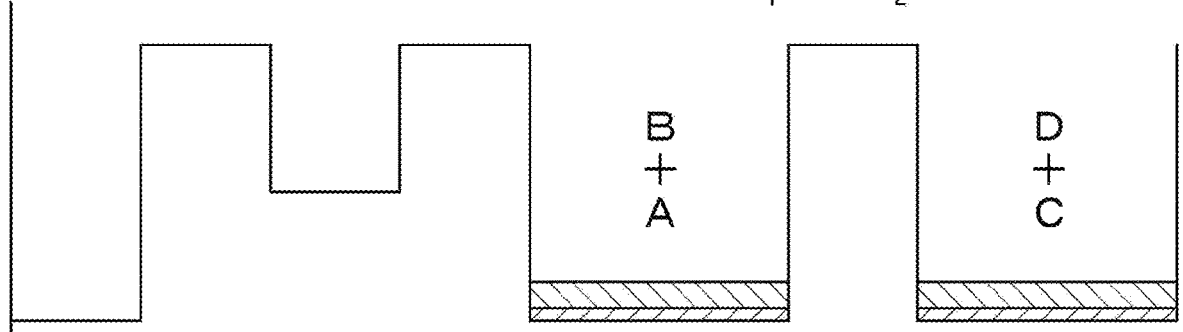
FIGS. 32A and 32B are diagrams continuing from FIG. 31B and schematically depicting a potential state and the like at respective parts of the imaging element constituting the solid-state imaging device of Embodiment 3 during operation.
Figure 32B:
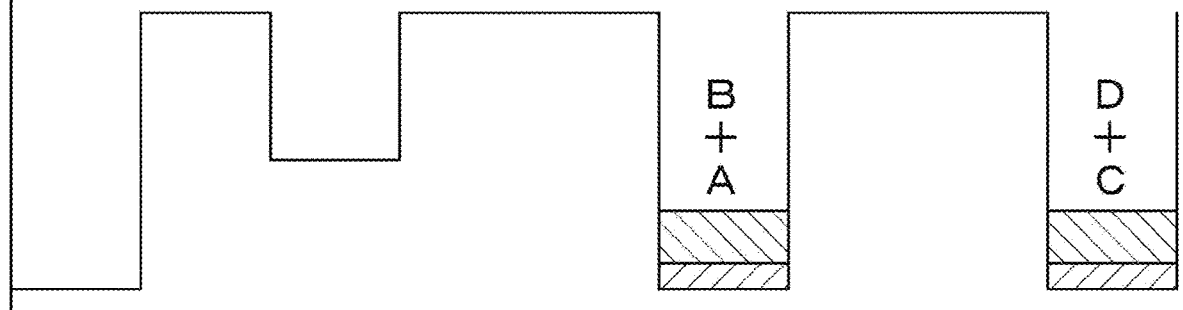

Subsequently, as depicted in FIGS. 32A and 32B, the charges "B+A" accumulated in the photoelectric conversion layer-second region 21B of the nth imaging element $10_n$ included in the N imaging elements 10 arranged in the second direction are transferred to the photoelectric conversion layer-second region 21B of the (n+1)th imaging element 10 according to an operation of the second charge transfer control electrode 26.

Specifically, the charges "B+A" accumulated in the first charge transfer control electrode 25 can be transferred to the second-A charge transfer control electrode $26_1$ by controlling the potentials of the first charge transfer control electrode 25 and the second-A charge transfer control electrode $26_1$.

[Step-340]

Figure 33A:
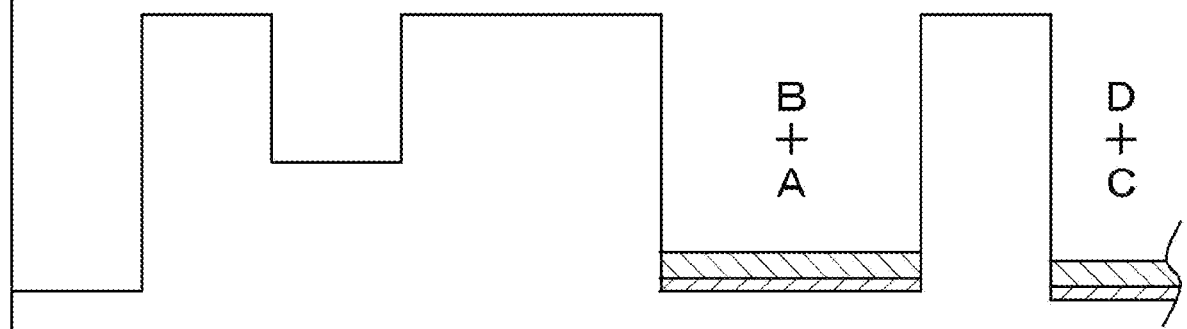
FIGS. 33A and 33B are diagrams continuing from FIG. 32B and schematically depicting a potential state and the like at respective parts of the imaging element constituting the solid-state imaging device of Embodiment 3 during operation.
Figure 33B:
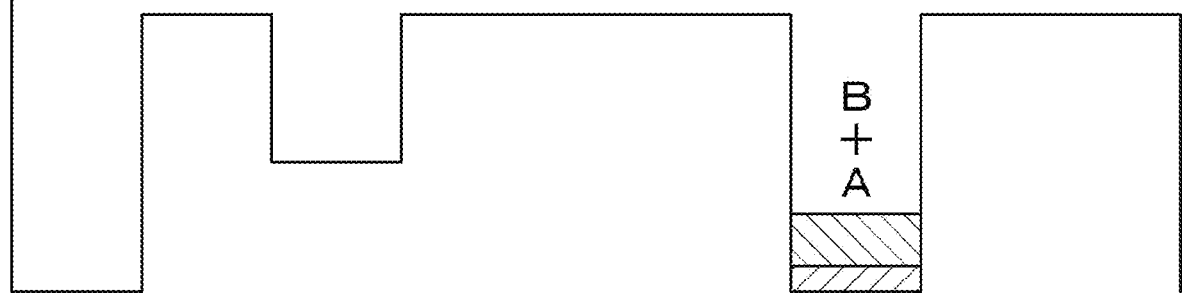

Subsequently, as depicted in FIGS. 33A and 33B, the charges "B+A" accumulated in the second-A charge transfer control electrode $26_1$ can be transferred to the second-B charge transfer control electrode $26_2$ by controlling the potentials of the second-A charge transfer control electrode $26_1$ and the second-B charge transfer control electrode $26_2$.

[Step-350]

Thereafter, as depicted in FIGS. 34A and 34B, the charges "B+A" accumulated in the second-B charge transfer control electrode $26_2$ can be transferred to the first charge transfer control electrode 25 of the (n+1)th imaging element $10_{(n+1)}$ by controlling the potentials of the second-B charge transfer control electrode $26_2$ and the first charge transfer control electrode 25 of the (n+1)th imaging element $10_{(n+1)}$. Moreover, the charge "E" accumulated in the second-B charge transfer control electrode $26_2$ of the (n−1)th imaging element $10_{(n-1)}$ can be transferred to the first charge transfer control electrode 25 of the nth imaging element $10_n$ by controlling the potentials of the second-B charge transfer control electrode $26_2$ of the (n−1)th imaging element $10_{(n-1)}$ and the first charge transfer control electrode 25 of the nth imaging element $10_n$.

Thereafter, the operations of the imaging elements as described above are repeated.

Embodiment 4

Figure 35:
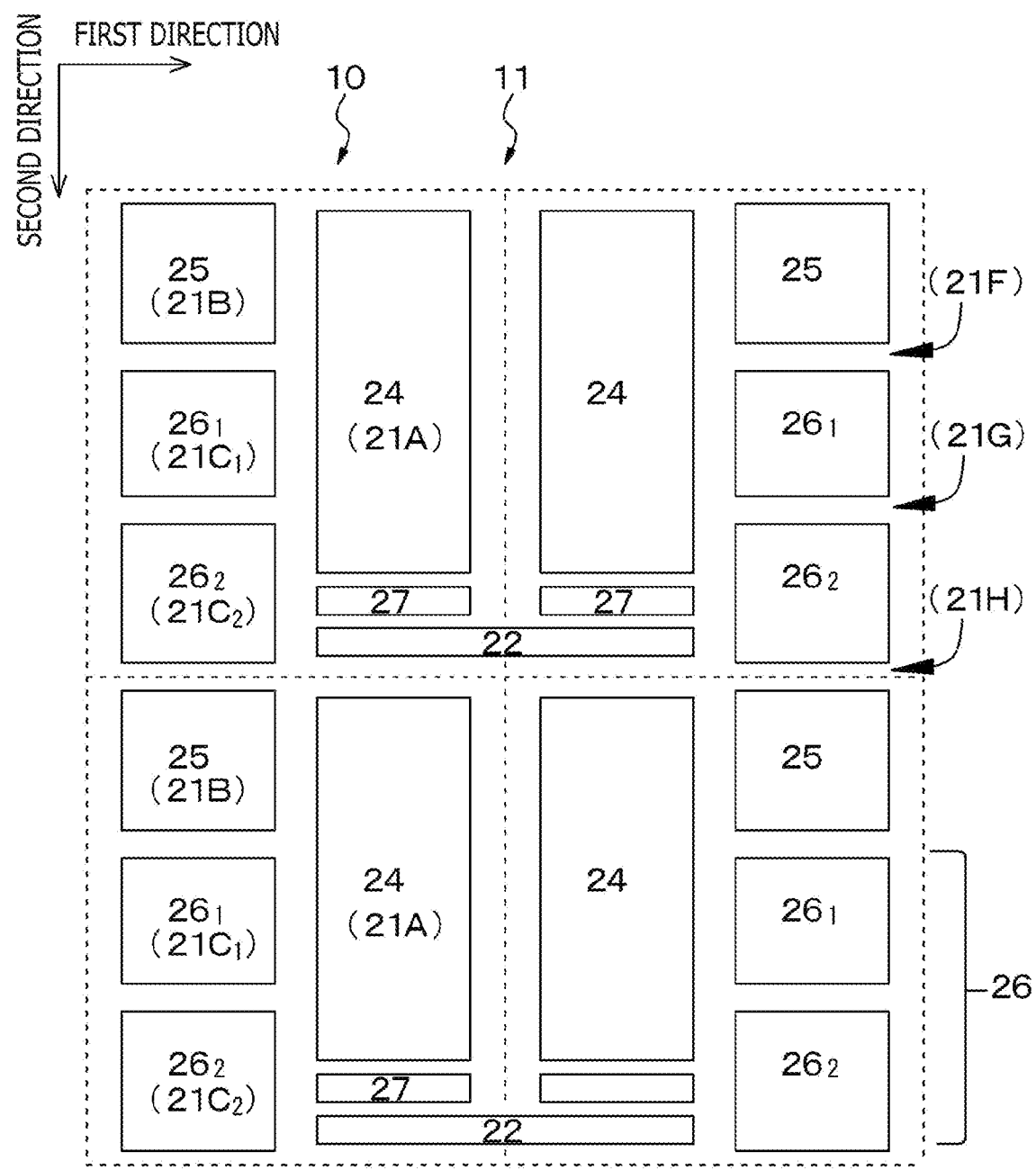
FIG. 35 is a diagram schematically depicting an arrangement of various types of electrodes included in an imaging element constituting a solid-state imaging device of Embodiment 4.
Figure 36:
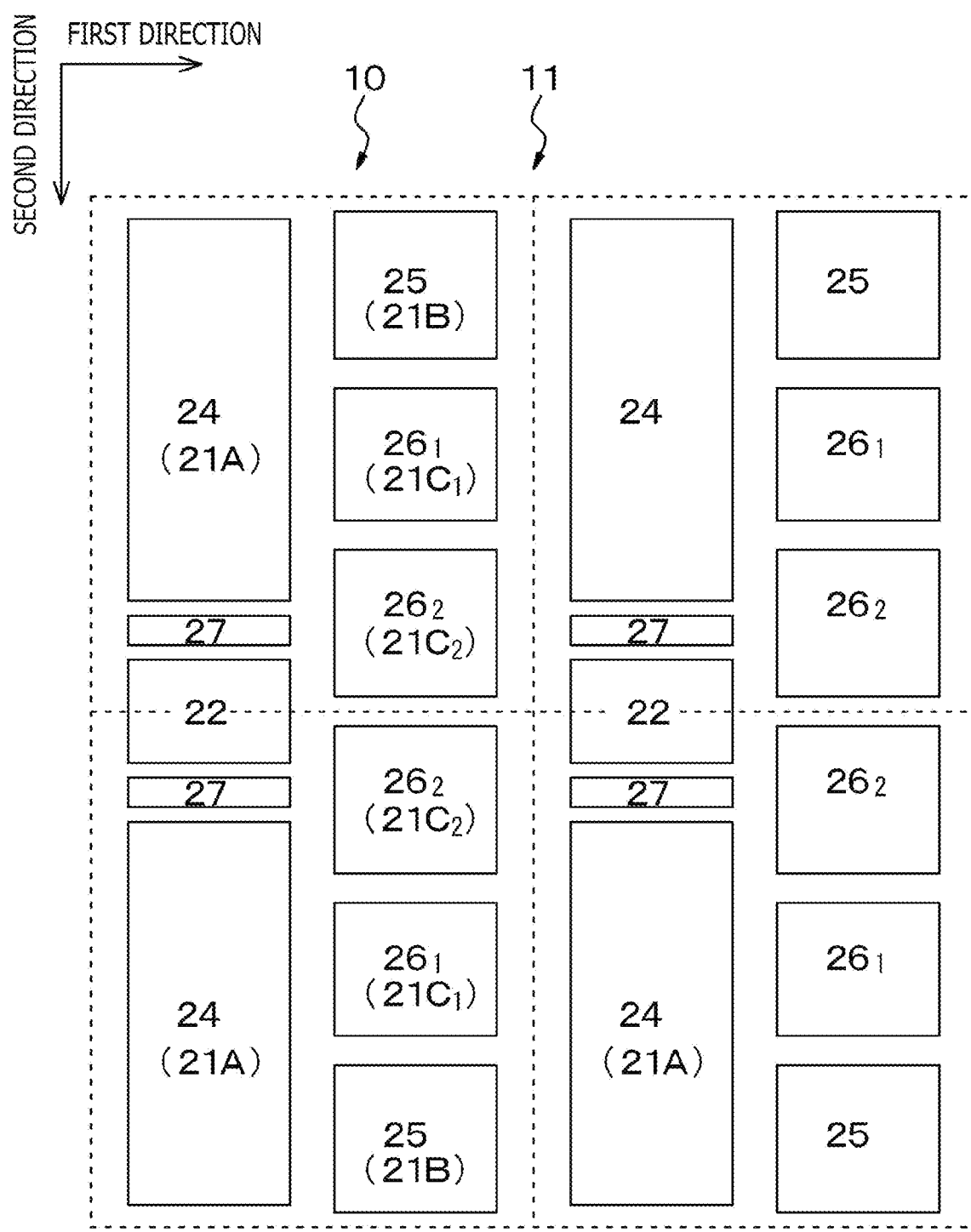
FIG. 36 is a diagram schematically depicting an arrangement of various types of electrodes included in an imaging element constituting Modification 1 of the solid-state imaging device of Embodiment 4.

Embodiment 4 is a modification of Embodiments 1 to 3. FIG. 35 schematically depicts an arrangement of a charge discharge electrode, a reset electrode, a charge accumulation electrode, a first charge transfer control electrode, and a second charge transfer control electrode of each of imaging elements constituting a solid-state imaging device of Embodiment 4 as a modification of Embodiment 1. According to the solid-state imaging device of Embodiment 4, charges remaining in the photoelectric conversion layer-first region 21A constituting each of the two imaging elements 10 disposed side by side in the first direction are discharged to the outside of the system according to the operation of the common charge discharge electrode 22. The charge discharge electrode 22 is provided as a common electrode shared by the two imaging elements 10 disposed adjacent to each other in the first direction. Specifically, the one charge discharge electrode 22 is provided for the two imaging elements 10 disposed adjacent to each other (side by side) in the first direction. Note that charges remaining in the photoelectric conversion layer-first region 21A constituting each of the two imaging elements 10 disposed side by side in the first direction are discharged to the outside of the system according to the operation of the common charge discharge electrode 22 in the example depicted in FIG. 35. However, also adoptable is such a configuration where charges remaining in the photoelectric conversion layer-first region 21A constituting each of the two imaging elements 10 disposed side by side in the second direction are discharged to the outside of the system according to the operation of the common charge discharge electrode 22 as in an example depicted in FIG. 36.

Figure 37:
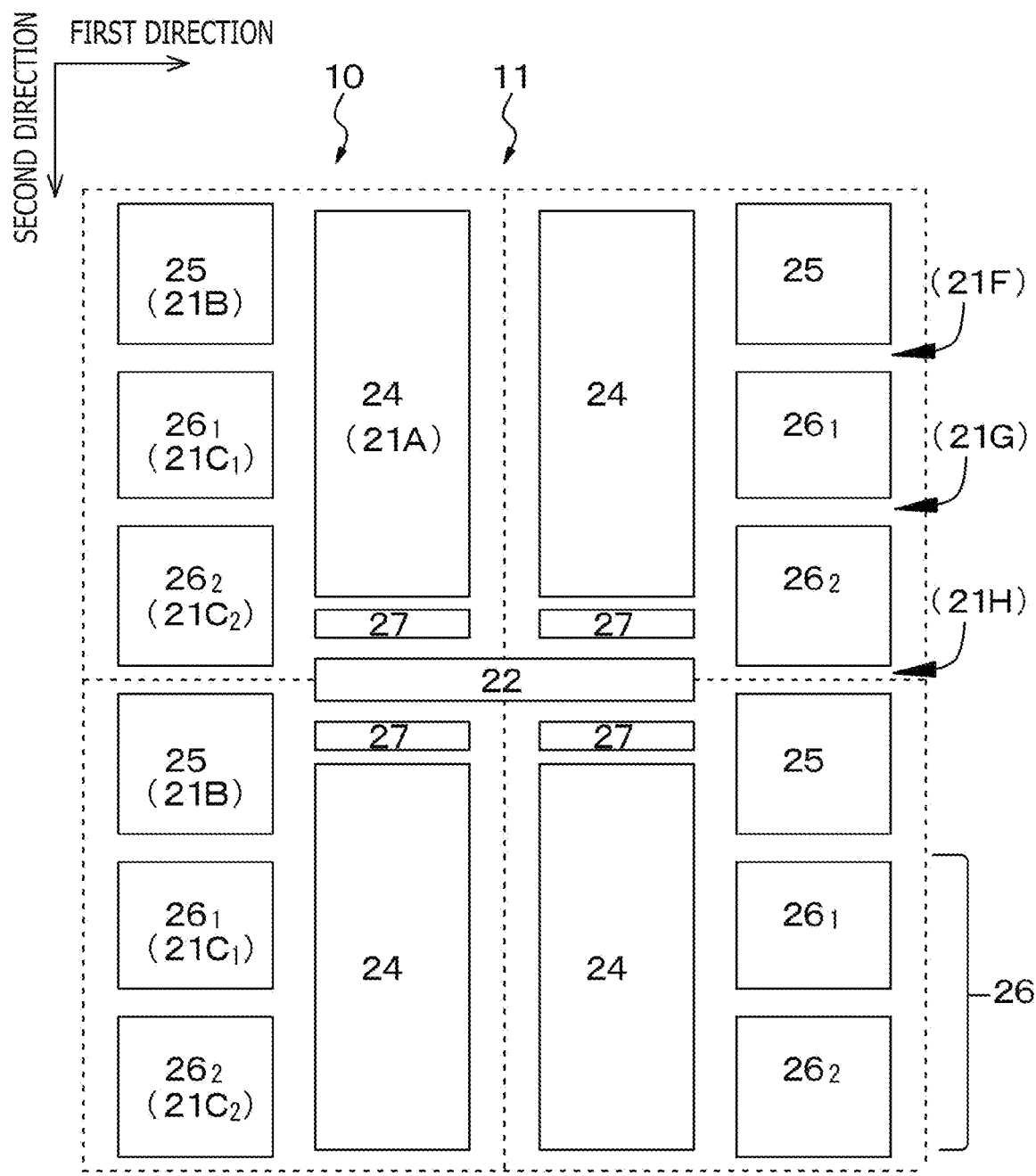
FIG. 37 is a diagram schematically depicting an arrangement of various types of electrodes included in an imaging element constituting Modification 2 of the solid-state imaging device of Embodiment 4.

Alternatively, FIG. 37 schematically depicts an arrangement of the charge discharge electrode, the reset electrode, the charge accumulation electrode, the first charge transfer control electrode, and the second charge transfer control electrode included in each of the imaging elements constituting Modification 2 of the solid-state imaging device of Embodiment 4. In this case, the charge discharge electrode 22 is provided as a common electrode shared by the four imaging elements 10 in total, i.e., the two imaging elements 10 adjacent to each other in the second direction, and the two imaging elements 10 adjacent to these two imaging elements 10 in the first direction. In other words, the one charge discharge electrode 22 is provided for the four imaging elements 10.

Configurations and structures of the solid-state imaging device and the imaging elements of Embodiment 4 may be similar to the configurations and the structures of the solid-state imaging device and the imaging elements described in Embodiment 1, the modifications of Embodiment 1, Embodiment 2, and Embodiment 3 except for the foregoing points. Accordingly, detailed description of these configurations and structures is omitted.

Embodiment 5

Figure 38:
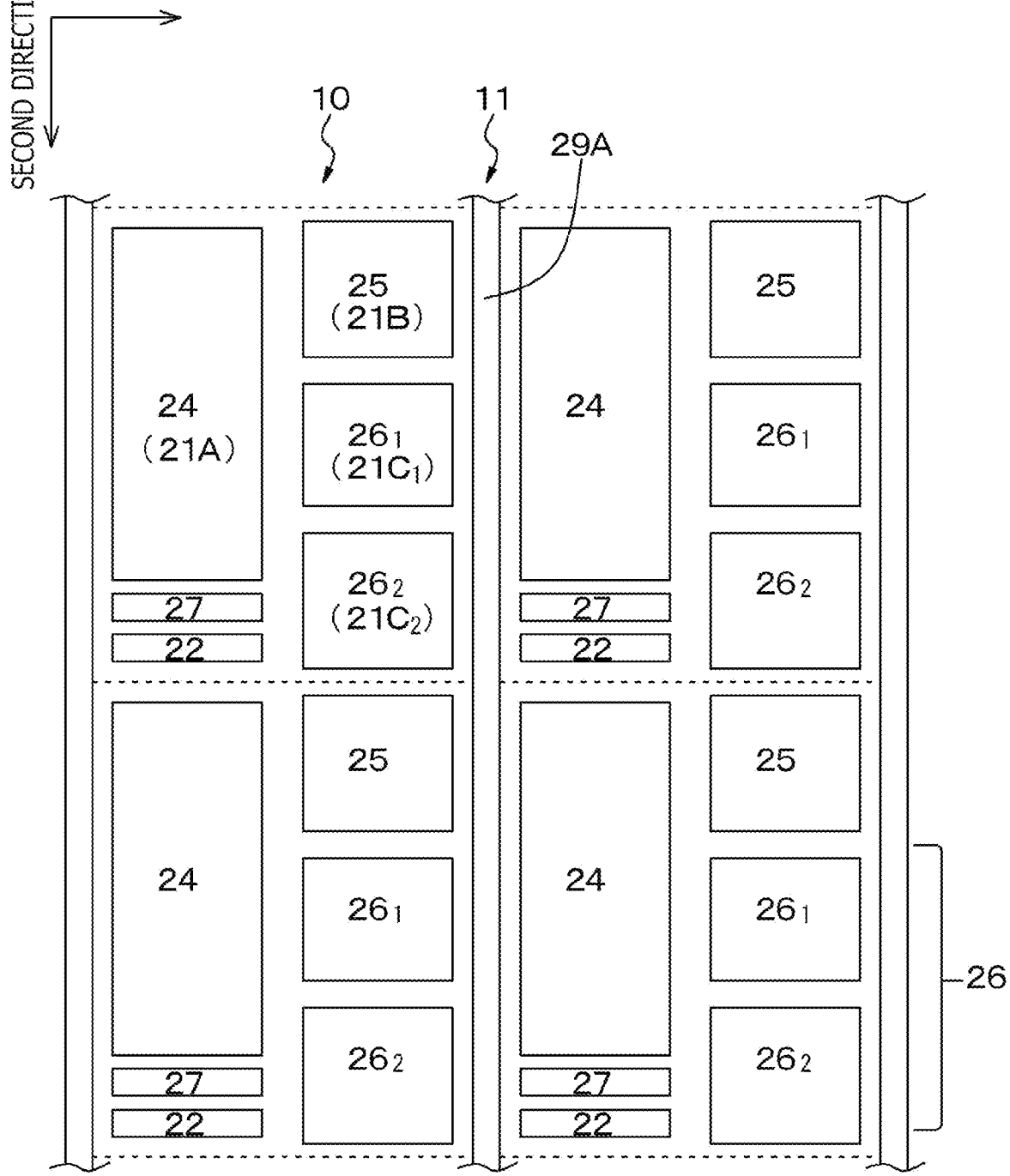
FIG. 38 is a diagram schematically depicting an arrangement of various types of electrodes included in an imaging element constituting a solid-state imaging device of Embodiment 5.

Embodiment 5 is a modification of Embodiments 1 to 4. FIG. 38 schematically depicts an arrangement of a charge discharge electrode, a reset electrode, a charge accumulation electrode, a first charge transfer control electrode, and a second charge transfer control electrode of each of imaging elements constituting a solid-state imaging device of Embodiment 5 as a modification of Embodiment 1. According to the solid-state imaging device of Embodiment 5, an element separation electrode 29A is provided between an mth (m: any positive integer ranging from 1 to (M−1)) imaging element $10_m$ and an (m+1)th imaging element $10_{(m+1)}$. Specifically, the element separation electrode 29A is provided in the imaging element boundary region 11. The element separation electrode 29A is disposed away from the first charge transfer control electrode 25 and the second charge transfer control electrode 26. The element separation electrode 29A may be formed continuously to cover a plurality of the imaging elements or may be formed for each of the imaging elements.

Figure 39:
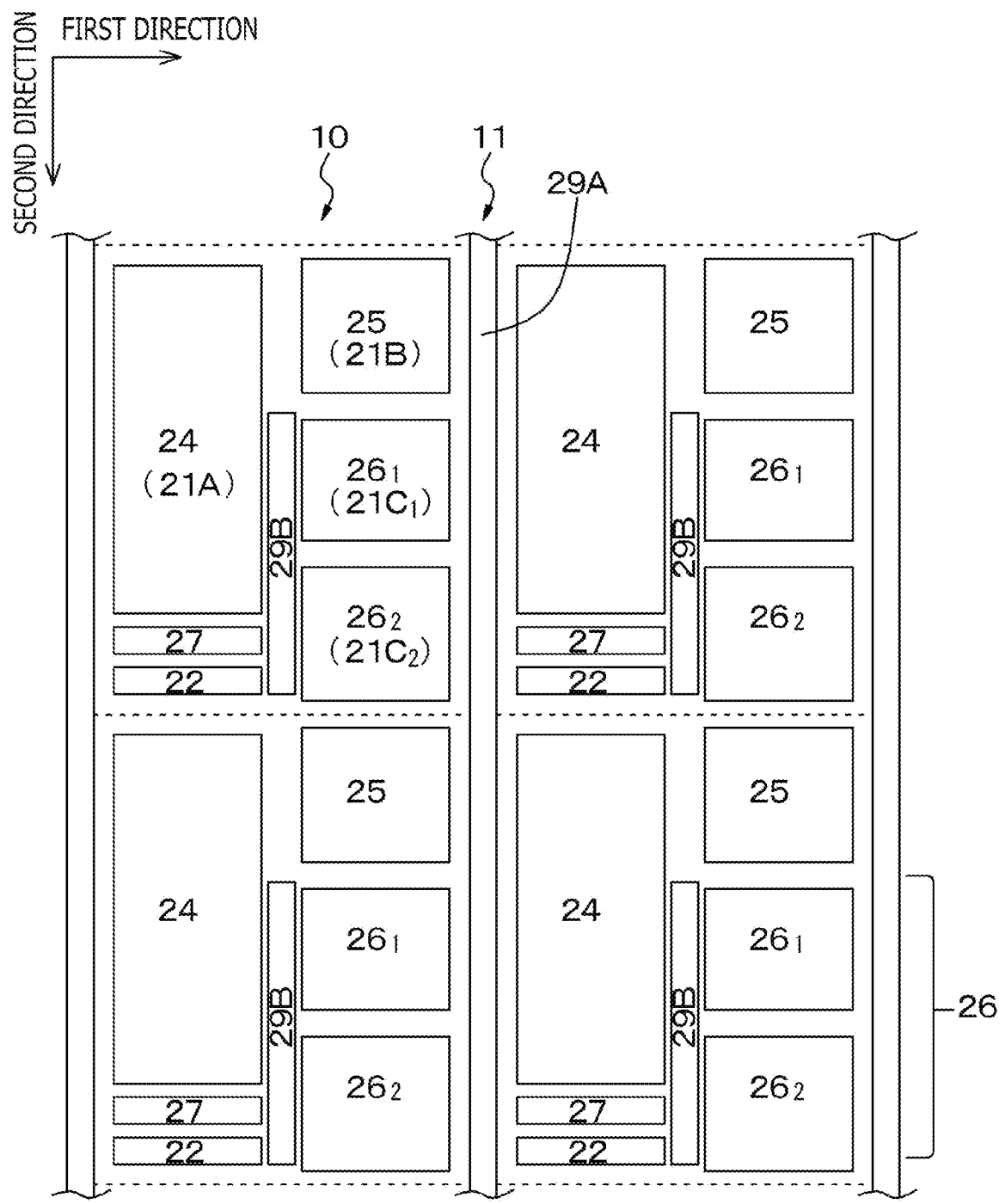
FIG. 39 is a diagram schematically depicting an arrangement of various types of electrodes included in an imaging element constituting Modification 1 of the solid-state imaging device of Embodiment 5.

Moreover, FIG. 39 schematically depicts an arrangement of a charge discharge electrode, a reset electrode, a charge accumulation electrode, a first charge transfer control electrode, and a second charge transfer control electrode of each of the imaging elements constituting a solid-state imaging device of Modification 1 of Embodiment 5. According to the solid-state imaging device of Modification 1 of Embodiment 5, a second element separation electrode 29B is provided between the charge accumulation electrode 24 and the second charge transfer control electrode 26. The second element separation electrode 29B is disposed away from the charge accumulation electrode 24 and the second charge transfer control electrode 26.

Configurations and structures of the solid-state imaging device and the imaging elements of Embodiment 5 or the modification of these may be similar to the configurations and the structures of the solid-state imaging device and the imaging elements described in Embodiment 1, the modification of Embodiment 1, Embodiment 2, Embodiment 3, and Embodiment 4 except for the foregoing points. Accordingly, detailed description of these configurations and structures is omitted.

Embodiment 6

The present disclosure is applicable not only to a solid-state imaging device, but also to an imaging device. The imaging device here refers to a camera system such as a digital still camera, a video camera, a camcorder, a monitoring camera, a vehicle-mounted camera (in-vehicle camera), an electronic device having an imaging function such as a smartphone camera, a user interface camera for gaming, and a biometric authentication camera. The imaging device is a module-shaped form mounted on an electronic device, i.e., a camera module in some cases.

According to the solid-state imaging device of Embodiment 6, charges remaining in the photoelectric conversion layer-first region 21A are discharged to the outside according to the operation of the charge discharge electrode 22 of each of the imaging elements 10 in a step similar to [step-100] of Embodiment 1, [step-200] of Embodiment 2, and [step-300] of Embodiment 3.

Subsequently, light is applied to the photoelectric conversion layer 21 of each of the imaging elements with a voltage kept being applied to the upper electrode 23 and the charge accumulation electrode 24 to accumulate charges in the photoelectric conversion layer-first region 21A of each of the imaging elements in a step similar to [step-110] of Embodiment 1, [step-210] of Embodiment 2, and [step-310] of Embodiment 3.

Thereafter, charges accumulated in the photoelectric conversion layer-first region 21A of each of the imaging elements 10 are transferred to the photoelectric conversion layer-second region 21B in a step similar to [step-120] of Embodiment 1, [step-220] of Embodiment 2, and [step-320] of Embodiment 3. No charge is accumulated in addition to charges already accumulated in the photoelectric conversion layer-second region unlike Embodiments 1 to 4.

Subsequently, charges accumulated in the photoelectric conversion layer-second region $21B_N$ of the Nth imaging element $10_N$ in the N imaging elements arranged in the second direction are transported to the floating diffusion layer FD via the photoelectric conversion layer-third region $21C_N$ of the Nth imaging element $10_N$, and further sent to the analog/digital conversion circuit or the register circuit. Thereafter, the photoelectric conversion layer-second region $21B_N$ and the photoelectric conversion layer-third region $21C_N$ of the Nth imaging element, and the floating diffusion layer FD are reset.

Subsequently, charges accumulated in the photoelectric conversion layer-second region $21B_{(N-1)}$ of the (N−1)th imaging element $10_{(N-1)}$ are transported to the floating diffusion layer FD via the photoelectric conversion layer-third region $21C_{(N-1)}$ of the (N−1)th imaging element $10_{(N-1)}$, and the photoelectric conversion layer-second region $21B_N$ and the photoelectric conversion layer-third region $21C_N$ of the Nth imaging element $10_N$, and further sent to the analog/digital conversion circuit or the register circuit. Thereafter, the photoelectric conversion layer-second region $21B_{(N-1)}$ and the photoelectric conversion layer-third region $21C_{(N-1)}$ of the (N−1)th imaging element $10_{(N-1)}$, and the photoelectric conversion layer-second region $21B_N$ and the photoelectric conversion layer-third region $21C_N$ of the Nth imaging element $10_N$, and the floating diffusion layer FD are reset.

Subsequently, charges accumulated in the photoelectric conversion layer-second region $21B_{(N-2)}$ of the (N−2)th imaging element $10_{(N-2)}$ are transported to the floating diffusion layer FD via the photoelectric conversion layer-third region $21C_{(N-2)}$ of the (N−2)th imaging element $10_{(N-2)}$, the photoelectric conversion layer-second region $21B_{(N-1)}$ and the photoelectric conversion layer-third region $21C_{(N-1)}$ of the (N−1)th imaging element $10_{(N-1)}$, and the photoelectric conversion layer-second region $21B_N$ and the photoelectric conversion layer-third region $21C_N$ of the Nth imaging element $10_N$, and further sent to the analog/digital conversion circuit or the register circuit. Thereafter, the photoelectric conversion layer-second region $21B_{(N-2)}$ and the photoelectric conversion layer-third region $21C_{(N-2)}$ of the (N−2)th imaging element $10_{(N-2)}$, the photoelectric conversion layer-second region $21B_{(N-1)}$ and the photoelectric conversion layer-third region $21C_{(N-1)}$ of the (N−1)th imaging element $10_{(N-1)}$, the photoelectric conversion layer-second region $21B_N$ and the photoelectric conversion layer-third region $21C_N$ of the Nth imaging element $10_N$, and the floating diffusion layer FD are reset.

Then, the foregoing operations are only required to be repeated until n becomes 1.

The present disclosure described above on the basis of the preferred embodiments is not limited to these embodiments. The structures, the configurations, the manufacturing methods, and the used materials of the imaging elements and the solid-state imaging devices described in the embodiments are presented by way of example and may be modified in an appropriate manner. For example, the light shielding layer may cover a region of the photoelectric conversion layer other than the photoelectric conversion layer-first region. Moreover, various types of wiring layers provided on the light entrance side with respect to the photoelectric conversion layer may function as the light shielding layer. The solid-state imaging device of the present disclosure is applicable not only to a solid-state imaging device which detects a distribution of an incident visible light amount and images the distribution as an image, but also to a solid-state imaging device which images a distribution of an irradiance of infrared light, X-rays, particles, or the like as an image. The solid-state imaging device may have a form constituted as one chip, or a module-shaped form which has an imaging region, and an imaging function obtained by combining and packaging driving circuits or optical systems.

Figure 40:
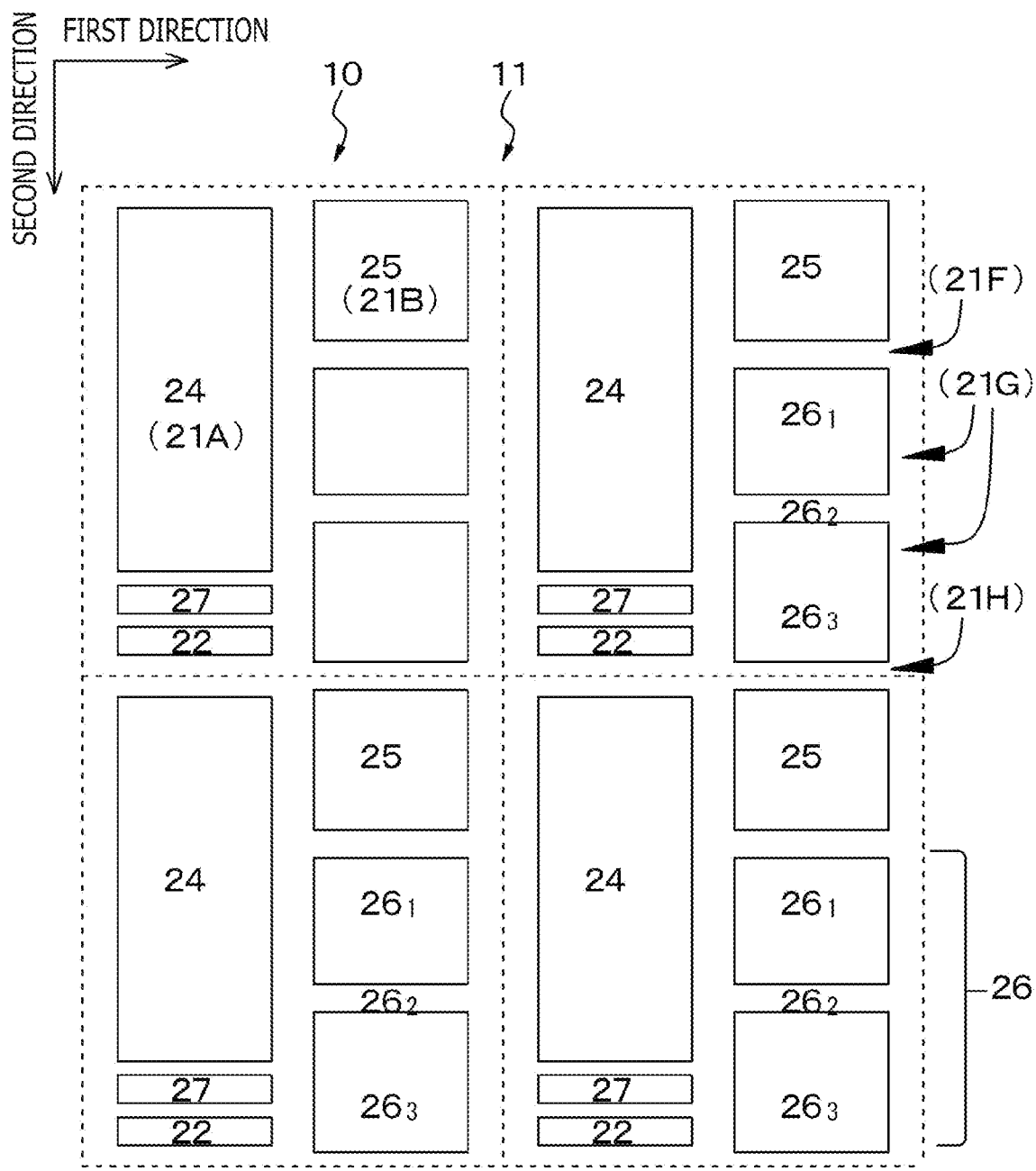
FIG. 40 is a diagram schematically depicting an arrangement of a charge discharge electrode, a reset electrode, a charge accumulation electrode, a first charge transfer control electrode, and a second charge transfer control electrode included in an imaging element constituting Modification 4 of the solid-state imaging device of Embodiment 1.

According to the embodiments, the second charge transfer control electrode includes the two pieces of the second charge transfer control electrode such as the second-A charge transfer control electrode and the second-B charge transfer control electrode. However, as schematically depicted in FIG. 40 which presents an arrangement of a charge discharge electrode, a reset electrode, a charge accumulation electrode, a first charge transfer control electrode, and a second charge transfer control electrode of each of the imaging elements constituting Modification 4 of the solid-state imaging device of Embodiment 1, the second charge transfer control electrode can include the three or more second charge transfer control electrodes (the three second charge transfer control electrodes $26_1$, $26_2$, and $26_3$ in the depicted example). Such a configuration is also applicable to the other embodiments.

The solid-state imaging device can have a stack structure including a stack of a first type green light imaging element (first imaging element) including a green light photoelectric conversion layer for absorbing green light (light in a range from 495 to 570 nm), a first type blue light imaging element (second imaging element) including a blue light photoelectric conversion layer for absorbing blue light (light in a range from 425 to 495 nm), and a first type red light imaging element (third imaging element) including a red light photoelectric conversion layer for absorbing red light (light in a range from 620 to 750 nm). Specifically, the stacked imaging element is produced by stacking three layers of the imaging elements described in Embodiments 1 to 5. In this case, it is preferable that a light transmittance of the charge accumulation electrode for light having a wavelength in a range from 400 to 660 nm be 65% or more. Moreover, it is preferable that a sheet resistance value of the charge accumulation electrode be in a range from $3\times10\Omega/\square$ to $1\times10^3\Omega/\square$.

Alternatively, the stacked imaging element which includes at least the one imaging element and the like (photoelectric conversion element) of the present disclosure can be adopted. Specifically, the following are adoptable, for example.

[A] A configuration and a structure in which
a first type blue light photoelectric conversion unit, a first type green light photoelectric conversion unit, and a first type red light photoelectric conversion unit are stacked in the vertical direction, and
each of control units of the first blue light imaging element, the first type green light imaging element, and the first type red light imaging element is provided on a semiconductor substrate

[B] A configuration and a structure in which
the first type blue light photoelectric conversion unit and the first type green light photoelectric conversion unit are stacked in the vertical direction,
a second type red light photoelectric conversion unit is disposed below these two first type photoelectric conversion units, and
each of control units of the first type blue light imaging element, the first type green light imaging element, and the second type red light imaging element is provided on the semiconductor substrate

[C] A configuration and a structure in which
a second type blue light photoelectric conversion unit and the second type red light photoelectric conversion unit are disposed below the first type green light photoelectric conversion unit, and
each of the control units of the first type green light imaging element, the second type blue light imaging element, and the second type red light imaging element is provided on the semiconductor substrate

[D] A configuration and a structure in which
a second type green light photoelectric conversion unit and the second type red light photoelectric conversion unit are disposed below the first type blue light photoelectric conversion unit, and each of the control units of the first type blue light imaging element, the second type green light imaging element, and the second type red light imaging element is provided on the semiconductor substrate.

The first type imaging element includes each of the imaging elements described in Embodiments 1 to 5. In a case where the red light photoelectric conversion unit is the second type, it is preferable that the arrangement order of the photoelectric conversion units of these imaging elements be an order of the blue light photoelectric conversion unit, the green light photoelectric conversion unit, and the red light photoelectric conversion unit from the light entrance side, or in an order of the green light photoelectric conversion unit, the blue light photoelectric conversion unit, and the red light photoelectric conversion unit from the light entrance side. These orders are preferable because light having a shorter wavelength is more efficiently absorbed on the entrance surface side of the semiconductor substrate (specifically, silicon semiconductor substrate or silicon layer). Red has the longest wavelength in the three colors. Accordingly, it is preferable that the red light photoelectric conversion unit be disposed in the lowermost layer as viewed from the light entrance surface. The stack structure of these imaging elements constitutes one pixel. Moreover, a first type near infrared light photoelectric conversion unit (or infrared light photoelectric conversion unit) may be provided. It is preferable here that a photoelectric conversion layer of the first type infrared light photoelectric conversion unit include an organic material, for example, correspond to the lowermost layer of the stack structure of the first type imaging element, and be located above the second type imaging element. Alternatively, a second type near infrared light photoelectric conversion unit (or infrared light photoelectric conversion unit) may be provided below the first type photoelectric conversion unit. The following table presents examples of the stack structure of the first type imaging element and the second type imaging element.

|  | FIRST TYPE | SECOND TYPE |
| --- | --- | --- |
| BACK-ILLUMINATED TYPE AND FRONT-ILLUMINATED TYPE | 1 GREEN<br>1 PRIMARY COLOR<br>1 WHITE | 2 BLUE + RED<br>1 COMPLEMENTARY COLOR<br>1 INFRARED LIGHT |
|  | 1 BLUE OR GREEN OR RED | 0 |
|  | 2 GREEN + INFRARED LIGHT | 2 BLUE + RED |
|  | 2 GREEN + BLUE | 1 RED |
|  | 2 WHITE + INFRARED LIGHT | 0 |
|  | 3 GREEN + BLUE + RED | 2 BLUE-GREEN (EMERALD) + INFRARED LIGHT |
|  | 3 GREEN + BLUE + RED | 1 INFRARED LIGHT |
|  | 3 BLUE + GREEN + RED | 0 |

According to the solid-state imaging device including the stacked imaging elements, one pixel includes a stack of imaging elements each having sensitivity to light each having different types of wavelengths in an incident light direction within the same pixel unlike a solid-state imaging device including imaging elements arranged in a Bayer array (i.e., not performing diffraction of light into blue light, green light, and red light by using a color filter layer). Accordingly, improvement of sensitivity and improvement of pixel density per unit volume are achievable. Moreover, an organic material has a high absorption coefficient. In this case, the film thickness of the organic photoelectric conversion layer can be more reduced than that of a conventional Si photoelectric conversion layer. Accordingly, light leakage from adjoining pixels and a limitation to an incident angle of light can decrease. Moreover, while a conventional Si imaging element produces a false color as a result of an interpolation process between pixels in three colors for generation of color signals, the solid-state imaging device of the present disclosure including the stacked imaging elements can reduce a false color. The organic photoelectric conversion layer itself functions as a color filter layer as well. Accordingly, color separation is achievable without a necessity of providing a color filter layer.

According to the configurations of the embodiments, each of the first charge transfer control electrode and the second charge transfer control electrode is so disposed as to face the first surface of the photoelectric conversion layer via the insulation layer and located away from the charge discharge electrode and the charge accumulation electrode. Alternatively, each of the first charge transfer control electrode and the second charge transfer control electrode can be configured to be so disposed as to face the second surface of the photoelectric conversion layer via an upper insulation layer formed on the second surface of the photoelectric conversion layer and located away from the upper electrode. Moreover, each of the first charge transfer control electrode and the second charge transfer control electrode can include a material not transmitting light to function as a light shielding layer as well.

The charge accumulation electrode described in the embodiments may be modified in a manner described below.

Specifically, the charge accumulation electrode 24 may have a form including a plurality of charge accumulation electrode segments. The number of the charge accumulation electrode segments is only required to be two or larger. In addition, in a case where a different potential is given to each of the Q charge accumulation electrode segments, on an assumption that charges to be accumulated are electrons, adoptable is such a form where a potential applied to the charge accumulation electrode segment located closest to the first charge transfer control electrode 25 (first photoelectric conversion unit segment) can be higher than a potential applied to the charge accumulation electrode segment located farthest from the first charge transfer control electrode 25 (Qth photoelectric conversion unit segment) in the charge transfer period in a case where the potential of the first charge transfer control electrode 25 is lower than the potential of the upper electrode.

Alternatively, imaging elements having the following first to sixth configurations are adoptable as modifications of the imaging element of the present disclosure. Specifically, in each of the imaging elements having the first to sixth configurations, the photoelectric conversion unit includes Q (Q≥2) photoelectric conversion unit segments, the photoelectric conversion layer-first region 21A includes Q photoelectric conversion layer segments, and the insulation layer 32 includes Q insulation layer segments.

In each of the imaging elements having the first to third configurations, the charge accumulation electrode 24 includes Q charge accumulation electrode segments, in each of the imaging elements having the fourth to fifth configurations, the charge accumulation electrode 24 includes Q charge accumulation electrode segments disposed away from each other, the qth (q=1, 2, 3, and up to Q) photoelectric conversion unit segment includes the qth charge accumulation electrode segment, the qth insulation layer segment, and the qth photoelectric conversion layer segment, and the distance from the first charge transfer control electrode 25 increases as the value q of the photoelectric conversion unit segment becomes larger.

In addition, in the imaging element having the first configuration, the thickness of the insulation layer segment gradually changes from the first photoelectric conversion unit segment to the Qth photoelectric conversion unit segment. Moreover, in the imaging element having the second configuration, the thickness of the photoelectric conversion layer segment gradually changes from the first photoelectric conversion unit segment to the Qth photoelectric conversion unit segment. Further, in the imaging element having the third configuration, the material constituting the insulation layer segment of each of the photoelectric conversion unit segments is different from the material constituting the insulation layer segment of the adjoining photoelectric conversion unit segment. In addition, in the imaging element having the fourth configuration, the material constituting the charge accumulation electrode segment of each of the photoelectric conversion unit segments is different from the material constituting the charge accumulation electrode segment of the adjoining photoelectric conversion unit segment. Moreover, in the imaging element having the fifth configuration, the area of the charge accumulation electrode segment gradually decreases from the first photoelectric conversion unit segment to the Qth photoelectric conversion unit segment. The area may decrease either continuously or stepwise.

Alternatively, in the imaging element having the sixth configuration, assuming that the stack direction of the charge accumulation electrode 24, the insulation layer 32, and the photoelectric conversion layer 21 is a Z direction and that a direction away from the first charge transfer control electrode 25 is an X direction, a cross-sectional area taken along a stack portion of the charge accumulation electrode 24, the insulation layer 32, and the photoelectric conversion layer 21 stacked on a Y-Z virtual plane varies depending on the distance from the first charge transfer control electrode 25. The cross-sectional area may vary either continuously or stepwise.

In each of the imaging elements having the first to second configurations, the Q photoelectric conversion layer segments are continuously provided, the Q insulation layer segments are also continuously provided, and the Q charge accumulation electrode segments are also continuously provided. In each of the imaging elements having the third to fifth configurations, the Q photoelectric conversion layer segments are continuously provided. Moreover, the Q insulation layer segments are continuously provided in each of the imaging elements having the fourth and fifth configurations, while the Q insulation layer segments are provided for the respective photoelectric conversion unit segments with one-to-one correspondence in the imaging element having the third configuration. Further, the Q charge accumulation electrode segments are provided for the respective photoelectric conversion unit segments with one-to-one correspondence in each of the imaging elements having the fourth and fifth configurations, and in the imaging element having the third configuration depending on situations. In addition, in each of the imaging elements having the first to sixth configurations, the same potential is applied to all of the charge accumulation electrode segments. Alternatively, a different voltage may be applied to each of the Q charge accumulation electrode segments in each of the imaging elements having the fourth and fifth configurations, and in the imaging element having the third configuration depending on situations.

In each of the first to sixth configurations, the thickness of each of the insulation layer segments is specified, the thickness of each of the photoelectric conversion layer segments is specified, the materials constituting the insulation layer segments differ from each other, the materials constituting the charge accumulation electrode segments differ from each other, the area of each of the charge accumulation electrode segments is specified, or the cross-sectional area of the stack portion is specified. Accordingly, a type of charge transportation slope is formed, and charges generated by photoelectric conversion can be transferred to the first charge transfer control electrode 25 more easily and reliably. Moreover, generation of afterimages and incompletion of charge transportation are thus avoidable.

In each of the imaging elements having the first to fifth configurations, the distance from the first charge transfer control electrode 25 increases as the value q of the photoelectric conversion unit segment becomes larger. Whether or not the photoelectric conversion unit segment is located away from the first charge transfer control electrode 25 is determined on the basis of the X direction. Moreover, according to the imaging element having the sixth configuration, the direction away from the first charge transfer control electrode 25 is defined as the X direction. The "X direction" will be defined as follows. Specifically, a pixel region where a plurality of the imaging elements is arranged includes a plurality of pixels regularly arranged in the X direction and the Y direction. In a case where each of the pixels has a rectangular planar shape, the extension direction of the side closest to the first charge transfer control electrode 25 is designated as the Y direction, while the direction perpendicular to the Y direction is designated as the X direction.

Alternatively, in a case where each of the pixels has any planar shape, a general direction containing a line segment and a curve closest to the first charge transfer control electrode 25 is designated as the Y direction, while the direction perpendicular to the Y direction is designated as the X direction.

Hereinafter described will be a case where the potential of the first charge transfer control electrode 25 is higher than the potential of the upper electrode 23 in each of the imaging elements having the first to sixth configurations.

In the imaging element having the first configuration, the thickness of the insulation layer segment gradually changes from the first photoelectric conversion unit segment to the Qth photoelectric conversion unit segment. It is preferable that the thickness of each of the insulation layer segments gradually increase. In this case, a type of charge transportation slope is formed, and in the charge accumulation period, the qth photoelectric conversion unit segment can accumulate more charges than the (q+1)th photoelectric conversion unit segment, and a flow of charges from the first photoelectric conversion unit segment to the first charge transfer control electrode 25 is reliably preventable under an intensive electric field thus applied. Further, in the charge transfer period, a flow of charges from the first photoelectric conversion unit segment to the first charge transfer control electrode 25 and a flow of charges from the (q+1)th photoelectric conversion unit segment to the qth photoelectric conversion unit segment are reliably achieved.

In the imaging element having the second configuration, the thickness of the photoelectric conversion layer segment gradually changes from the first photoelectric conversion unit segment to the Qth photoelectric conversion unit segment. It is preferable that the thickness of each of the photoelectric conversion layer segments gradually increase. In this case, a type of charge transportation slope is formed, and in the charge accumulation period, a more intensive electric field is applied to the qth photoelectric conversion unit segment than to the (q+1)th photoelectric conversion unit segment, and a flow of charges from the first photoelectric conversion unit segment to the first charge transfer control electrode 25 is reliably preventable. Further, in the charge transfer period, a flow of charges from the first photoelectric conversion unit segment to the first charge transfer control electrode 25 and a flow of charges from the (q+1)th photoelectric conversion unit segment to the qth photoelectric conversion unit segment are reliably achieved.

In the imaging element having the third configuration, the material constituting the insulation layer segment of each of the photoelectric conversion unit segments is different from the material constituting the insulation layer segment of the adjoining photoelectric conversion unit segment. In this case, a type of charge transportation slope is formed. It is preferable that a value of relative permittivity of the material constituting the insulation layer segment gradually decrease from the first photoelectric conversion unit segment to the Qth photoelectric conversion unit segment. In addition, by adopting such a configuration, the qth photoelectric conversion unit segment can accumulate more charges than the (q+1)th photoelectric conversion unit segment in the charge accumulation period. Further, in the charge transfer period, a flow of charges from the first photoelectric conversion unit segment to the first charge transfer control electrode 25 and a flow of charges from the (q+1)th photoelectric conversion unit segment to the qth photoelectric conversion unit segment can be reliably achieved.

In the imaging element having the fourth configuration, the material constituting the charge accumulation electrode segment of each of the photoelectric conversion unit segments is different from the material constituting the charge accumulation electrode segment of the adjoining photoelectric conversion unit segment. In this case, a type of charge transportation slope is formed. It is preferable that a value of a work function gradually increase from the first photoelectric conversion unit segment to the Qth photoelectric conversion unit segment. In addition, by adopting such a configuration, a potential slope advantageous for signal charge transportation can be formed regardless of the positive value or the negative value of the voltage (potential).

In the imaging element having the fifth configuration, the area of the charge accumulation electrode segment gradually decreases from the first photoelectric conversion unit segment to the Qth photoelectric conversion unit segment. In this case, a type of charge transportation slope is formed. Accordingly, the qth photoelectric conversion unit segment can accumulate more charges than the (q+1)th photoelectric conversion unit segment. Further, in the charge transfer period, a flow of charges from the first photoelectric conversion unit segment to the first charge transfer control electrode 25 and a flow of charges from the (q+1)th photoelectric conversion unit segment to the qth photoelectric conversion unit segment can be reliably achieved.

In the imaging element having the sixth configuration, the cross-sectional area of the stack portion varies according to the distance from the first charge transfer control electrode 25. In this case, a type of charge transportation slope is formed. Specifically, by adopting such a configuration which fixes the thickness of the cross section of the stack portion to a certain thickness, and reduces the width of the cross section of the stack portion as the distance from the first charge transfer control electrode 25 becomes longer, a region close to the first charge transfer control electrode 25 can accumulate more charges than a far region in the charge accumulation period as in the case described in the imaging element having the fifth configuration. Accordingly, in the charge transfer period, a flow of charges from the region close to the first segment to the first charge transfer control electrode 25, and a flow of charges from the far region to the close region can be reliably achieved. On the other hand, by adopting such a configuration which fixes the width of the cross section of the stack portion to a certain width, and gradually increases the thickness of the cross section of the stack portion, specifically, the thickness of the insulation layer segment, the region close to the first charge transfer control electrode 25 can accumulate more charges than the far region in the charge accumulation period as in the case described in the imaging element having the first configuration. In addition, a flow of charges from the region close to the first charge transfer control electrode 25 to the first charge transfer control electrode 25 can be reliably prevented under an intensive electric field thus applied. Moreover, in the charge transfer period, a flow of charges from the region close to the first charge transfer control electrode 25 to the first charge transfer control electrode 25, and a flow of charges from the far region to the close region can be reliably achieved. Further, by adopting such a configuration which gradually increases the thickness of the photoelectric conversion layer segment, a flow of charges from the region close to the first charge transfer control electrode 25 to the first charge transfer control electrode 25 can be reliably prevented under a more intensive electric field applied to the region close to the first charge transfer control electrode 25 than to the far region in the charge accumulation period as in the case described in the imaging element having the second configuration. Moreover, in the charge transfer period, a flow of charges from the region close to the first charge transfer control electrode 25 to the first charge transfer control electrode 25 and a flow of charges from the far region to the close region can be reliably achieved.

Two types or more of the imaging elements having the first to sixth configurations including the preferred forms described above may be combined in an appropriate manner as desired.

Figure 42:
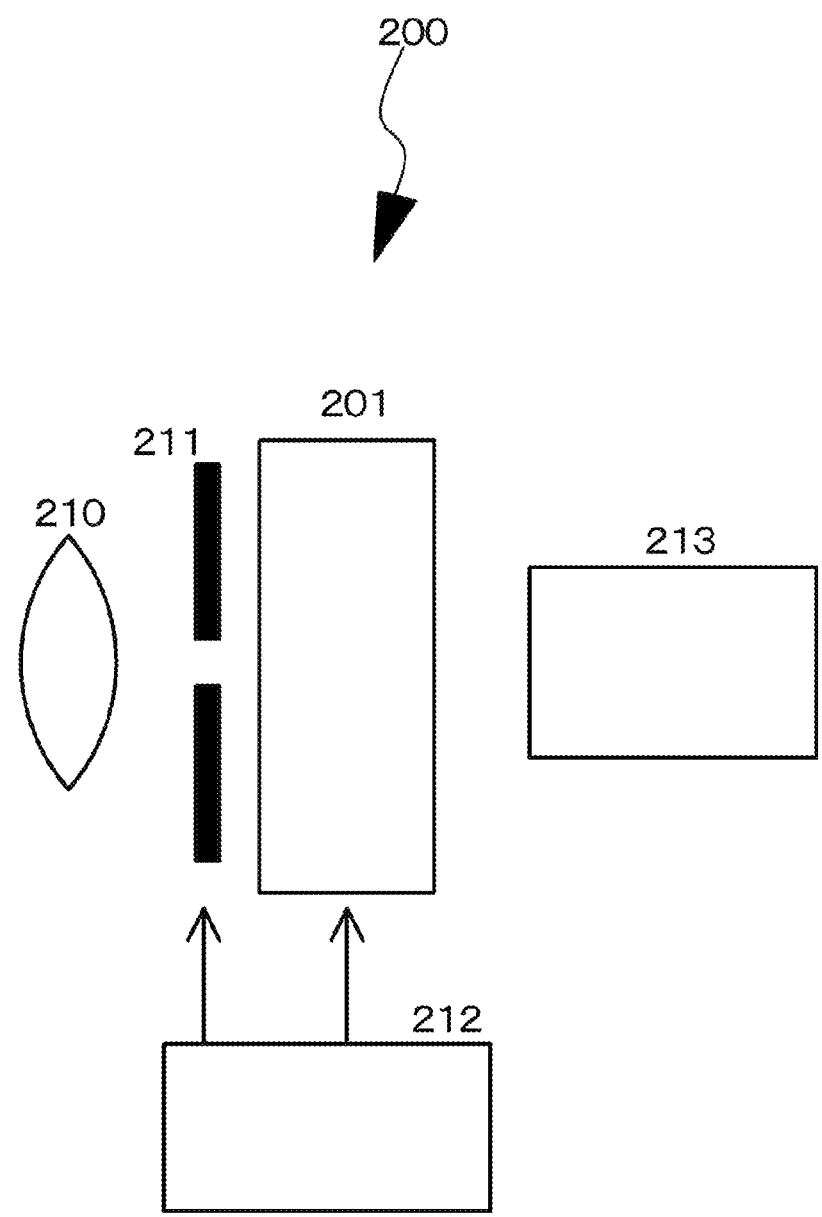
FIG. 42 is a conceptual diagram of an example which applies a solid-state imaging device including the imaging element of the present disclosure to an electronic device (camera).

FIG. 42 is a conceptual diagram of an example which applies a solid-state imaging device 201 including the imaging element of the present disclosure to an electronic device (camera) 200. The electronic device 200 includes a solid-state imaging device 201, an optical lens 210, a shutter device 211, a driving circuit 212, and a signal processing circuit 213. The optical lens 210 forms an image of image light (incident light) received from an object on an imaging surface of the solid-state imaging device 201. As a result, signal charges are accumulated within the solid-state imaging device 201 for a fixed period. The shutter device 211 controls periods of light irradiation and light shielding to and from the solid-state imaging device 201. The driving circuit 212 supplies driving signals for controlling transportation operations and the like of the solid-state imaging device 201 and a shutter operation of the shutter device 211. Signal transportation from the solid-state imaging device 201 is achieved according to the driving signals (timing signals)

supplied from the driving circuit 212. The signal processing circuit 213 performs various types of signal processing. Picture signals generated by signal processing are stored in a storage medium such as a memory or output to a monitor. The electronic device 200 thus configured is capable of achieving reduction of a pixel size and improvement of transportation efficiency of the solid-state imaging device 201. Accordingly, the electronic device 200 having improved pixel characteristics is providable. The electronic device 200 to which the solid-state imaging device 201 is applicable is not limited to a camera, and is also applicable to an imaging device including a digital still camera, a camera module for a mobile device such as a cellular phone, and others.

The technology according to the present disclosure (present technology) is applicable to various products. For example, the technology according to the present disclosure may be implemented as a device mounted on a mobile body of any one of types such as a car, an electric car, a hybrid electric car, a motorcycle, a bicycle, a personal mobility, an airplane, a drone, a vessel, and a robot.

Figure 43:
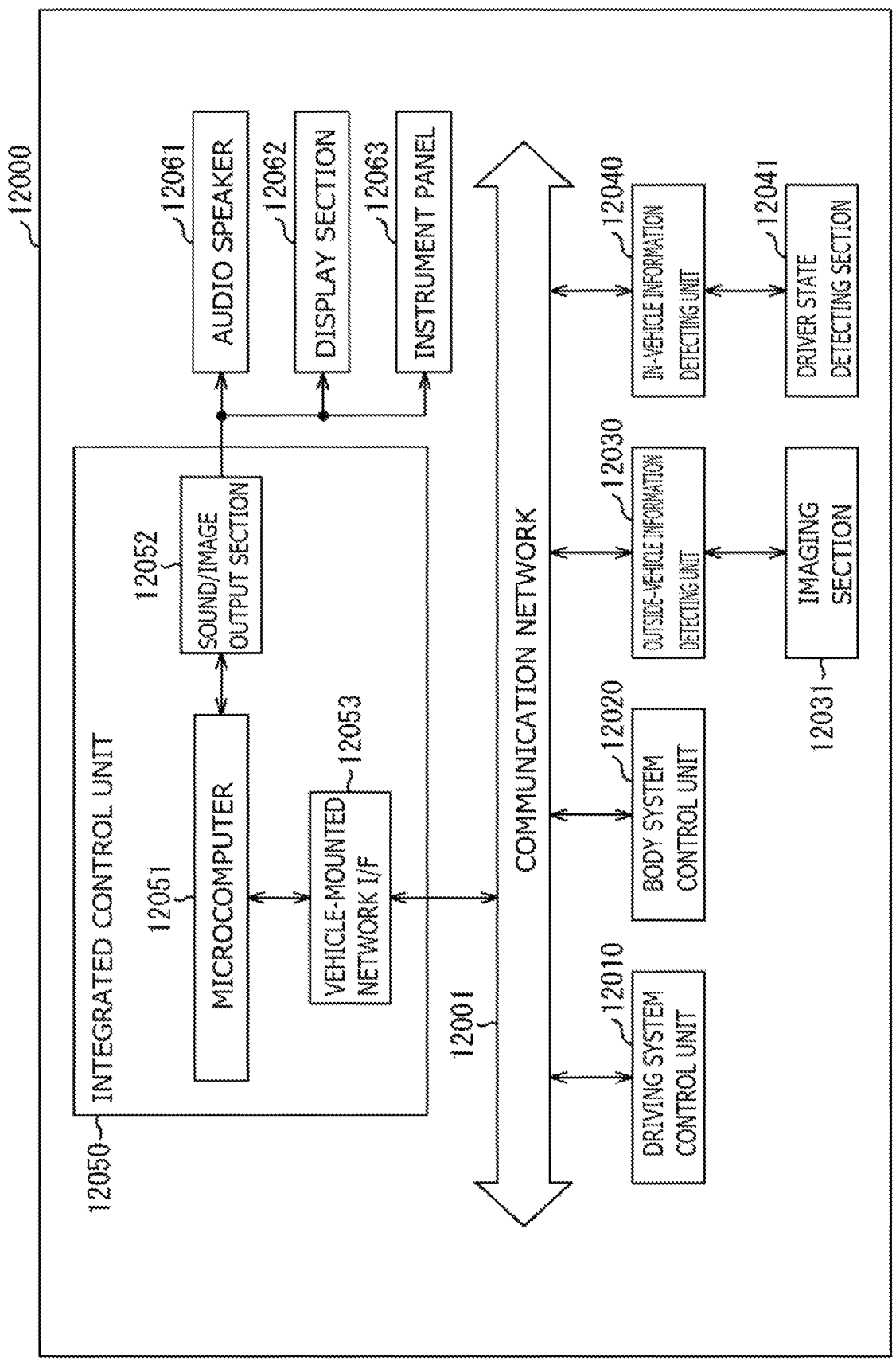
FIG. 43 is a block diagram depicting an example of schematic configuration of a vehicle control system.

FIG. 43 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 43, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 43, an audio speaker 12061, a display section 12062, and an instrument panel 12063 are illustrated as the output device. The display section 12062 may, for example, include at least one of an on-board display and a head-up display.

Figure 44:
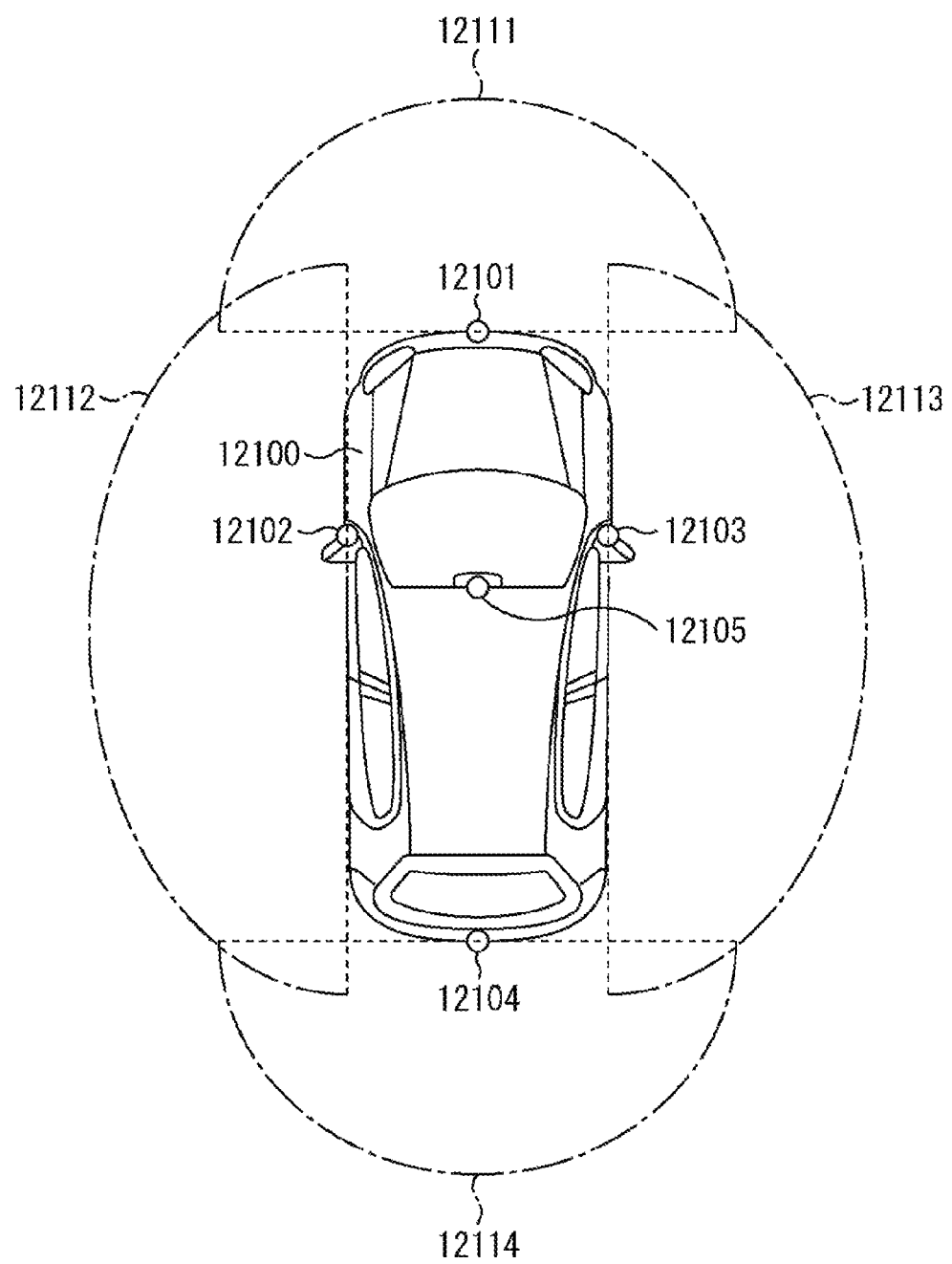
FIG. 44 is a diagram of assistance in explaining an example of installation positions of an outside-vehicle information detecting section and an imaging section.

FIG. 44 is a diagram depicting an example of the installation position of the imaging section 12031.

In FIG. 44, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front obtained by the imaging sections 12101 and 12105 is used mainly to detect a preceding vehicle, a pedestrian, an obstacle, a signal, a traffic sign, a lane, or the like.

Incidentally, FIG. 44 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Moreover, for example, the technology according to the present disclosure may be applied to an endoscopic surgery system.

Figure 45:
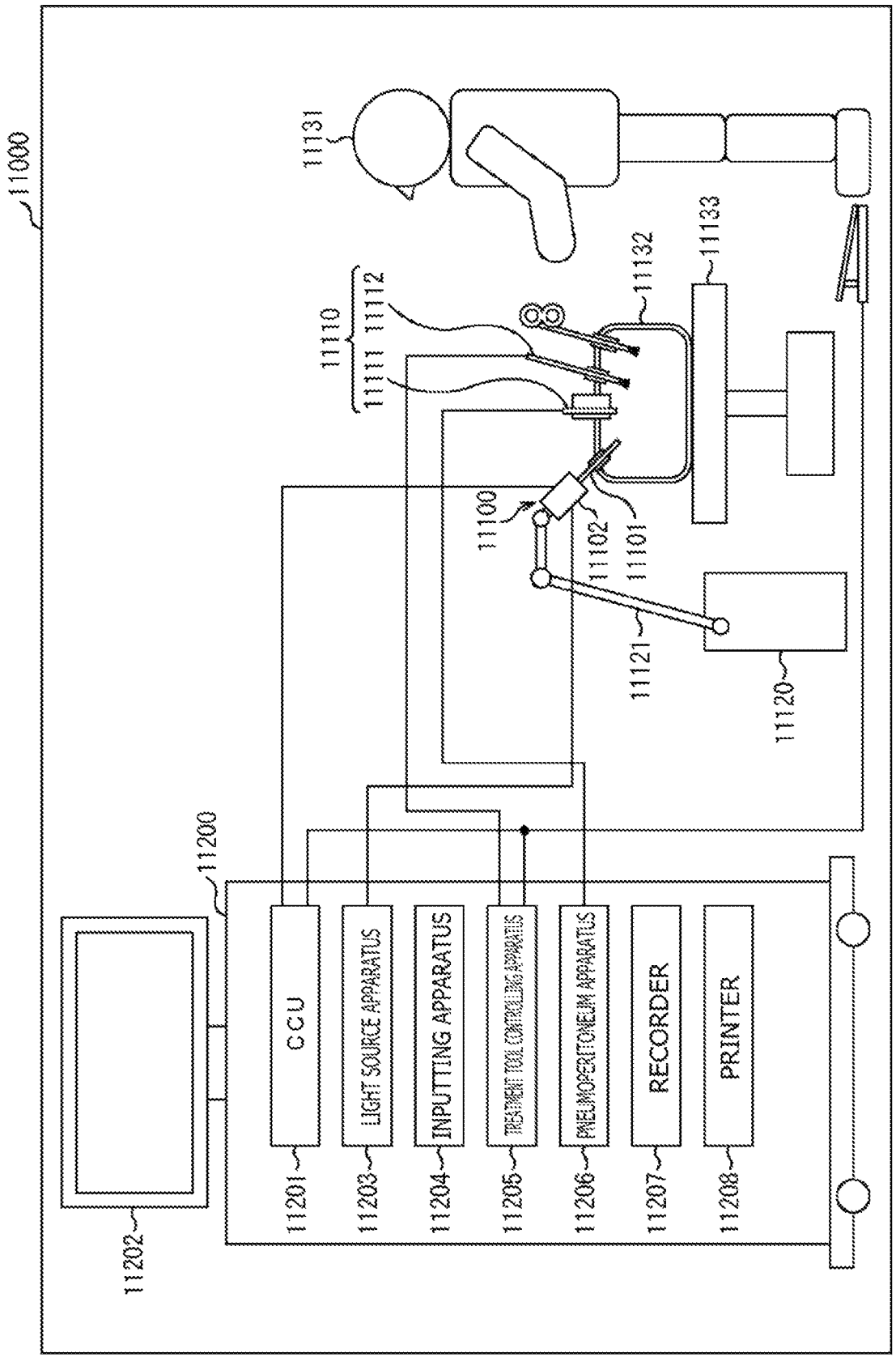
FIG. 45 is a view depicting an example of a schematic configuration of an endoscopic surgery system.

FIG. 45 is a view depicting an example of a schematic configuration of an endoscopic surgery system to which the technology according to an embodiment of the present disclosure (present technology) can be applied.

In FIG. 45, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 46:
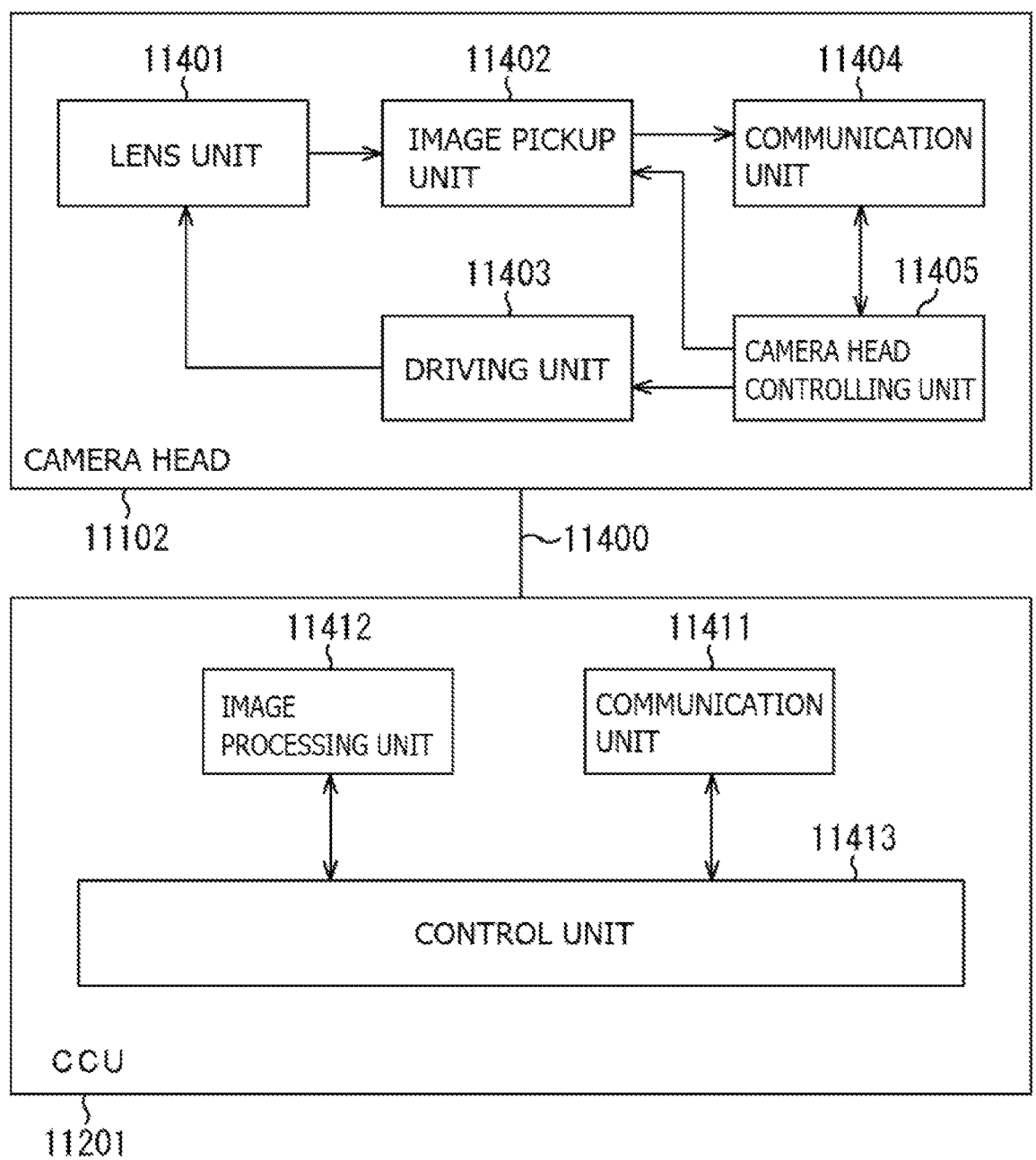
FIG. 46 is a block diagram depicting an example of a functional configuration of a camera head and a camera control unit (CCU).

FIG. 46 is a block diagram depicting an example of a functional configuration of the camera head 11102 and the CCU 11201 depicted in FIG. 45.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes image pickup elements. The number of the image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

While the endoscopic surgery system has been described by way of example, the technology according to the present disclosure may be applied to a microscopic surgery system or the like, for example.

Note that the present disclosure may also have the following configurations.

[A01]<<Solid-State Imaging Device>>

A solid-state imaging device including:
 an imaging element array that includes M (M≥2) imaging elements arranged in a first direction and N (N≥2) imaging elements arranged in a second direction different from the first direction, that is, M×N imaging elements in total, each of the imaging elements including a photoelectric conversion unit that includes
 a photoelectric conversion layer,
 an insulation layer formed in contact with a first surface of the photoelectric conversion layer,
 a charge discharge electrode formed in contact with the first surface of the photoelectric conversion layer,
 an upper electrode formed in contact with a second surface of the photoelectric conversion layer on a side opposite to the first surface and receiving incident light, and
 a charge accumulation electrode facing the first surface of the photoelectric conversion layer via the insulation layer and disposed away from the charge discharge electrode,
 the photoelectric conversion layer being provided as a common layer at least for the N imaging elements arranged in the second direction and constituting the imaging element array, the photoelectric conversion unit of each of the imaging elements further including
  a first charge transfer control electrode and a second charge transfer control electrode so disposed as to face the first surface of the photoelectric conversion layer via the insulation layer, and disposed away from the charge discharge electrode and the charge accumulation electrode, and
  a light shielding layer,
the photoelectric conversion layer including a photoelectric conversion layer-first region so located as to face the charge accumulation electrode, a photoelectric conversion layer-second region so located as to face the first charge transfer control electrode, and a photoelectric conversion layer-third region so located as to face the second charge transfer control electrode,
the light shielding layer covering at least the photoelectric conversion layer-second region and the photoelectric conversion layer-third region.

[A02]
The solid-state imaging device according to [A01], in which charges accumulated in the photoelectric conversion layer-first region in each of the imaging elements are transferred (transported) to the photoelectric conversion layer-second region.

[A03]
The solid-state imaging device according to [A01] or [A02], in which the first charge transfer control electrode and the second charge transfer control electrode are disposed along an imaging element boundary region extending in the second direction.

[A04]
The solid-state imaging device according to [A03], in which the first charge transfer control electrode and the second charge transfer control electrode in each of the N imaging elements arranged in the second direction are alternately disposed in a belt shape.

[A05]
The solid-state imaging device according to [A04], in which charges accumulated in the photoelectric conversion layer-second region included in an nth (n: any positive integer ranging from 1 to (N−1)) imaging element of the N imaging elements arranged in the second direction are transferred (transported) to the photoelectric conversion layer-second region included in an (n+1)th imaging element according to an operation of the second charge transfer control electrode located between an nth imaging element and the (n+1)th imaging element, after charges accumulated in the photoelectric conversion layer-first region of the nth imaging element are transferred to the photoelectric conversion layer-second region of the nth imaging element.

[A06]
The solid-state imaging device according to any one of [A03] to [A05], in which
  the second charge transfer control electrode includes at least a second-A charge transfer control electrode and a second-B charge transfer control electrode, and
  the second charge transfer control electrode constituting an nth (n: any positive integer ranging from 1 to (N−1)) imaging element included in the N imaging elements arranged in the second direction is disposed between the first charge transfer control electrode constituting the nth imaging element and the first charge transfer control electrode constituting an (n+1)th imaging element.

[A07]
The solid-state imaging device according to any one of [A03] to [A05], in which:
  the second charge transfer control electrode includes at least a second-A charge transfer control electrode and a second-B charge transfer control electrode; and
  the second charge transfer control electrode constituting an (n+1)th (n: any positive integer ranging from 1 to (N−1)) imaging element included in the N imaging elements arranged in the second direction is disposed between the first charge transfer control electrode constituting an nth imaging element and the first charge transfer control electrode constituting the (n+1)th imaging element.

[A08]
The solid-state imaging device according to any one of [A01] to [A07], in which the photoelectric conversion unit further includes a reset electrode so disposed as to face the first surface of the photoelectric conversion layer via the insulation layer and intervene between the charge discharge electrode and the charge accumulation electrode and in a position away from the charge discharge electrode and the charge accumulation electrode.

[A09]
The solid-state imaging device according to [A08], in which charges remaining in the photoelectric conversion layer-first region are discharged to the outside of the system by an operation of the charge discharge electrode according to an operation of the reset electrode after charge transfer (transportation) to the photoelectric conversion layer-second region.

[A10]
The solid-state imaging device according to any one of [A01] to [A09], in which charges remaining in the photoelectric conversion layer-first region constituting each of the two imaging elements arranged side by side in the first direction are discharged to the outside of the system by an operation of a common charge discharge electrode.

[A11]
The solid-state imaging device according to any one of [A01] to [A10], in which
  the photoelectric conversion unit further includes a charge transportation control electrode so disposed as to face the first surface of the photoelectric conversion layer via the insulation layer and intervene between the charge accumulation electrode and the first charge transfer control electrode, and in a position away from the charge accumulation electrode and the first charge transfer control electrode, and
  the light shielding layer further covers a photoelectric conversion layer-fourth region so located as to face the charge transportation control electrode.

[A12]
The solid-state imaging device according to [A11], in which charges accumulated in the photoelectric conversion layer-first region in each of the imaging elements are transferred (transported) to the photoelectric conversion layer-second region according to an operation of the charge transportation control electrode.

[A13]
The solid-state imaging device according to any one of [A01] to [A12], in which an element separation electrode is provided between an mth (m: any positive integer ranging from 1 to (M−1)) imaging element and an (m+1)th imaging element.

[A14]

The solid-state imaging device according to any one of [A01] to [A13], in which a second element separation electrode is provided between the charge accumulation electrode and the second charge transfer control electrode in each of the imaging elements.

[A15]

The solid-state imaging device according to any one of [A01] to [A14], in which the photoelectric conversion layer-third region of the imaging element located at an end in the N imaging elements arranged in the second direction is electrically connected to a floating diffusion layer via a connection portion in contact with the photoelectric conversion layer-third region.

[A16]

The solid-state imaging device according to [A15], in which the floating diffusion layer is electrically connected to an analog/digital conversion circuit.

[A17]

The solid-state imaging device according to [A15], in which the floating diffusion layer is electrically connected to a register circuit.

[A18]

The solid-state imaging device according to any one of [A01] to [A17], in which the solid-state imaging device includes a time delay integration line sensor.

[B01] <<Imaging Method>>

An imaging method that uses a solid-state imaging device including an imaging element array that includes M (M≥2) imaging elements arranged in a first direction and N (N≥2) imaging elements arranged in a second direction different from the first direction, that is, M×N imaging elements in total, each of the imaging elements including a photoelectric conversion unit that includes a photoelectric conversion layer,
　an insulation layer formed in contact with a first surface of the photoelectric conversion layer,
　a charge discharge electrode formed in contact with the first surface of the photoelectric conversion layer,
　an upper electrode formed in contact with a second surface of the photoelectric conversion layer on a side opposite to the first surface, and receiving incident light, and
　a charge accumulation electrode facing the first surface of the photoelectric conversion layer via the insulation layer and disposed away from the charge discharge electrode,
　the photoelectric conversion layer being provided as a common layer at least for the N imaging elements arranged in the second direction and constituting the imaging element array,
　the photoelectric conversion unit of each of the imaging elements further including
　　a first charge transfer control electrode and a second charge transfer control electrode so disposed as to face the first surface of the photoelectric conversion layer via the insulation layer, and disposed away from the charge discharge electrode and the charge accumulation electrode, and
　　a light shielding layer,
　the photoelectric conversion layer including a photoelectric conversion layer-first region so located as to face the charge accumulation electrode, a photoelectric conversion layer-second region so located as to face the first charge transfer control electrode, and a photoelectric conversion layer-third region so located as to face the second charge transfer control electrode,
　the light shielding layer covering at least the photoelectric conversion layer-second region and the photoelectric conversion layer-third region,
　the imaging method including the steps of:
　after each of the imaging elements discharges charges remaining in the photoelectric conversion layer-first region by an operation of the charge discharge electrode,
　applying light to the photoelectric conversion layer of each of the imaging elements with a voltage kept being applied to the upper electrode and the charge accumulation electrode to accumulate charges in the photoelectric conversion layer-first region of each of the imaging elements;
　subsequently, transferring (transporting) the charges accumulated in the photoelectric conversion layer-first region in each of the imaging elements to the photoelectric conversion layer-second region, and accumulating the transferred charges in addition to charges already accumulated in the photoelectric conversion layer-second region; and
　then, transferring (transporting) the charges accumulated in the photoelectric conversion layer-second region of an nth (n: any positive integer ranging from 1 to (N−1)) imaging element included in the N imaging elements arranged in the second direction to the photoelectric conversion layer-second region of an (n+1)th imaging element according to an operation of the second charge transfer control electrode.

REFERENCE SIGNS LIST

10: Imaging element
$10_n$: nth imaging element
$10_{(n-1)}$: (n−1)th imaging element
$10_{(n+1)}$: (n+1)th imaging element
$10_{(N-2)}$: (N−2)th imaging element
$10_{(N-1)}$: (N−1)th imaging element
$10_N$: Nth imaging element
11: Imaging element boundary region
12: Light shielding layer
13: On-chip micro-lens (OCL)
21: Photoelectric conversion layer
21a: First surface of photoelectric conversion layer
21b: Second surface of photoelectric conversion layer
21A: Photoelectric conversion layer-first region
21B, $21B_{End}$: Photoelectric conversion layer-second region
21C, $21C_1$, $21C_2$: Photoelectric conversion layer-third region
21D: Photoelectric conversion layer-fourth region
21E: photoelectric conversion layer-fifth region
21F: Photoelectric conversion layer-sixth region
21G: Photoelectric conversion layer-seventh region
21H Photoelectric conversion layer-eighth region
22: Charge discharge electrode
23: Upper electrode
24: Charge accumulation electrode
25, $25_{End}$: First charge transfer control electrode
26, $26_1$, $26_2$, $26_{2-End}$: Second charge transfer control electrode
27: Reset electrode
28: Charge transportation control electrode
29A: Element separation electrode
29B: Second element separation electrode
24A, 24A, 25A, $25A_{End}$, $26A_1$, $26A_2$, $26D_2$, 27A, 28A: Connection hole 22B, 24B, 25B, 25B$_{End}$, 26B$_1$, 26B$_2$, 26E$_2$, 27B, 28B: Pad portion
25C, 26C$_2$: Connection portion
30, 31: Interlayer insulation layer
32: Insulation layer
33: Protection material layer
40: Semiconductor substrate
40A: First surface (front surface) of semiconductor substrate
40B: Second surface (rear surface) of semiconductor substrate
41: Element separation region
42: Oxide film
43: Interlayer insulation layer
44: Contact hole portion
45: Wiring layer
46, 47: Interlayer insulation layer
51: Gate portion of reset transistor TR$_{rst}$
51A: Channel forming region of reset transistor TR$_{rst}$
51B, 51C: Source/drain region of reset transistor TR$_{rst}$
52: Gate portion of amplification transistor TR$_{amp}$
52A: Channel forming region of amplification transistor TR$_{amp}$
52B, 52C: Source/drain region of amplification transistor TR$_{amp}$
53: Gate portion of selection transistor TR$_{sel}$
53A: Channel forming region of selection transistor TR$_{sel}$
53B, 53C: Source/drain region of selection transistor TR$_{sel}$
100: Solid-state imaging device
101: Imaging element
111: Imaging region
112: Vertical driving circuit
113: Column signal processing circuit
114: Horizontal driving circuit
115: Output circuit
116: Driving control circuit
118: Horizontal signal line
200: Electronic device (camera)
201: Solid-state imaging device
210: Optical lens
211: Shutter device
212: Driving circuit
213: Signal processing circuit
FD: Floating diffusion layer
TR$_{trs}$: Transportation transistor
TR$_{rst}$: Reset transistor
TR$_{amp}$: Amplification transistor
TR$_{sel}$: Selection transistor
V$_{DD}$: Power source
RST: Reset line
SEL: Selection line
117, VSL: Signal line (data output line)
V$_{OU}$: Wire

The invention claimed is:
1. A solid-state imaging device, comprising:
an imaging element array that includes M (M≥2) imaging elements in a first direction and N (N≥2) imaging elements in a second direction different from the first direction, that is, M×N imaging elements in total, each of the imaging elements including a photoelectric conversion unit that includes:
a photoelectric conversion layer,
an insulation layer in contact with a first surface of the photoelectric conversion layer,
a charge discharge electrode in contact with the first surface of the photoelectric conversion layer,
an upper electrode in contact with a second surface of the photoelectric conversion layer on a side opposite to the first surface, wherein the photoelectric conversion layer is configured to receive incident light, and
a charge accumulation electrode facing the first surface of the photoelectric conversion layer via the insulation layer, wherein
the charge accumulation electrode is away from the charge discharge electrode,
the photoelectric conversion layer is a common layer for at least one of the N imaging elements arranged in the second direction and constituting the imaging element array, and
the photoelectric conversion unit of each of the imaging elements further includes:
a first charge transfer control electrode and a second charge transfer control electrode face the first surface of the photoelectric conversion layer via the insulation layer, wherein each of the first charge transfer control electrode and the second charge transfer control electrode is away from the charge discharge electrode and the charge accumulation electrode, and
a light shielding layer, wherein
the photoelectric conversion layer that includes:
a photoelectric conversion layer-first region that faces the charge accumulation electrode,
a photoelectric conversion layer-second region that faces the first charge transfer control electrode, and
a photoelectric conversion layer-third region that faces the second charge transfer control electrode, and
the light shielding layer that covers at least one of the photoelectric conversion layer-second region or the photoelectric conversion layer-third region.

2. The solid-state imaging device according to claim 1, wherein charges accumulated in the photoelectric conversion layer-first region in each of the imaging elements are transferred to the photoelectric conversion layer-second region.

3. The solid-state imaging device according to claim 1, wherein the first charge transfer control electrode and the second charge transfer control electrode are along an imaging element boundary region extending in the second direction.

4. The solid-state imaging device according to claim 3, wherein the first charge transfer control electrode and the second charge transfer control electrode in each of the N imaging elements are in the second direction alternately in a belt shape.

5. The solid-state imaging device according to claim 4, wherein charges accumulated in the photoelectric conversion layer-second region included in an nth (n: any positive integer ranging from 1 to (N−1)) imaging element of the N imaging elements arranged in the second direction are transferred to the photoelectric conversion layer-second region included in an (n+1)th imaging element based on an operation of the second charge transfer control electrode between an nth imaging element and an (n+1)th imaging element after charges accumulated in the photoelectric conversion layer-first region of the nth imaging element are transferred to the photoelectric conversion layer-second region of the nth imaging element.

6. The solid-state imaging device according to claim 3, wherein
the second charge transfer control electrode includes at least one of a second-A charge transfer control electrode or a second-B charge transfer control electrode, and
the second charge transfer control electrode constituting an nth (n: any positive integer ranging from 1 to (N−1)) imaging element included in the N imaging elements arranged in the second direction is between the first charge transfer control electrode constituting the nth imaging element and the first charge transfer control electrode constituting an (n+1)th imaging element.

7. The solid-state imaging device according to claim 3, wherein
the second charge transfer control electrode includes at least one of a second-A charge transfer control electrode or a second-B charge transfer control electrode, and
the second charge transfer control electrode constituting an (n+1)th (n: any positive integer ranging from 1 to (N−1)) imaging element included in the N imaging elements arranged in the second direction is between the first charge transfer control electrode constituting an nth imaging element and the first charge transfer control electrode constituting the (n+1)th imaging element.

8. The solid-state imaging device according to claim 1, wherein the photoelectric conversion unit further includes a reset electrode that faces the first surface of the photoelectric conversion layer via the insulation layer and intervene between the charge discharge electrode and the charge accumulation electrode and in a position away from the charge discharge electrode and the charge accumulation electrode.

9. The solid-state imaging device according to claim 8, wherein charges remaining in the photoelectric conversion layer-first region are discharged to an outside of a system by an operation of the charge discharge electrode based on an operation of the reset electrode after charge transfer to the photoelectric conversion layer-second region.

10. The solid-state imaging device according to claim 1, wherein charges remaining in the photoelectric conversion layer-first region constituting each of the two imaging elements arranged side by side in the first direction are discharged to an outside of a system by an operation of a common charge discharge electrode.

11. The solid-state imaging device according to claim 1, wherein
the photoelectric conversion unit further includes a charge transportation control electrode that faces the first surface of the photoelectric conversion layer via the insulation layer and intervene between the charge accumulation electrode and the first charge transfer control electrode and in a position away from the charge accumulation electrode and the first charge transfer control electrode; and
the light shielding layer further covers a photoelectric conversion layer-fourth region that faces the charge transportation control electrode.

12. The solid-state imaging device according to claim 11, wherein charges accumulated in the photoelectric conversion layer-first region in each of the imaging elements are transferred to the photoelectric conversion layer-second region based on an operation of the charge transportation control electrode.

13. The solid-state imaging device according to claim 1, wherein an element separation electrode is between an mth (m: any positive integer ranging from 1 to (M−1)) imaging element and an (m+1)th imaging element.

14. The solid-state imaging device according to claim 1, wherein a second element separation electrode is between the charge accumulation electrode and the second charge transfer control electrode in each of the imaging elements.

15. The solid-state imaging device according to claim 1, wherein the photoelectric conversion layer-third region of the imaging element is at an end in the N imaging elements arranged in the second direction is electrically connected to a floating diffusion layer via a connection portion in contact with the photoelectric conversion layer-third region.

16. The solid-state imaging device according to claim 15, wherein the floating diffusion layer is electrically connected to an analog/digital conversion circuit.

17. The solid-state imaging device according to claim 15, wherein the floating diffusion layer is electrically connected to a register circuit.

18. The solid-state imaging device according to claim 1, wherein the solid-state imaging device includes a time delay integration line sensor.

19. An imaging method that uses a solid-state imaging device including an imaging element array that includes M (M≥2) imaging elements arranged in a first direction and N (N≥2) imaging elements arranged in a second direction different from the first direction, that is, M×N imaging elements in total, each of the imaging elements including a photoelectric conversion unit that includes:
a photoelectric conversion layer,
an insulation layer in contact with a first surface of the photoelectric conversion layer,
a charge discharge electrode in contact with the first surface of the photoelectric conversion layer,
an upper electrode in contact with a second surface of the photoelectric conversion layer on a side opposite to the first surface and receiving incident light, and
a charge accumulation electrode facing the first surface of the photoelectric conversion layer via the insulation layer, wherein
the charge accumulation electrode is away from the charge discharge electrode,
the photoelectric conversion layer is a common layer for at least one of the N imaging elements in the second direction and constituting the imaging element array,
the photoelectric conversion unit of each of the imaging elements further including:
a first charge transfer control electrode and a second charge transfer control electrode face the first surface of the photoelectric conversion layer via the insulation layer, wherein each of the first charge transfer control electrode and the second charge transfer control electrode is away from the charge discharge electrode and the charge accumulation electrode, and
a light shielding layer, wherein
the photoelectric conversion layer includes:
a photoelectric conversion layer-first region that faces the charge accumulation electrode,
a photoelectric conversion layer-second region that faces the first charge transfer control electrode, and
a photoelectric conversion layer-third region that faces the second charge transfer control electrode, and the light shielding layer covers at least one of the photoelectric conversion layer-second region or the photoelectric conversion layer-third region, the imaging method, comprising:

after each of the imaging elements discharges charges remaining in the photoelectric conversion layer-first region by an operation of the charge discharge electrode, applying light to the photoelectric conversion layer of each of the imaging elements with a voltage kept being applied to the upper electrode and the charge accumulation electrode to accumulate charges in the photoelectric conversion layer-first region of each of the imaging elements;

transferring the charges accumulated in the photoelectric conversion layer-first region in each of the imaging elements to the photoelectric conversion layer-second region;

accumulating the transferred charges in addition to charges already accumulated in the photoelectric conversion layer-second region; and transferring the charges accumulated in the photoelectric conversion layer-second region of an nth (n: any positive integer ranging from 1 to (N−1)) imaging element included in the N imaging elements arranged in the second direction to the photoelectric conversion layer-second region of an (n+1)th imaging element based on an operation of the second charge transfer control electrode.

* * * * *